(12) United States Patent
Millward et al.

(10) Patent No.: US 8,999,492 B2
(45) Date of Patent: Apr. 7, 2015

(54) METHOD TO PRODUCE NANOMETER-SIZED FEATURES WITH DIRECTED ASSEMBLY OF BLOCK COPOLYMERS

(75) Inventors: Dan B. Millward, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1041 days.

(21) Appl. No.: 12/026,214

(22) Filed: Feb. 5, 2008

(65) Prior Publication Data
US 2010/0316849 A1 Dec. 16, 2010

(51) Int. Cl.
| | |
|---|---|
| *G03G 7/00* | (2006.01) |
| *B05D 5/02* | (2006.01) |
| *C08F 2/46* | (2006.01) |
| *C03C 25/68* | (2006.01) |
| *G03F 7/00* | (2006.01) |
| *B81C 99/00* | (2010.01) |
| *B82Y 10/00* | (2011.01) |
| *B05D 1/28* | (2006.01) |
| *B82Y 30/00* | (2011.01) |
| *B82Y 40/00* | (2011.01) |

(52) U.S. Cl.
CPC ............ *G03F 7/0002* (2013.01); *B81C 99/009* (2013.01); *B82Y 10/00* (2013.01); *G03F 7/0017* (2013.01); *B05D 1/283* (2013.01); *B81C 2201/0149* (2013.01); *B82Y 30/00* (2013.01); *B82Y 40/00* (2013.01); *Y02C 20/30* (2013.01)

(58) Field of Classification Search
USPC ....................................... 428/195.1
See application file for complete search history.

(56) References Cited

U.S. PATENT DOCUMENTS

| | | |
|---|---|---|
| 4,623,674 A | 11/1986 | Bailey, Jr. |
| 4,797,357 A | 1/1989 | Mura et al. |
| 4,818,713 A | 4/1989 | Feygenson |
| 4,877,647 A | 10/1989 | Klabunde |
| 5,328,810 A | 7/1994 | Lowrey et al. |
| 5,374,367 A | 12/1994 | Edamura et al. |
| 5,382,373 A | 1/1995 | Carlson |
| 5,482,656 A | 1/1996 | Hiraoka et al. |
| 5,512,131 A | 4/1996 | Kumar et al. |
| 5,538,655 A | 7/1996 | Fauteux et al. |
| 5,580,700 A | 12/1996 | Rahman et al. |
| 5,620,850 A | 4/1997 | Bamdad et al. |
| 5,622,668 A | 4/1997 | Thomas |
| 5,772,905 A | 6/1998 | Chou |

(Continued)

FOREIGN PATENT DOCUMENTS

| | | |
|---|---|---|
| CN | 1562730 | 1/2005 |
| CN | 1799131 A | 7/2006 |

(Continued)

OTHER PUBLICATIONS

Zehner et al., "Selective Decoration of a Phase-Separated Diblock Copolymer with Thiol-Passivated Nanocrystals," Langmuir, 1998, vol. 14, No. 2, p. 242.*

(Continued)

*Primary Examiner* — Mark Ruthkosky
*Assistant Examiner* — Ian Rummel
(74) *Attorney, Agent, or Firm* — TraskBritt

(57) ABSTRACT

Methods for fabricating stamps and systems for patterning a substrate, and devices resulting from those methods are provided.

16 Claims, 44 Drawing Sheets

(56) References Cited

U.S. PATENT DOCUMENTS

| | | |
|---|---|---|
| 5,834,583 A | 11/1998 | Hancock et al. |
| 5,849,810 A | 12/1998 | Muller |
| 5,879,582 A | 3/1999 | Havelka et al. |
| 5,879,853 A | 3/1999 | Azuma |
| 5,891,356 A | 4/1999 | Inoue et al. |
| 5,904,824 A | 5/1999 | Oh |
| 5,925,259 A | 7/1999 | Biebuyck et al. |
| 5,948,470 A | 9/1999 | Harrison et al. |
| 5,958,704 A | 9/1999 | Starzl et al. |
| 6,051,869 A | 4/2000 | Pan et al. |
| 6,111,323 A | 8/2000 | Carter et al. |
| 6,143,647 A | 11/2000 | Pan et al. |
| 6,153,495 A | 11/2000 | Kub et al. |
| 6,207,787 B1 | 3/2001 | Fahey et al. |
| 6,251,791 B1 | 6/2001 | Tsai et al. |
| 6,270,946 B1 | 8/2001 | Miller |
| 6,309,580 B1 | 10/2001 | Chou |
| 6,310,138 B1 | 10/2001 | Yonezawa et al. |
| 6,312,971 B1 | 11/2001 | Amundson et al. |
| 6,368,871 B1 | 4/2002 | Christel et al. |
| 6,403,382 B1 | 6/2002 | Zhu et al. |
| 6,414,164 B1 | 7/2002 | Afzali-Ardakani et al. |
| 6,423,465 B1 | 7/2002 | Hawker et al. |
| 6,423,474 B1 | 7/2002 | Holscher |
| 6,503,841 B1 | 1/2003 | Criscuolo |
| 6,506,660 B2 | 1/2003 | Holmes et al. |
| 6,517,933 B1 | 2/2003 | Soane et al. |
| 6,518,194 B2 | 2/2003 | Winningham et al. |
| 6,537,920 B1 | 3/2003 | Krivokapic |
| 6,548,830 B1 | 4/2003 | Noguchi et al. |
| 6,565,763 B1 | 5/2003 | Asakawa |
| 6,565,764 B2 | 5/2003 | Hiraoka et al. |
| 6,566,248 B1 | 5/2003 | Wang et al. |
| 6,569,528 B2 | 5/2003 | Nam et al. |
| 6,573,030 B1 | 6/2003 | Fairbairn et al. |
| 6,592,764 B1 | 7/2003 | Stucky et al. |
| 6,630,520 B1 | 10/2003 | Bruza et al. |
| 6,635,912 B2 | 10/2003 | Ohkubo |
| 6,656,308 B2 | 12/2003 | Hougham et al. |
| 6,679,996 B1 | 1/2004 | Yao |
| 6,682,660 B2 | 1/2004 | Sucholeiki et al. |
| 6,689,473 B2 | 2/2004 | Guire et al. |
| 6,699,797 B1 | 3/2004 | Morris et al. |
| 6,713,238 B1 | 3/2004 | Chou et al. |
| 6,746,825 B2 | 6/2004 | Nealey et al. |
| 6,767,693 B1 | 7/2004 | Okoroanyanwu |
| 6,780,492 B2 | 8/2004 | Hawker et al. |
| 6,781,166 B2 | 8/2004 | Lieber et al. |
| 6,797,202 B2 | 9/2004 | Endo et al. |
| 6,809,210 B2 | 10/2004 | Chandross et al. |
| 6,812,132 B2 | 11/2004 | Ramachandrarao et al. |
| 6,825,358 B2 | 11/2004 | Afzali-Ardakani et al. |
| 6,884,842 B2 | 4/2005 | Soane et al. |
| 6,887,332 B1 | 5/2005 | Kagan et al. |
| 6,890,624 B1 | 5/2005 | Kambe et al. |
| 6,890,703 B2 | 5/2005 | Hawker et al. |
| 6,908,861 B2 | 6/2005 | Sreenivasan et al. |
| 6,911,400 B2 | 6/2005 | Colburn et al. |
| 6,913,697 B2 | 7/2005 | Lopez et al. |
| 6,924,341 B2 | 8/2005 | Mays |
| 6,926,953 B2 | 8/2005 | Nealey et al. |
| 6,940,485 B2 | 9/2005 | Noolandi |
| 6,946,332 B2 | 9/2005 | Loo et al. |
| 6,949,456 B2 | 9/2005 | Kumar |
| 6,952,436 B2 | 10/2005 | Wirnsberger et al. |
| 6,957,608 B1 | 10/2005 | Hubert et al. |
| 6,962,823 B2 | 11/2005 | Empedocles et al. |
| 6,989,426 B2 | 1/2006 | Hu et al. |
| 6,992,115 B2 | 1/2006 | Hawker et al. |
| 6,995,439 B1 | 2/2006 | Hill et al. |
| 6,998,152 B2 | 2/2006 | Uhlenbrock |
| 7,001,795 B2 | 2/2006 | Jiang et al. |
| 7,009,227 B2 | 3/2006 | Patrick et al. |
| 7,030,495 B2 | 4/2006 | Colburn et al. |
| 7,037,738 B2 | 5/2006 | Sugiyama et al. |
| 7,037,744 B2 | 5/2006 | Colburn et al. |
| 7,045,851 B2 | 5/2006 | Black et al. |
| 7,056,455 B2 | 6/2006 | Matyjasewski et al. |
| 7,056,849 B2 | 6/2006 | Wan et al. |
| 7,060,774 B2 | 6/2006 | Sparrowe et al. |
| 7,066,801 B2 | 6/2006 | Balijepalli et al. |
| 7,077,992 B2 | 7/2006 | Sreenivasan et al. |
| 7,087,267 B2 | 8/2006 | Breen et al. |
| 7,090,784 B2 | 8/2006 | Asakawa et al. |
| 7,112,617 B2 | 9/2006 | Kim |
| 7,115,305 B2 | 10/2006 | Bronikowski et al. |
| 7,115,525 B2 | 10/2006 | Abatchev et al. |
| 7,115,995 B2 | 10/2006 | Wong |
| 7,118,784 B1 | 10/2006 | Xie |
| 7,119,321 B2 | 10/2006 | Quinlan |
| 7,132,370 B2 | 11/2006 | Paraschiv |
| 7,135,144 B2 | 11/2006 | Christel et al. |
| 7,135,241 B2 | 11/2006 | Ferraris et al. |
| 7,135,388 B2 | 11/2006 | Ryu et al. |
| 7,135,523 B2 | 11/2006 | Ho et al. |
| 7,151,209 B2 | 12/2006 | Empedocles et al. |
| 7,163,712 B2 | 1/2007 | Chilkoti et al. |
| 7,166,304 B2 | 1/2007 | Harris et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,195,733 B2 | 3/2007 | Rogers et al. |
| 7,202,308 B2 | 4/2007 | Boussand et al. |
| 7,208,836 B2 | 4/2007 | Manning |
| 7,252,791 B2 | 8/2007 | Wasserscheid et al. |
| 7,259,101 B2 | 8/2007 | Zurcher et al. |
| 7,279,396 B2 | 10/2007 | Derderian et al. |
| 7,282,240 B1 | 10/2007 | Jackman et al. |
| 7,291,284 B2 | 11/2007 | Mirkin et al. |
| 7,311,943 B2 | 12/2007 | Jacobson et al. |
| 7,326,514 B2 | 2/2008 | Dai et al. |
| 7,332,370 B2 | 2/2008 | Chang et al. |
| 7,332,627 B2 | 2/2008 | Chandross et al. |
| 7,338,275 B2 | 3/2008 | Choi et al. |
| 7,347,953 B2 | 3/2008 | Black et al. |
| 7,368,314 B2 | 5/2008 | Ufert |
| 7,407,887 B2 | 8/2008 | Guo |
| 7,408,186 B2 | 8/2008 | Merkulov et al. |
| 7,419,772 B2 | 9/2008 | Watkins et al. |
| 7,470,954 B2 | 12/2008 | Lee et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,569,855 B2 | 8/2009 | Lai |
| 7,585,741 B2 | 9/2009 | Manning |
| 7,592,247 B2 | 9/2009 | Yang et al. |
| 7,605,081 B2 | 10/2009 | Yang et al. |
| 7,632,544 B2 | 12/2009 | Ho et al. |
| 7,655,383 B2 | 2/2010 | Mela et al. |
| 7,658,773 B2 | 2/2010 | Pinnow |
| 7,700,157 B2 | 4/2010 | Bronikowski et al. |
| 7,767,099 B2 | 8/2010 | Li et al. |
| 7,888,228 B2 | 2/2011 | Blanchard |
| 7,959,975 B2 | 6/2011 | Millward |
| 7,964,107 B2 | 6/2011 | Millward |
| 8,039,196 B2 | 10/2011 | Kim et al. |
| 8,080,615 B2 | 12/2011 | Millward |
| 8,083,953 B2 | 12/2011 | Millward et al. |
| 8,083,958 B2 | 12/2011 | Li et al. |
| 8,097,175 B2 | 1/2012 | Millward et al. |
| 8,101,261 B2 | 1/2012 | Millward et al. |
| 8,114,300 B2 | 2/2012 | Millward |
| 8,114,301 B2 | 2/2012 | Millward et al. |
| 8,114,306 B2 | 2/2012 | Cheng et al. |
| 8,294,139 B2 | 10/2012 | Marsh et al. |
| 8,372,295 B2 | 2/2013 | Millward |
| 8,426,313 B2 | 4/2013 | Millward et al. |
| 2001/0024768 A1 | 9/2001 | Matsuo et al. |
| 2001/0049195 A1 | 12/2001 | Chooi et al. |
| 2002/0055239 A1 | 5/2002 | Tuominen et al. |
| 2002/0084429 A1 | 7/2002 | Craighead et al. |
| 2002/0158342 A1 | 10/2002 | Tuominen et al. |

(56) References Cited

U.S. PATENT DOCUMENTS

| | | |
|---|---|---|
| 2002/0167117 A1 | 11/2002 | Chou |
| 2003/0010241 A1 | 1/2003 | Fujihira et al. |
| 2003/0034329 A1 | 2/2003 | Chou |
| 2003/0068639 A1 | 4/2003 | Haneder et al. |
| 2003/0077452 A1 | 4/2003 | Guire et al. |
| 2003/0080471 A1 | 5/2003 | Chou |
| 2003/0080472 A1 | 5/2003 | Chou |
| 2003/0091752 A1 | 5/2003 | Nealey et al. |
| 2003/0100822 A1 | 5/2003 | Lew et al. |
| 2003/0108879 A1 | 6/2003 | Klaerner et al. |
| 2003/0143375 A1 | 7/2003 | Noguchi et al. |
| 2003/0157248 A1 | 8/2003 | Watkins et al. |
| 2003/0178707 A1 | 9/2003 | Abbott |
| 2003/0180522 A1 | 9/2003 | DeSimone et al. |
| 2003/0180966 A1 | 9/2003 | Abbott et al. |
| 2003/0185741 A1 | 10/2003 | Matyjaszewski |
| 2003/0196748 A1 | 10/2003 | Hougham et al. |
| 2003/0222048 A1 | 12/2003 | Asakawa et al. |
| 2003/0235930 A1 | 12/2003 | Bao et al. |
| 2004/0023287 A1 | 2/2004 | Harnack et al. |
| 2004/0028875 A1 | 2/2004 | Van Rijn et al. |
| 2004/0058059 A1 | 3/2004 | Linford et al. |
| 2004/0076757 A1 | 4/2004 | Jacobson et al. |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0159633 A1 | 8/2004 | Whitesides et al. |
| 2004/0163758 A1 | 8/2004 | Kagan et al. |
| 2004/0175628 A1 | 9/2004 | Nealey et al. |
| 2004/0192013 A1 | 9/2004 | Ryu et al. |
| 2004/0222415 A1 | 11/2004 | Chou |
| 2004/0242688 A1 | 12/2004 | Chandross et al. |
| 2004/0254317 A1 | 12/2004 | Hu |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0008828 A1 | 1/2005 | Libera et al. |
| 2005/0062165 A1 | 3/2005 | Saenger et al. |
| 2005/0074706 A1 | 4/2005 | Bristol |
| 2005/0079486 A1 | 4/2005 | Abbott et al. |
| 2005/0100830 A1 | 5/2005 | Xu et al. |
| 2005/0120902 A1 | 6/2005 | Adams et al. |
| 2005/0124135 A1 | 6/2005 | Ayazi et al. |
| 2005/0133697 A1 | 6/2005 | Potyrailo et al. |
| 2005/0147841 A1 | 7/2005 | Tavkhelidze et al. |
| 2005/0159293 A1 | 7/2005 | Wan et al. |
| 2005/0167651 A1 | 8/2005 | Merkulov et al. |
| 2005/0176256 A1 | 8/2005 | Kudelka |
| 2005/0208752 A1 | 9/2005 | Colburn et al. |
| 2005/0238889 A1 | 10/2005 | Iwamoto |
| 2005/0238967 A1 | 10/2005 | Rogers et al. |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0024590 A1 | 2/2006 | Sandhu |
| 2006/0030495 A1 | 2/2006 | Gregg |
| 2006/0035387 A1 | 2/2006 | Wagner et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0097134 A1 | 5/2006 | Rhodes |
| 2006/0105562 A1 | 5/2006 | Yi |
| 2006/0124467 A1 | 6/2006 | Ho et al. |
| 2006/0128165 A1 | 6/2006 | Theiss et al. |
| 2006/0134556 A1 | 6/2006 | Nealey et al. |
| 2006/0137554 A1 | 6/2006 | Kron et al. |
| 2006/0141222 A1 | 6/2006 | Fischer et al. |
| 2006/0141245 A1 | 6/2006 | Stellacci et al. |
| 2006/0154466 A1 | 7/2006 | Lee et al. |
| 2006/0163646 A1 | 7/2006 | Black |
| 2006/0192283 A1 | 8/2006 | Benson |
| 2006/0205875 A1 | 9/2006 | Cha et al. |
| 2006/0211871 A1 | 9/2006 | Dai |
| 2006/0217285 A1 | 9/2006 | Destarac |
| 2006/0228635 A1 | 10/2006 | Suleski |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0254440 A1 | 11/2006 | Choi et al. |
| 2006/0255505 A1 | 11/2006 | Sandhu et al. |
| 2006/0257633 A1 | 11/2006 | Inoue et al. |
| 2006/0258159 A1 | 11/2006 | Coburn et al. |
| 2006/0278158 A1 | 12/2006 | Tolbert et al. |
| 2006/0281266 A1 | 12/2006 | Wells |
| 2006/0286305 A1 | 12/2006 | Thies et al. |
| 2006/0286490 A1 | 12/2006 | Sandhu et al. |
| 2006/0292777 A1 | 12/2006 | Dunbar |
| 2007/0020749 A1 | 1/2007 | Nealy et al. |
| 2007/0023247 A1 | 2/2007 | Ulicny et al. |
| 2007/0023805 A1 | 2/2007 | Wells |
| 2007/0045562 A1 | 3/2007 | Parekh |
| 2007/0045642 A1 | 3/2007 | Li |
| 2007/0071881 A1 | 3/2007 | Chua et al. |
| 2007/0072403 A1 | 3/2007 | Sakata |
| 2007/0122749 A1 | 5/2007 | Fu et al. |
| 2007/0122932 A1 | 5/2007 | Kodas et al. |
| 2007/0138131 A1 | 6/2007 | Burdinski |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0183035 A1 | 8/2007 | Asakawa et al. |
| 2007/0194403 A1 | 8/2007 | Cannon et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0224823 A1 | 9/2007 | Sandhu |
| 2007/0227383 A1 | 10/2007 | Decre et al. |
| 2007/0249117 A1 | 10/2007 | Kang et al. |
| 2007/0272951 A1 | 11/2007 | Lieber et al. |
| 2007/0281220 A1 | 12/2007 | Sandhu et al. |
| 2007/0289943 A1 | 12/2007 | Lu et al. |
| 2007/0293041 A1* | 12/2007 | Yang et al. .................. 438/637 |
| 2008/0032238 A1 | 2/2008 | Lu et al. |
| 2008/0038923 A1 | 2/2008 | Edelstein et al. |
| 2008/0041818 A1 | 2/2008 | Kihara et al. |
| 2008/0047930 A1 | 2/2008 | Blanchet et al. |
| 2008/0064217 A1 | 3/2008 | Horii |
| 2008/0073743 A1 | 3/2008 | Alizadeh et al. |
| 2008/0078999 A1 | 4/2008 | Lai |
| 2008/0083991 A1 | 4/2008 | Yang et al. |
| 2008/0085601 A1 | 4/2008 | Park et al. |
| 2008/0093743 A1 | 4/2008 | Yang et al. |
| 2008/0102252 A1 | 5/2008 | Black et al. |
| 2008/0103256 A1 | 5/2008 | Kim et al. |
| 2008/0113169 A1 | 5/2008 | Cha et al. |
| 2008/0164558 A1 | 7/2008 | Yang et al. |
| 2008/0174726 A1 | 7/2008 | Kim |
| 2008/0176767 A1 | 7/2008 | Millward |
| 2008/0193658 A1 | 8/2008 | Millward |
| 2008/0217292 A1 | 9/2008 | Millward et al. |
| 2008/0233297 A1 | 9/2008 | de Jong et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward |
| 2009/0062470 A1 | 3/2009 | Millward et al. |
| 2009/0155579 A1 | 6/2009 | Greco et al. |
| 2009/0200646 A1 | 8/2009 | Millward et al. |
| 2009/0206489 A1 | 8/2009 | Li et al. |
| 2009/0212016 A1 | 8/2009 | Cheng et al. |
| 2009/0218567 A1 | 9/2009 | Mathew et al. |

(56) References Cited

U.S. PATENT DOCUMENTS

| | | |
|---|---|---|
| 2009/0236309 A1 | 9/2009 | Millward et al. |
| 2009/0240001 A1 | 9/2009 | Regner |
| 2009/0263628 A1 | 10/2009 | Millward |
| 2009/0267058 A1 | 10/2009 | Namdas et al. |
| 2009/0274887 A1 | 11/2009 | Millward et al. |
| 2009/0317540 A1 | 12/2009 | Sandhu et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward |
| 2010/0204402 A1 | 8/2010 | Millward et al. |
| 2010/0279062 A1 | 11/2010 | Millward |
| 2010/0323096 A1 | 12/2010 | Sills et al. |
| 2011/0232515 A1 | 9/2011 | Millward |
| 2012/0133017 A1 | 5/2012 | Millward et al. |
| 2012/0223053 A1 | 9/2012 | Millward et al. |

FOREIGN PATENT DOCUMENTS

| | | |
|---|---|---|
| CN | 101013662 A | 8/2007 |
| EP | 0784543 | 4/2000 |
| EP | 1416303 A2 | 5/2004 |
| EP | 1906237 A2 | 4/2008 |
| EP | 1593164 B1 | 6/2010 |
| JP | 11080414 | 3/1999 |
| JP | 2003155365 | 5/2003 |
| JP | 2004335962 | 11/2004 |
| JP | 2005008882 | 1/2005 |
| JP | 2005029779 A | 2/2005 |
| JP | 2006036923 | 2/2005 |
| JP | 2006055982 | 3/2006 |
| JP | 2006110434 A | 4/2006 |
| JP | 2007194175 A | 8/2007 |
| JP | 2008-036491 A | 2/2008 |
| KR | 1020060128378 A | 12/2006 |
| KR | 20070029762 | 3/2007 |
| KR | 100771886 B1 | 11/2007 |
| TW | 200633925 | 10/1994 |
| TW | 200740602 | 1/1996 |
| TW | 200400990 A | 1/2004 |
| TW | 584670 B | 4/2004 |
| TW | 200419017 | 10/2004 |
| TW | 200511364 | 3/2005 |
| TW | I253456 | 4/2006 |
| TW | 256110 | 6/2006 |
| TW | 200802421 | 1/2008 |
| WO | 90/07575 | 7/1990 |
| WO | 97/06013 | 2/1997 |
| WO | 9839645 | 9/1998 |
| WO | 99/47570 | 9/1999 |
| WO | 0031183 A1 | 6/2000 |
| WO | 0218080 | 3/2002 |
| WO | 02081372 | 10/2002 |
| WO | 03045840 | 6/2003 |
| WO | 2005/122285 A2 | 12/2005 |
| WO | 2006003592 A2 | 1/2006 |
| WO | 2006003594 A2 | 1/2006 |
| WO | 2006/076016 | 7/2006 |
| WO | 2006/078952 | 7/2006 |
| WO | 2006112887 A2 | 10/2006 |
| WO | 2007/001294 A1 | 1/2007 |
| WO | 2007/019439 A3 | 2/2007 |
| WO | 2007013889 A2 | 2/2007 |
| WO | 2007/024241 | 3/2007 |
| WO | 2007/024323 A2 | 3/2007 |
| WO | 2007/055041 | 5/2007 |
| WO | 2008055137 A2 | 5/2008 |
| WO | 2008/091741 A2 | 7/2008 |
| WO | 2008/097736 A2 | 8/2008 |
| WO | 2008096335 A2 | 8/2008 |
| WO | 2008/124219 A2 | 10/2008 |
| WO | 2008118635 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Wipf, "Handbook of Reagents for Organic Synthesis," 2005, John Wiley & Sons Ltd., p. 320.*

Park et al., "Direct Assembly of Lamellae-Forming Block Copolymers by Using Chemically and Topographically Patterned Substrates," 2007, vol. 19, p. 607-611.*

Berry, B.C., et al., Effects of Zone Annealing on Thin Films of Block Copolymers, National Institute of Standard and Technology, Polymers Division, Gaithersburg, MD., 2007.

Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.

Hammond et al., Temperature Dependence of Order, Disorder, and Defects in Laterally Confined Diblock Copolymer Cylinder Monolayers, Macromoleculars vol. 38, Jul. 2005; p. 6575-6585.

Knoll et al., Phase Behavior in Thin Films of Cylinder-Forming Block Copolymers, Physical Review Letters vol. 89, No. 3 Jul. 2002.

Cheng, Joy Y., et al., Nano Letters, vol. 6, No. 9, 2006, pp. 2009-2103.

Cheng, Joy Y., et al., Adv. Mater. 2003, vol. 15, No. 19, pp. 1599-1602.

Cheng, Joy Y., et al., Applied Physics Letters, 91, 143106-143106-3 (2007).

Niu, Sanjun, et al., Macromolecules, 36(7), 2428-2440, 2003 (web release date: Mar. 13, 2003) http://digitalcommons.uni.edu/cgi/viewcontent.cgi?article+1005&contect=chemeng_nanotechnology).

Parejo, Pilar Garcia, et al., J. Mater. Chem., 2006, 16, pp. 2165-2169.

Park, Cheolmin, et al., Polymer 44, 2003, 6725-6760.

Park, Miri, et al., Science, v. 276, No. 5317, p. 1401-1404, May 30, 1997.

Park, Sang-Min, et al., Adv. Mater., 2007, 19, pp. 607-611.

Park, Sung Chan, et al., Macromolecules 2007, vol. 40, No. 22, pp. 8119-8124.

Peters, Richard D., et al., J. Vac. Sci. Technol. B, vol. 18, No. 6, Nov./Dec. 2000, pp. 3530-3532.

Peters, Richard D., et al., Macromolecules, vol. 35, No. 5, 2002, pp. 1822-1834.

Potemkin, Igor I., et al., Macromol. Rapid Commun., 2007, 28, pp. 579-584.

Resnick, Douglas, J., et al., J. Microlith., Microfab., Microsyst., vol. 3, No. 2, Apr. 2004, pp. 316-321.

Ruiz, Ricardo, et al., Adv. Mater, 2007, 19, pp. 587-591.

Ryu, Du Yeol, et al., Macromolecules, vol. 40, No. 12, 2007, pp. 4296-4300.

Saraf, Ravi R., et al., Applied Physics Letters, vol. 80, No. 23, Jun. 10, 2002, pp. 4425-4427.

Shahrjerdi, Davood, et al., IEEE Electron Device Letters, vol. 28, No. 9, Sep. 2007, pp. 793-796.

Sharma, Sadhana, et al., Applied Surface Science, 206 (2003), pp. 218-229.

Sivaniah, E., et al., Macromolecules 2003, 36, pp. 5894-5896.

Sivaniah, et al., Macromolecules 2005, 38, 1837-1849.

Solak, Harun H., Journal of Physics D: Applied Physics, 2006, pp. R171-R188.

Stoykovich, Mark P., et al., Science, vol. 308, Jun. 3, 2005, pp. 1442-1446.

Stoykovich, Mark P., et al., ACS Nano, vol. 1, No. 3, 2007, pp. 168-175.

Sundrani, Deepak, et al., Nano Lett., vol. 4, No. 2, 2004, pp. 273-276.

Sundrani, Deepak, et al., Langmuir 2004, vol. 20, No. 12, 2004, pp. 5091-5099.

(56) References Cited

OTHER PUBLICATIONS

Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582.
Yurt, Serkan, et al., Macromolecules 2006, vol. 39, No. 5, 2006.
Zhang, Mingfu, et al., Adv. Mater. 2007, 19, pp. 1571-1576.
Bae, Joonwon, "Surface Modification Using Photo-Crosslinkable Random Copolymers", Abstract submitted for the Mar. 2006 meeting of The American Physical Society, submitted Nov. 30, 2005.
Bang, Joona, "The Effect of Humidity on the Ordering of Tri-block Copolymer Thin Films," Abstract submitted for the Mar. 2007 meeting of The American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-036104-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712.
Gates, Byron D., et al., Annu. Rev. Mater. Res. 2004, 34:339-72.
Ge, Zhenbin, et al., PRL 96, 186101-1-186101-4, The American Physical Society, week ending May 12, 2006.
Genua, A., et al., Nanotechnology, 18 (2007), pp. 1-7.
Gillmor, S.D., et al., Langmuir 2000, vol. 16, No. 18, 2000, pp. 7223-7228.
Hamley, I. W., "Introduction to Block Copolymers", Developments in Block Copolymers Science and Technology, 2004, John Wiley & Sons, Ltd., pp. 1-29.
Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.
Hutchison, J. Brian, et al., Chem. Mater., vol. 17, No. 19, 2005, pp. 4789-4797.
In, Insik, et al., Langmuir, vol. 22, No. 18, 2006, pp. 7855-7860.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.
Li, Mingqi, et al., MaterialsToday, vol. 9, No. 9, Sep. 2006, pp. 30-39.
Li, Xue, et al., ScienceDirect, Polymer 48 (2007), pp. 2434-2443.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902.
Malkoch, Michael, et al., Chem. Commun., 2006, pp. 2774-2776.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Metiers, Andrew, et al., Biomacromolecules 2005, 6, pp. 290-301, 2005.
Meyer, Evelyn, et al., Macromollecular Mater. Eng., 2761277, 2000, pp. 44-50.
Mezzenga, Raffaele, et al., Langmuir 2003, vol. 19, No. 20, 2003, pp. 8144-8147.
Mindel, Joseph., et al., "A Study of Bredig Platinum Sols", The Chemical Laboratories of New York University, vol. 65 pp. 2112.
Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Arshady et al., Makromol. Chem., 1976, vol. 177, p. 2911-2918.
Bang, J. Abstract submitted for the Mar. 6 meeting of the American Physical Society, submitted Nov. 2005 [online], accessed via the Internet [retrieved on Apr. 5, 2010], URL: <http://absimage.aps.org/image/MWS_MAR06-2005-003641.pdf>.
Candau et al., Polymer, 1977, vol. 18, p. 1253-1257.
Hawker et al., Facile Synthesis of Block Copolymers for Nanolithographic Applications; Polymer Reprints, 2005.
Nishikubo, T., American Chemical Society Symposium Series, 1997, p. 214-230.
Ruiz, Ricardo, et al., Science, vol. 321, pp. 936-939, Aug. 15, 2008.
Peng, Juan et al., Macromol. Rapid Commun. 2007, 28, 1422-1428.
Xiao, Shuaigang et al., Nanotechnology 16 (2005) S324-S329.
Berry, B.C., et al., "Effects of Zone Annealing on Thin Films of Block Copolymers", National Institute of Standard and Technology, Polymers Division, Gaithersburg, MD., 2007.
Black, C.T., Applied Physics Letters 87, 163116-1 to 1163116-3, 2005.
Black, Charles T., IEEE Transactions on Nanotechnology, vol. 3, No. 3, Sep. 2004, pp. 412-415.
Cavicchi, Kevin A., et al., Macromolecules 2007, vol. 40, 2007, pp. 1181-1186.

(56) References Cited

OTHER PUBLICATIONS

Gudipati, Chakravarthy S., et al., Journal of Polymer Science Part A: Polymer Chemistry, vol. 42, pp. 6193-6208.

Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, pp. 3932-3944, 2005 Wiley Periodicals, Inc.

Karim, Alamgir et al., "Control of Ordering Kinetics and Morphology Using Zone Annealing of Thin Block Copolymer Filmes", Abstract submitted for the Mar. 2007 Meeting of The American Physical Society, Nov. 20, 2006.

Kim, Seung Hyun, et al., Adv. Mater. 2004, 16, No. 3, Feb. 3, pp. 226-231.

Park, Dae-Ho, Nanotechnology 18, 2007, 355304, pp. 1-7.

Rogers, John A., ACS Nano, vol. 1, No. 3, pp. 151-153, 2007.

Rozkiewicz, Dorota I., et al., Angew. Chem. Int. Ed., 2006, 45, pp. 5292-5296.

Ruiz, Ricardo et al., Science, vol. 321, Aug. 15, 2008, pp. 936-939.

Segalman, Rachel A., Materials Science and Engineering R 48 (2005), pp. 191-226.

Srinvivasan, Charan, et al., ACS Nano, vol. 1, No. 3, pp. 191-201, 2007.

Jun, et al., Langmuir, 2002, 18(9), pp. 3415-3417, Abstract only.

Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.

Bulpitt, Paul et al, Journal of Biomedical Materials Research, vol. 47, Issue 2, pp. 152-169, Abstract only.

Elisseeff J., et al., Journal of Biomedical Materials Research, 51(2): 164-171, Aug. 2000, Abstract only.

Gelest Inc., Silane Coupling Agents: Connecting Across Boundaries, pp. 1-56, 2006.

Ji, Shengxiang, et al., Preparation of Neutral Wetting Brushes for Block Copolymer Films from Homopolymer Blends, submitted to Advanced Materials, 20(16): 3054-3060; published online Jul. 7, 2008.

Ji, Shengxiang, et al., Macromolecules, 2008, 41(23): 9098-9103.

Kim, SH, J Biomater Appl., Jul. 2000; 15(1): 23-46 Abstract only.

Kim, SH, J Biomater Res., Mar. 15, 2000; 49(4): 517-27 Abstract only.

Kim, IS, et al., Int J Pharm., Sep. 15, 2000; 205(1-2): 109-16, Abstract only.

Li, Wai-kin, et al, J. Vac. Sci. Technol. B 25(6), Nov./Dec. 2007, pp. 1982-1984.

Lutolf, M.P., et al, Nature Biotechnology, 23, 47-55 (2005), Abstract only.

Martens, P., et al., Polymer, vol. 41, Issue 21, Oct. 2000, pp. 7715-7722, Abstract only.

Matsuda, T., et al., ASAIO J, Jul.-Sep. 1992; 38(3): M154-7, Abstract only.

Sawhney, Amarpreet S., et al., Macromolecules 1993, 26, 581-587, Abstract only.

Wathier, Michel, et al., J. Am. Chem. Soc., 2004, 126 (40), pp. 12744-12745, Abstract only.

He, Yiyong et al., J. Am. Chem. Soc. 2006, 128, pp. 2745-2750.

Wang, C., et al., Electrochimica Acta 52 (2006), pp. 704-709.

Ali, H.A., et al., Solid-State Electronics, 46, (2002), 1639-1642.

Black, C.T., Proc. of SPIE, vol. 6153, 615302 (2006).

Darling, S.B., Progress in Polymer Science, vol. 32, No. 10, Sep. 28, 2007, pp. 1152-1204.

Harrison, Christopher et al., Polymer, vol. 39, No. 13, pp. 2733-2744, 1998.

Kim, Su-Jin, et al., J. Vac. Sci. Technol. B26(1), Jan./Feb. 2008, 189-194.

La, Young-Hye, et al., J. Vac. Sci. Technol. B 25(6), Nov./Dec. 2007, pp. 2508-2513.

Olayo-Valles, Roberto et al., J. Mater. Chem, 2004, 14, 2729-2731.

Yang, XiaoMin, et al., J. Vac. Sci. Technol. B 22(6), Nov./Dec. 2004, 3331-3334.

Black et al., Integration of Self-Assembled Diblock Copolymers for Semiconductor Capacitor Fabrication, Applied Physics Letters, vol. 79, No. 3, (2001), pp. 409-411.

Chen et al., Highly Ordered Arrays of Mesoporous Silica Nanorods with Tunable Aspect Ratios from Block Copolymer Thin Films, Advanced Materials, vol. 20, (2008), pp. 763-767.

Search Report of the Taiwanese Application No. 098103713, issued Aug. 9, 2012, 2 pages.

Tang et al., Evolution of Block Copolymer Lithography to Highly Ordered Square Arrays, Science, vol. 322, No. 5900, (Sep. 25, 2008), pp. 429-432.

International Preliminary Report on Patentability for International Application No. PCT/US2009/032564 dated Aug. 10, 2010, 12 pages.

International Written Opinion for International Application No. PCT/US2009/032564 dated Oct. 7, 2009, 11 pages.

International Search Report for International Application No. PCT/US2009/032564 dated Oct. 7, 2009, 6 pages.

Cha, Jennifer N., et al., Chem. Mater. 2007, 19, 839-843.

Chang, Li-Wen, Proc. of SPIE, vol. 6156, 2006, 615611-1 to 615611-6.

Chang, Li-Wen, IEEE International Electron Devices Meeting (IEDM), paper 33.2, Dec. 6-8, San Francisco, 2010, pp. 33.2.1-33.2.4.

Ji, Shengxiang et al., ACS Nano, vol. 4, No. 2, 2010, pp. 599-609.

Metters, Andrew, et al., Biomacromolecules 2005, 6, pp. 290-301, 2005.

Park, Seung Hak, et al., Soft Matter, 2010, 6, 2010, 120-125.

Yamaguchi, Toru, et al., Microprocesses and Nanotechnology, 2007, Conference date Nov. 5-8, 2007, pp. 434-435.

Zhang, Yuan et al., Applied Physics Letter, 91, 013104, 2007, pp. 013104 to 013104-3.

Fujita et al., Thin Silica Film with a Network Structure as Prepared by Surface Sol-Gel Transcription on the Poly (styrene-b-4-vinylpyridine) Polymer Film, Chemistry Letters, vol. 32, No. 4, Dec. 31, 2003, pp. 352-353.

Melde et al., Silica Nanostructures Templated by Oriented Block Copolymer Thin Films Using Pore-Filling and Selective-Mineralization Routes, Chem. Mater., vol. 17, No. 18, Aug. 13, 2005, pp. 4743-4749.

Asakawa et al., Fabrication of Subwavelength Structure for Improvement in Light-Extraction Efficiency of Light-Emitting Devices Using a Self-Assembled Pattern of Block Copolymer, http://www.research.ibm.com/journal/rd/515/black.html, IBM Journal of Research and Development, vol. 51, No. 5, 2007.

Berry, B. C., et al., "Orientational Order in Block Copolymer Films Zone Annealed Below the Order—Disorder Transition Temperature," Nano Letters vol. 7, No. 9 Aug. 2007, Polymers Division, Nat'l. Inst. of Standards and Technology, Maryland, USA, pp. 2789-2794, (published on Web Aug. 11, 2007).

Black, C. T., et al., Polymer Self Assembly in Semiconductor Microelectronics, IBM J. Res. & Dev. vol. 51, No. 5, Sep. 2007, pp. 605-633.

Chai et al., Assembly of Aligned Linear Metallic Patterns on Silicon, Nature Nanotechnology, vol. 2, Aug. 2007, pp. 500-506.

Chai et al., Using Cylindrical Domains of Block Copolymers to Self-Assemble and Align Metallic Nanowires, American Chemical Society, www.Acsnano.org, 2008. pp. A-K.

Cho et al., Nanoporous Block Copolymer Micelle/Micelle Multilayer Films with Dual Optical Properties, J. AM. Chem. Soc., vol. 128, No. 30, pp. 9935-9942 (2006).

Choi, H. J., et al., "Magnetorheology of Synthesized Core—Shell Structured Nanoparticle," IEEE Transactions on Magnetics, vol. 41, No. 10, Oct. 2005, pp. 3448-3450.

Clark et al., "Selective Deposition in Multilayer Assembly: SAMs as Molecular Templates," Supramolecular Science, vol. 4, pp. 141-146, (1997).

Erlandsson, Mikael, et al., "Metallic Zinc Reduction of Disulfide Bonds between Cysteine Residues in Peptides and Proteins," International Journal of Peptide Research and Therapeutics, vol. 11, No. 4, pp. 261-265, Dec. 2005.

(56) References Cited

OTHER PUBLICATIONS

Fasolka et al., Block Copolymer Thin Films: Physics and Applications, Annual Review, vol. 31, pp. 323-355 (2001).
Gates, "Nanofabrication with Molds and Stamps," Materials Today, pp. 44-49, (Feb. 2005).
Grubbs, Hybrid Metal-Polymer Composites from Functional Block Copolymers, Journal of Polymer Science: Part A: Polymer Chemistry, vol. 43, pp. 4323-4336 (2005).
Guarini et al., Nanoscale Patterning Using Self-Assembled Polymers for Semiconductor Applications, J. Vac. Sci. Technol. B 19(6), pp. 2784-2788, Nov./Dec. 2001.
Hadziioannou, Semiconductor Block Copolymers for Self-Assembled Photovoltaic Devices, MRS Bulletin, pp. 456-460 (2002).
Hamers, Robert J., "Passivation and activation: How do monovalent atoms modify the reactivity of silicon surfaces? A perspective on the article, 'The mechanism of amine formation on Si(100) activated with chlorine atoms,'" Surface Science, vol. 600, pp. 3361-3362, 2006.
Hawker, C. J., et al., Abstract for "Improving the Manufacturability and Structural Control of Block Copolymer Lithography," Abstracts of Papers, 232nd ACS National Meeting, San Francisco, CA, Sep. 10-14, 2006.
Hayward et al., Crosslinked Poly(styrene)-block-Poly(2-vinylpyridine) Thin Films as Swellable Templates for Mesostructured Silica and Titania, Advanced Materials, vol. 17, 2005, pp. 2591-2595.
Helmbold, A., et al., "Optical Absorption of Amorphous Hydrogenated Carbon Thin Films," Thin Solid Films 283(1996) pp. 196-203.
Helmuth, Jo A., et al., "High-Speed Microcontact Printing," J. Am. Chem. Soc., vol. 128, No. 29, pp. 9296-9297, 2006.
Horiuchi et al., Three-Dimensional Nanoscale Alignment of Metal Nanoparticles Using Block Copolymer Films as Nanoreactors, Langmuir, vol. 19, pp. 2963-2973 (2003).
Huang et al., "Stretchable gold conductors on elastomeric substrates," Applied Physics Letters, vol. 82, No. 15, Apr. 14, 2003, pp. 2404-2406.
Huang et al., "Using Surface Active Random Copolymers to Control the Domain Orientation in Diblock Copolymer Thin Films," Macromolecules, 1998, 31, 7641-7650.
Hur et al., "Nanotransfer printing by use of noncovalent surface forces: Applications to thin-film transistors that use single-walled carbon nanotube networks and semiconducting polymers," Applied Physics Letters, vol. 85, No. 23, Dec. 6, 2004, pp. 5730-5732.
Jiang, Xingyu, et al., "Electrochemical Desorption of Self-Assembled Monolayers Noninvasively Releases Patterned Cells from Geometrical Confinements," J. Am. Chem. Soc., vol. 125, No. 9, pp. 2366-2367, 2003.
Johnson, Daniel L., et al., "Probing the stability of the disulfide radical intermediate of thioredoxin using direct electrochemistry," Letters in Peptide Science, vol. 10, pp. 495-500, 2003.
Jun, Yongseok, et al., "Patterning protein molecules on poly(ethylene glycol) coated Si(111)," Biomaterials, vol. 25, pp. 3503-3509, 2004.
Kavakli et al., Single and Double-Layer Antireflection Coatings on Silicon, Turk J Phys, vol. 26, pp. 349-354 (2002).
Kim, SH, et al., "In Vitro Release Behavior of Dextran-methacrylate Hydrogels Using Doxorubicin and Other Model Compounds," J Biomater Appl., Jul. 2000; 15(1): 23-46 Abstract only.
Krishnamoorthy et al., Block Copolymer Micelles as Switchable Templates for Nanofabrication, Languir, vol. 22, No. 8, Mar. 17, 2006, pp. 3450-3452.
Krishnamoorthy et al., Nonpatterned Self-Assembled Monolayers by Using Diblock Copolymer Micelles as nanometer-Scale Adsorption and Etch Masks, Advanced Materials, 2008, pp. 1-4.
Kuhnline et al., "Detecting thiols in a microchip device using micromolded carbon ink electrodes modified with cobalt phthalocyanine", Analyst, vol. 131, pp. 202-207, (2006).
Li, Yong, et al., "A Method for Patterning Multiple Types of Cells by Using Electrochemical Desorption of Self-Assembled Monolayers within Microfluidic Channels," Angew. Chem. Int. Ed., vol. 46, pp. 1094-1096, 2007.
Liu et al., Pattern Transfer Using Poly(styrene-block-methyl methacrylate) Copolymer Films and Reactive Ion Etching, J. Vac. Sci. Technol. B vol. 25, No. 6, Nov./Dec. 2007, pp. 1963-1968.
Loo et al., "Additive, nanoscale patterning of metal films with a stamp and a surface chemistry mediated transfer process: Applications in plastic electronics," Applied Physics Letters, vol. 81, No. 3, Jul. 15, 2002, pp. 562-564.
Lopes et al., Hierarchical Self-Assembly of Metal Nanostructures on Diblock Copolymer Scaffolds, Nature, vol. 414, Dec. 13, 2001, pp. 735-738.
Lutolf, M., et al., "Cell-Responsive Synthetic Hydrogels," Adv. Mater., vol. 15, No. 11, Jun. 2003, pp. 888-892.
Lutz, Jean-Francois, "1,3-Dipolar Cycloadditions of Azides and Alkynes: A Universal Ligation Tool in Polymer and Materials Science," Angew. Chem. Int. Ed., vol. 46, pp. 1018-1025, 2007.
Malenfant et al., Self-Assembly of an Organic-Inorganic Block Copolymer for Nano-Ordered Ceramics, Nature Nanotechnology, vol. 2, pp. 43-46 (2007).
Niu, Sanjun, et al., "Selective assembly of nanoparticles on block copolymer by surface modification," Nanotechnology, vol. 18, pp. 1-4, 2007.
Park et al., Fabrication of Highly Ordered Silicon Oxide Dots and Stripes from Block Copolymer Thin Films, Advanced Materials, vol. 20, pp. 681-685, 2008.
Park et al., High-Aspect-Ratio Cylindrical Nanopore Arrays and Their Use for Templating Titania Nanoposts, Advanced Materials, vol. 20, pp. 738-742, 2008.
Reed, M.A., et al., "Molecular random access memory cell," Appl. Phys. Lett., vol. 78, No. 23, pp. 3735-3737, Jun. 2001.
Sang et al., "Epitaxial self-assembly of block copolymers on lithographically defined nanopatterned substrates", Nature, vol. 24, pp. 411-414, (Jul. 2003).
Sato et al., Novel Antireflective Layer Using Polysilane for Deep Ultraviolet Lithography, J. Vac. Sci. Technol. B, vol. 17, No. 6, pp. 3398-3401 (1999).
Sohn et al., Fabrication of the Multilayered Nanostructure of Alternating Polymers and Gold Nanoparticles with Thin Films of Self-Assembling Diblock Copolymers, Chem, Mater, vol. 13, pp. 1752-1757 (2001).
Tadd et al, Spatial Distribution of Cobalt Nanoclusters in Block Copolymers, Langmuir, vol. 18, pp. 2378-2384 (2002).
Trimbach et al., "Block Copolymer Thermoplastic Elastomers for Microcontact Printing," Langmuir, 2003, vol. 19, p. 10957.
Truskett, V. M., et. al., "Trends in Imprint Lithography for Biological Applications," Trends in Biotechnology, vol. 24, No. 7, Jul. 2006, pp. 312-315.
Tseng et al., Enhanced Block Copolymer Lithography Using Sequential Infiltration Synthesis, The Journal of Physical Chemistry, vol. 115, No. 36, Sep. 15, 2011, 15 pages.
Xia et al., An Approach to Lithographically Defined Self-Assembled Nanoparticle Films, Advanced Materials, vol. 18, pp. 930-933 (2006).
Ikeda, Susumu et al., NanotechJapan Bulletin—vol. 3, No. 3, Dec. 17, 2010/Focus 26-06.
Search Report of Taiwanese Patent Application No. 097121922, dated Oct. 16, 2011, 1 page.
Search Report of Taiwanese Patent Application No. 098108789, dated Dec. 18, 2012, 1 page.
Search Report of Taiwanese Patent Application No. 098109253, dated Aug. 22, 2012, 1 page.
Search Report of Taiwanese Patent Application No. 097110156, dated Mar. 22, 2012, 1 page.
Xia, Younan, et al., "Soft Lithography," Annu. Rev. Mater. Sci., vol. 28, pp. 153-184, 1998.
Xu et al., Electric Field Alignment of Symmetric Diblock Copolymer Thin Films, Department of Polymer Science and Engineering, University of Massachusetts, 5 pages (2003).
Xu et al., Interfacial Interaction Dependence of Microdomain Orientation in Diblock Copolymer Thin Films, Macromolecules, vol. 38, pp. 2802-2805 (2005).
Xu, F.J., et al., "Surface-Initiated Atom Transfer Radical Polymerization from Halogen-Terminated Si(111) (Si-X, X=Cl, Br) Surfaces

(56) References Cited

OTHER PUBLICATIONS for the Preparation of Well-Defined Polymer-Si Hybrids," Langmuir, vol. 21, No. 8, pp. 3221-3225, 2005.
Yang et al., Covalently Attached Graft Polymer Monolayer on Organic Polymeric Substrate via Confined Surface Inhibition Reaction, Journal of Polymer Science—A—Polymer Chemistry Edition, Sep. 28, 2006, pp. 745-755, vol. 45, Issue 5.
Yu et al., Contact Printing Beyond Surface Roughness: Liquid Supramolecular Nanostamping, Advanced Materials, vol. 19, 2007, pp. 4338-4342.
Zaumseil et al., "Three-Dimensional and Multilayer Nanostructures Formed by Nanotransfer Printing," Nano Letters, 2003, vol. 3, No. 9, pp. 1223-1227.
Zhang et al., "Self-Assembled Monolayers of Terminal Alkynes on Gold," J. Am. Chem. Soc., vol. 129, No. 16, pp. 4876-4877, 2007.
Zhao et al., Colloidal Subwavelength Nanostructures for Antireflection Optical Coatings, Optics Letters, vol. 30, No. 14, pp. 1885-1887 (2005).
Zhou et al., Nanoscale Metal/Self-Assembled Monolayer/Metal Heterostructures, American Institute of Physics, pp. 611-613 (1997).
Zhu, X. Y., et al., "Molecular Assemblies on Silicon Surfaces via Si—O Linkages," Langmuir, vol. 16, 2000, American Chemical Society, pp. 6766-6772.
Zhu, X.Y., et al., "Grafting of High-Density Poly(Ethylene Glycol) Monolayers on Si(111)," Langmuir, vol. 17, pp. 7798-7803, 2001.
Electronegativity—<http://www.princeton.edu/~achaney/tmve/wiki100k/docs/Electronegativity.html> website, visited Aug. 28, 2013, 1 page.

* cited by examiner

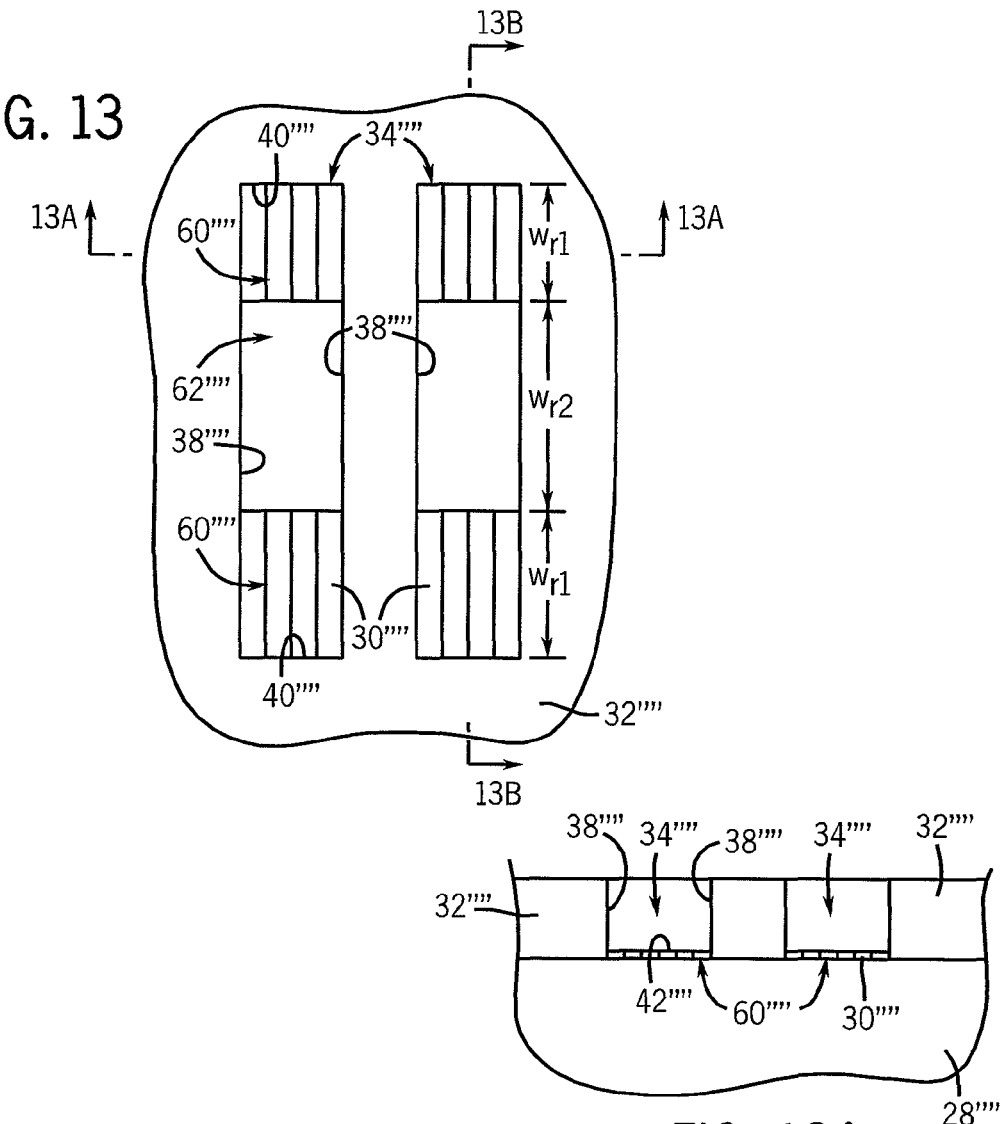
FIG. 13
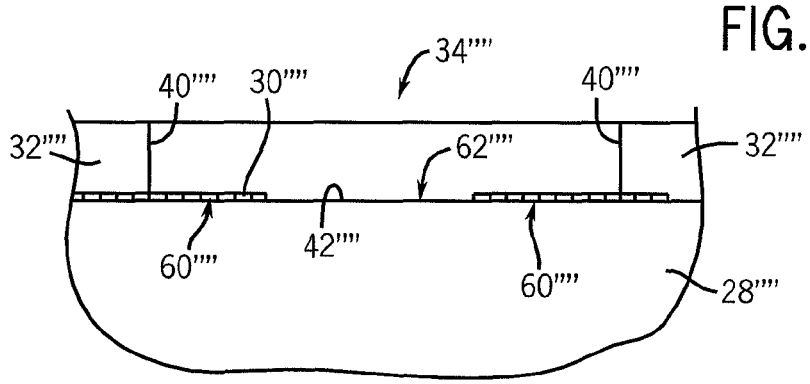
FIG. 13A
FIG. 13B

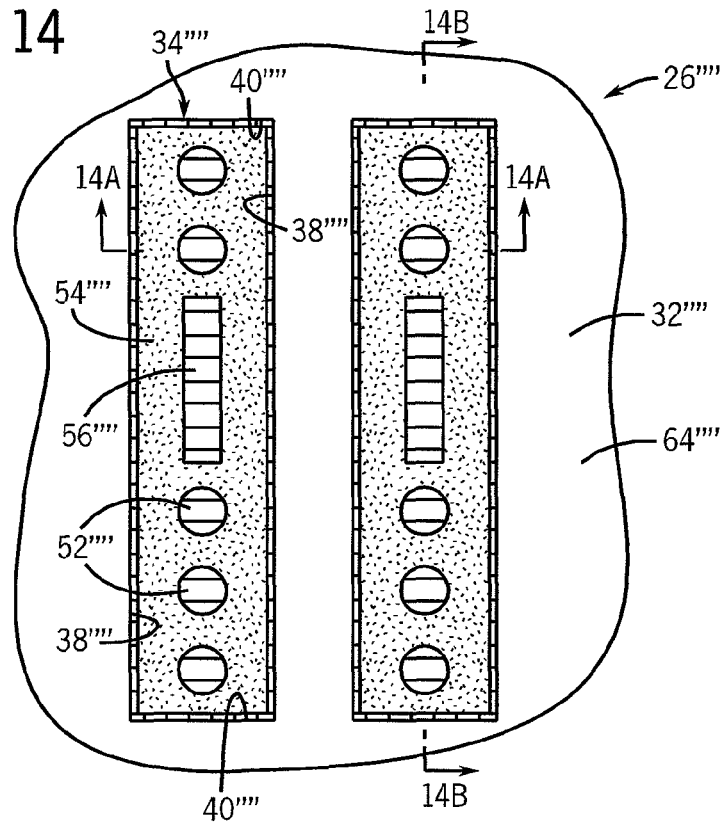
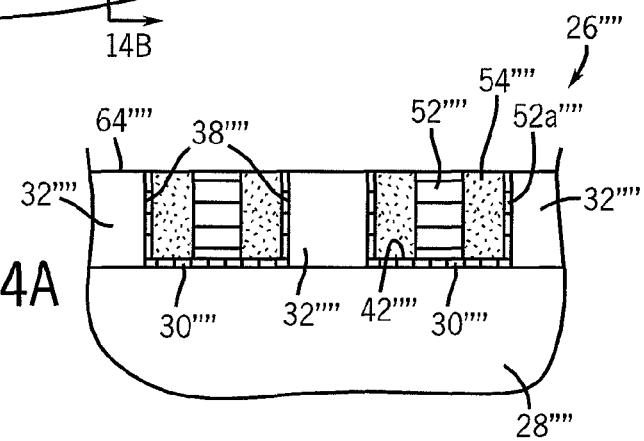
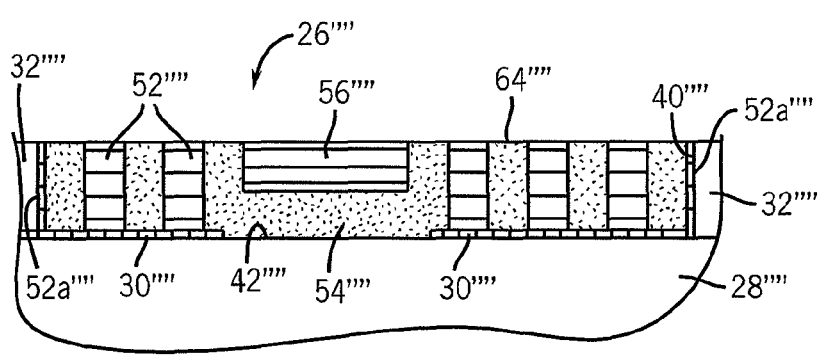
FIG. 14
FIG. 14A
FIG. 14B

METHOD TO PRODUCE NANOMETER-SIZED FEATURES WITH DIRECTED ASSEMBLY OF BLOCK COPOLYMERS

TECHNICAL FIELD

Embodiments of the invention relate to methods, a stamp and a system for patterning a substrate by use of self-assembling block copolymers, and devices resulting from those methods.

BACKGROUND OF THE INVENTION

Lithography is a key process in the fabrication of semiconductor integrated circuits. Photolithography typically involves projecting an image through a reticle or mask onto a thin film of photoresist or other material that covers a semiconductor wafer or other substrate, and developing the film to remove exposed or unexposed portions of the resist to produce a pattern in subsequent processing steps. In semiconductor processing, the continual shrinking in feature sizes and the increasing development of nanoscale mechanical, electrical, chemical and biological devices requires systems to produce nanoscale features. However, with conventional photolithography using light, the minimum feature size and spacing between patterns is generally on the order of the wavelength of the radiation used to expose the film. This limits the ability to produce sub-lithographic features of about 60 nm using conventional lithography.

Microcontact printing has been developed to create sub-lithographic features in semiconductor devices. This technique generally involves stamping or pressing a soft template or stamp bearing small scale topographic features onto a receptor substrate to form a pattern on the substrate. The features on the template are typically prepared by photolithography or electron (e-beam) lithography. For example, FIG. 1 illustrates a conventional soft template or stamp 10 formed, for example, from polydimethylsiloxane, with defined features 12 structured with a stamping surface 14 and sidewalls 16. The stamping surface 14 defines a dimension (d) of the pattern to be stamped onto a substrate. As shown in FIG. 2, the features 12 of the stamp are wetted with an ink 18 that is physisorbed or chemisorbed onto the stamping surface 14 and the sidewalls 16 of the features 12. As depicted in FIG. 3, the inked stamp 10 is brought into contact with a receptor substrate 20 (e.g., silicon wafer) and the ink 18 is transferred to regions of the substrate 20 where the ink 18 forms self-assembled monolayers (SAMs) 22 (FIG. 4).

However, resolution of small features is problematic because of inconsistent printing due to capillary forces that pull ink 18 sorbed to surfaces of the features 12 adjacent to the stamping surface 14 (e.g., the sidewalls 16) onto the substrate 20 (e.g., areas 24). Such wicking of the ink 18 material onto the substrate 20 also alters the intended dimension (d) of the stamped features (SAMs) 22, as defined by the stamping surfaces 14 of the stamp/template. In addition, the size and dimension of the stamped features 22 on the receptor substrate 20 are limited to the dimensions (d) of the lithographically formed features 12 defined on the stamp.

Other processes such as e-beam lithography and extreme ultraviolet (EUV) lithography have been used in attempts to form sub-lithographic features. However, the high costs associated with such lithographic tools have hindered their use.

Self-assembled block copolymer films have been prepared by patterning the surface of a substrate with chemical stripes (chemical templating), each stripe being preferentially wetted by the alternate blocks of a block copolymer. A block copolymer film with lamellar morphology, a periodicity matching the stripe pattern and both blocks being neutral wetting at the air interface (e.g., PS-PMMA) that is cast on the patterned substrate and thermally annealed will self-assemble so that the domains orient themselves above the preferred stripes and perpendicular to the surface. However, the process has no advantage over EUV lithography or other sub-lithographic patterning techniques since one of these patterning techniques must be used to form the substrate template pattern, and with the use of expensive patterning tools, the low-cost benefits of using block copolymers are lost.

It would be useful to provide a method and system for preparing sub-lithographic features that overcome existing problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 7A-8A illustrate elevational, cross-sectional views of embodiments of a portion of the substrate depicted in FIGS. 7 and 8 taken, respectively, along lines 7A-7A and lines 8A-8A.

FIGS. 13 and 14 illustrate diagrammatic top plan views of the stamp of FIG. 12 at subsequent processing stages. FIGS. 13A and 14A illustrate elevational, cross-sectional views of a portion of the substrate depicted in FIGS. 13 and 14 taken, respectively, along lines 13A-13A and lines 14A-14A. FIGS. 13B and 14B are cross-sectional views of the substrate of FIGS. 13-14 taken, respectively, along lines 13B-13B and lines 14B-14B.

FIGS. 31 and 32 illustrate the removal of non-crosslinked polymer material and the use of the inked pattern to direct self-assembly of a block copolymer material.

FIG. 35 illustrates a perspective view of a base substrate at a preliminary processing stage bearing a hydrophilic material on the surface. FIGS. 36-39 illustrate the substrate of FIG. 35 at subsequent processing stages to form a patterned master template.

FIG. 40 illustrates a perspective view of a base substrate at a preliminary processing stage bearing a hydrophobic material on the surface. FIGS. 41-43 illustrate the substrate of FIG. 40 at subsequent processing stages to form a patterned master template.

FIG. 44 illustrates a perspective view of a master template with a material for forming the stamp in a preliminary processing stage. FIG. 45 illustrates the master template/stamp material complex at a subsequent processing step. FIGS. 46 and 47 illustrate elevational, cross-sectional views of the master template/stamp material complex of FIG. 45 at subsequent processing steps showing the removal of the chemically patterned stamp from the master template.

FIGS. 48 and 49 illustrate elevational, cross-sectional views of the stamp brought into contact with the block copolymer material on a substrate. FIG. 50 illustrates an elevational, cross-sectional view of the annealing of the block copolymer material in contact with the stamp. FIGS. 51 and 52 illustrate the removal of the chemically patterned stamp from the annealed and self-assembled block copolymer material of FIG. 50, shown in an elevational, cross-sectional view.

FIG. 53 illustrates an elevational, cross-sectional view of the block copolymer material of FIG. 52 at a subsequent processing step to selectively remove polymer domains to form a mask with openings to the substrate. FIGS. 54 and 55 illustrate the substrate shown in FIG. 53 at subsequent processing stages to form and fill openings in the substrate.

FIG. 56 illustrates a perspective view of a master template having a surface bearing dots composed of a hydrophilic material amidst a hydrophobic material.

FIG. 57 illustrates an embodiment of a stamp formed from the master template of FIG. 56 in an elevational, cross-sectional view.

FIG. 58 illustrates an embodiment of the use of the stamp of FIG. 57 to direct ordering of a cylindrical-phase block copolymer material in an elevational, cross-sectional view.

DETAILED DESCRIPTION OF THE INVENTION

Figure 1:
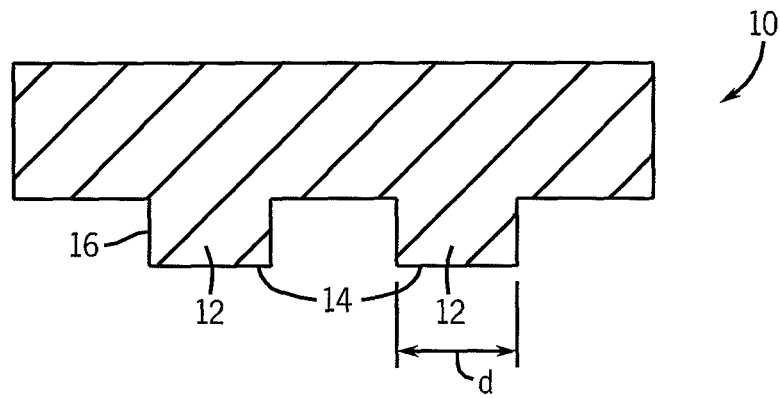
FIG. 1 illustrates an elevational, cross-sectional view of a conventional stamp used in a microcontact printing application.
Figure 2:
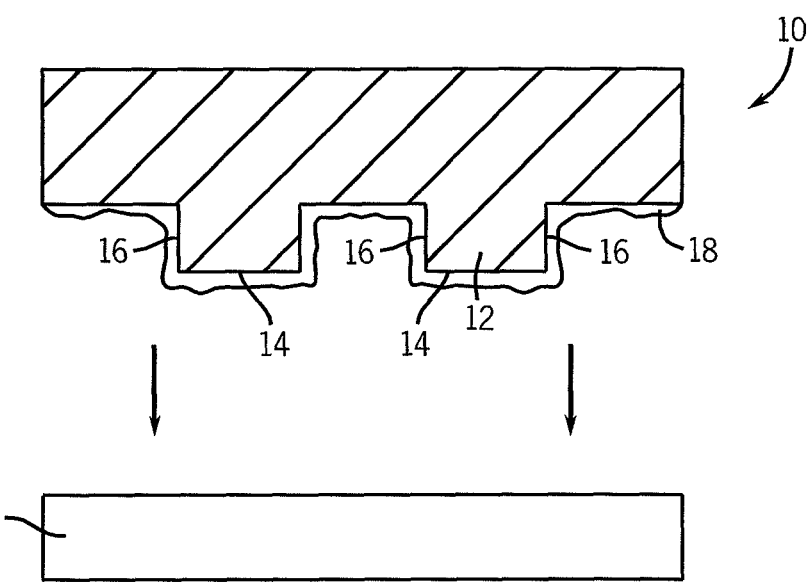
FIG. 2 illustrates a diagrammatic view of the stamp of FIG. 1, with ink physisorbed or chemisorbed onto the surface of the stamp, and a receptor substrate to be contacted by the inked stamp.
Figure 3:
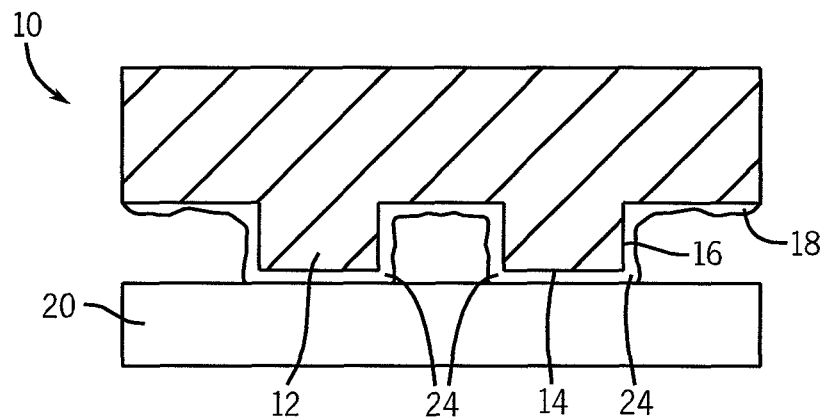
FIG. 3 illustrates the inked stamp of FIG. 2, brought into contact with the receptor substrate, according to a conventional microcontact printing process.
Figure 4:
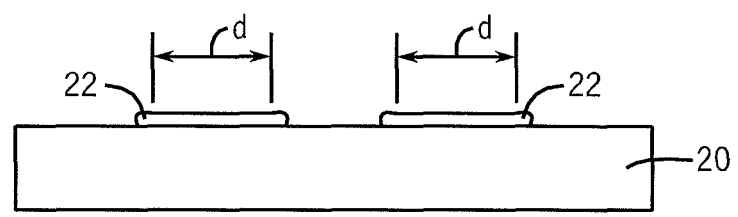
FIG. 4 illustrates a subsequent processing step with the formation of SAMs from the transferred ink on the receptor substrate.

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including, but not limited to, bulk semiconductive materials such as a semiconductor wafer (either alone or in assemblies comprising other materials thereon), and semiconductive material layers (either alone or in assemblies comprising other materials). The term "substrate" refers to any supporting structure, including, but not limited to, the semiconductive substrates, wafer fragments or wafers described above.

"$L_o$" is the inherent periodicity or pitch value (bulk period or repeat unit) of structures that self-assemble upon annealing from a self-assembling (SA) block copolymer or a blend of a block copolymer with one or more of its constituent homopolymers.

The term "chemical affinity" means the tendency of molecules to associate with each other based upon chemical forces between the molecules. The term "physiosorbed" means the physical adsorption of a molecule (e.g., ink material) to a surface, for example, through weak intermolecular interactions such as Van der Waals forces. The term "chemisorbed" means the chemical adsorption of a molecule (e.g., ink material) to a surface, for example, through chemically bonding such as through hydrogen bonds, ionic bonds, dithiol linkages, electrostatic bonds or other "weak" chemical bond.

In embodiments of the invention, a stamp or template is prepared by guided self-assembly of block copolymers, with both polymer domains at the air interface. Block copolymer films spontaneously assemble into periodic structures by microphase separation of the constituent polymer blocks after annealing, forming ordered domains at nanometer-scale dimensions. One of the polymer blocks has affinity for and is swelled by absorption of an ink chemical and a second polymer domain has substantially no affinity for the ink chemical and remains unchanged. The chemical ink can then be transferred from the stamp to a receptor substrate where the ink forms SAMs. The resolution of the imprinted SAMs exceed other microcontact techniques using self-assembled polymer films, and processing costs using the technique is significantly less than using electron beam lithography or EUV photolithography, which have comparable resolution.

The two-dimensional (2D) inked pattern that is formed on the receptor substrate can then be used, for example, as a template or pattern for self-assembled ordering of a block copolymer film that is cast onto the patterned receptor substrate. Following self-assembly on the receptor substrate, one block of the copolymer can then be selectively removed and the remaining patterned film used as an etch mask for patterning nanosized features into the underlying substrate.

Methods for fabricating a stamp composed of a self-assembled block copolymer thin film that defines nanometer-scale cylindrical and linear array patterns according to embodiments of the invention are illustrated in FIGS. 5-14B.

In some embodiments, the stamp is prepared under processing conditions that use a graphoepitaxy technique utilizing the sidewalls of trenches as constraints to induce orientation and registration of a film of a self-assembling diblock copolymer to form an ordered array pattern registered to the trench sidewalls. Graphoepitaxial techniques can be used to order cylindrical-phase diblock copolymers in one dimension, for example, parallel lines of half-cylinders, hexagonal close-packed arrays of perpendicular cylinders, or a single row of perpendicular cylinders within lithographically defined trenches. A desired pattern of cylinders on the stamp can be prepared by providing trenches having walls that are selective to one polymer block of a block copolymer and a floor composed either of a material that is block-sensitive or preferentially wetting to one of the blocks of the block copolymer in trenches where lines of parallel half-cylinders are desired, or a material that is neutral wetting to both blocks in trenches where an array of perpendicular cylinders are desired.

Additionally, in some embodiments, the trench floors can be chemically differentiated to provide a wetting pattern to control orientation of the microphase separated and self-assembling cylindrical domains in a second dimension, for example, parallel lines of half-cylinders or perpendicular-oriented cylinders. The trench floors are structured or composed of surface materials to provide a neutral wetting surface or preferential wetting surface to impose ordering on a block copolymer film that is then cast on top of the substrate and annealed to produce desired arrays of nanoscaled lines and/or cylinders.

Figure 5:
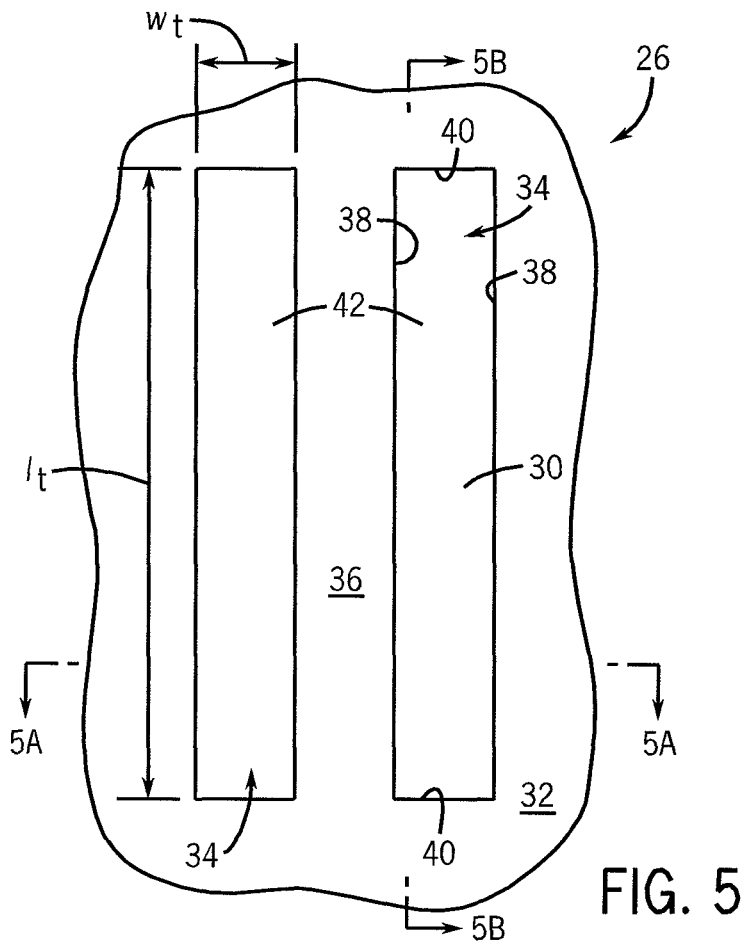
FIG. 5 illustrates a diagrammatic top plan view of a portion of a substrate of a stamp at a preliminary processing stage according to an embodiment of the present disclosure, showing the substrate with trenches.
Figure 5A:
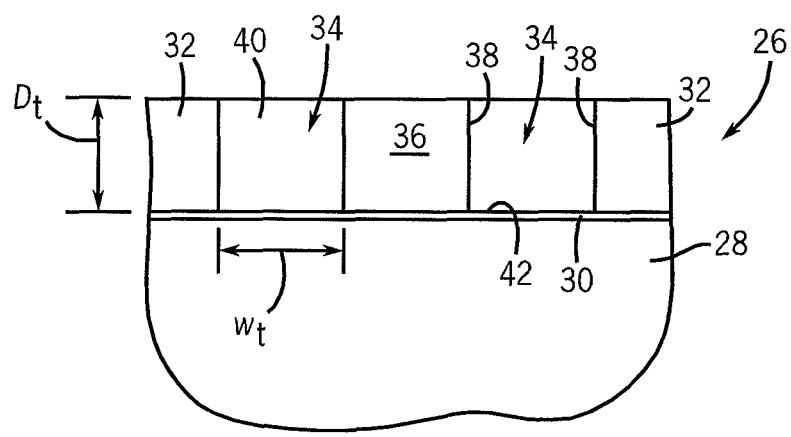
FIGS. 5A and 5B are elevational, cross-sectional views of the substrate depicted in FIG. 5 taken along lines 5A-5A and 5B-5B, respectively.
Figure 5B:
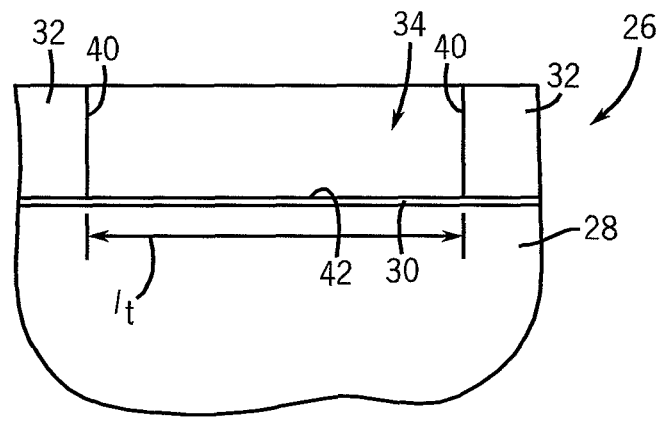

As illustrated in FIGS. 5-5B, a base substrate 28 is provided, which can be silicon, silicon oxide, silicon nitride, silicon oxynitride, silicon oxycarbide, among other materials. In some embodiments, a neutral wetting material 30 is formed over the base substrate 28. A material layer 32 to be etched can then be formed over the neutral wetting material 30 and etched to form trenches 34. Portions of the material layer 32 form a spacer 36 between the trenches 34. The trenches 34 are structured with opposing sidewalls 38, opposing ends 40, a floor 42, a width ($w_t$), a length ($l_t$) and a depth ($D_t$).

Figure 6:
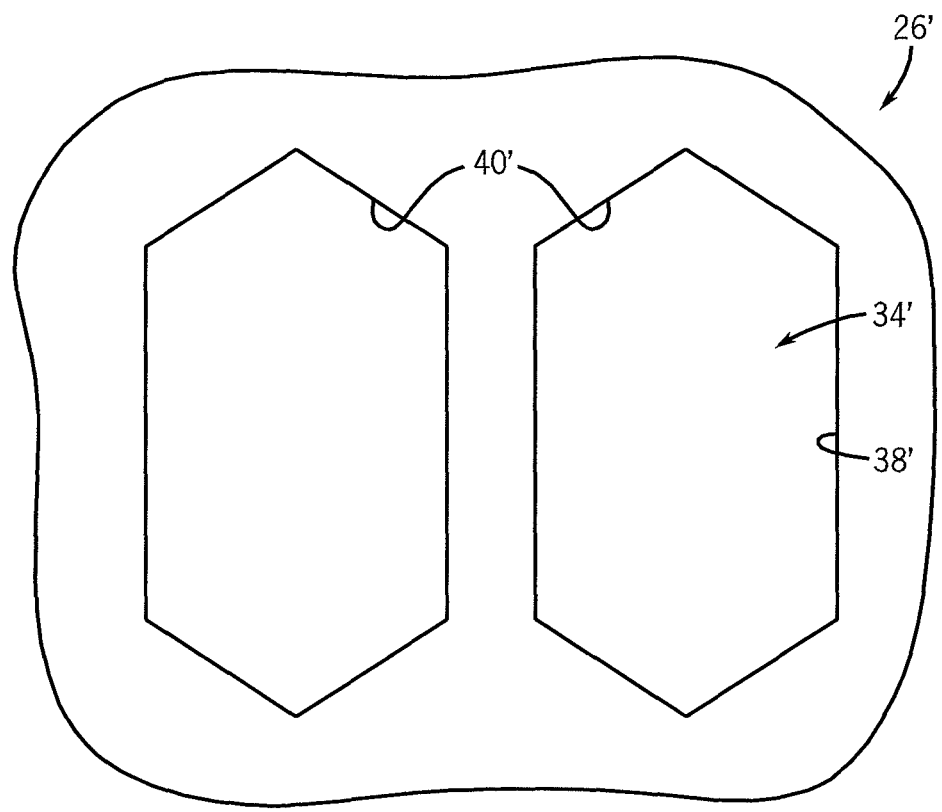
FIG. 6 is a top plan view of a portion of a substrate according to another embodiment showing the substrate with trenches for forming a stamp with a hexagonal close-packed array of perpendicular cylinders.

As illustrated in FIG. 6, in embodiments for forming a stamp 26' with a hexagonal close-packed array of perpendicular cylinders, ends 40' of trenches 34' are angled to sidewalls 38', for example, at an about 60° angle, and in some embodiments, the trench ends are slightly rounded. In other embodiments, the material layer 32 can be formed on the base substrate 28, etched to form the trenches 34, and then a neutral wetting material (e.g., random copolymer) 30 can be applied to the trench floors 42 and crosslinked. Non-crosslinked random copolymer material outside the trenches 34 (e.g., on the spacers 36) can be subsequently removed.

The trenches can be formed using a lithographic tool having an exposure system capable of patterning at the scale of $L_o$ (10-100 nm). Such exposure systems include, for example, extreme ultraviolet (EUV) lithography, proximity X-rays and electron beam (e-beam) lithography, as known and used in the art. Conventional photolithography can attain (at smallest) about 58 nm features.

A method called "pitch doubling" or "pitch multiplication" can also be used for extending the capabilities of photolithographic techniques beyond their minimum pitch, as described, for example, in U.S. Pat. No. 5,328,810 (Lowrey et al.), U.S. Pat. No. 7,115,525 (Abatchev et al.), US 2006/0281266 (Wells), now U.S. Pat. No. 7,396,781, issued Jul. 8, 2008, and US 2007/0023805 (Wells), now U.S. Pat. No. 7,776,715, issued Aug. 17, 2010. Briefly, a pattern of lines is photolithographically formed in a photoresist material overlying a layer of an expendable material, which in turn overlies a substrate, the expendable material layer is etched to form placeholders or mandrels, the photoresist is stripped, spacers are formed on the sides of the mandrels, and the mandrels are then removed, leaving behind the spacers as a mask for patterning the substrate. Thus, where the initial photolithography formed a pattern defining one feature and one space, the same width now defines two features and two spaces, with the spaces defined by the spacers. As a result, the smallest feature size possible with a photolithographic technique is effectively decreased down to about 30 nm or less.

The boundary conditions of the trench sidewalls 38 in both the x- and y-axis impose a structure wherein each trench contains "n" number of features (e.g., cylinders, lamellae, etc.). Factors in forming a single array or layer of nanostructures within the trenches include the width and depth of the trench, the formulation of the block copolymer to achieve the desired pitch ($L_o$), and the thickness (t) of the copolymer film. The length (l) of the trenches is at or about $nL_o$ where n is an integer multiple of $L_o$, typically within a range of about n*10–n*100 nm (with n being the number of features or structures (i.e., cylinders)). The depth ($D_t$) of the trenches 34 is about equal to $L_o$ ($D_t\sim L_o$) such that a cast block copolymer material 44 of about $L_o$ will fill the trenches, and is generally over a range of about 10-100 nm. The trenches 34 are constructed with a width ($w_t$) such that a block copolymer (or blend) will self-assemble upon annealing into a single layer of nanoelements (e.g., cylinders, lamellae, etc.) spanning the width ($w_t$) of the trench, with the center-to-center distance of adjacent identical elements being at or about $L_o$. The width of the spacer 36 between adjacent trenches can vary and is generally about $L_o$ to about $nL_o$. In some embodiments, the trench dimension is about 100-1,500 nm wide ($w_t$) and about 100-25,000 nm in length ($l_t$), with a depth ($D_t$) of about 10-100 nm.

To form a single layer of n lamellae from a lamellar-phase block copolymer (inherent pitch value of $L_o$), which spans the width registered to the sidewalls 38 for the length of the trench 34, the width ($w_t$) of the trenches can be a multiple of the inherent pitch value ($L_o$) of the polymer, being equal to or about $nL_o$ ("$n*L_o$") and typically ranging from about n*10 to about n*100 nm (with n being the number of features or structures). For forming a 1D array of perpendicular-oriented cylinders with a center-to-center pitch of at or about $L_o$ (e.g., a width of about 65-75 nm for an $L_o$ value of about 36-42 nm), the trenches 34 can be constructed with a width (iv) of about $2*L_o$ or less, e.g., about $1.0*L_o$ to about $2*L_o$ (e.g., about $1.75*L_o$). For forming parallel lines of half-cylinders or a periodic, hexagonal close-pack or honeycomb array of perpendicular cylinders, the trenches 34, 34' can be constructed with a width ($w_t$) at or about an integer multiple of the $L_o$ value or $nL_o$ where n=3, 4, 5, etc. (e.g., a width of about 120-2,000 nm for an $L_o$ value of about 36-42 nm).

For example, a block copolymer having a 35 nm pitch ($L_o$ value) deposited into a 75 nm wide trench having a neutral wetting floor will, upon annealing, result in a zigzag pattern of 35 nm diameter perpendicular cylinders that are offset by a half distance for the length ($l_b$) of the trench, rather than a single line of perpendicular cylinders aligned with the sidewalls down the center of the trench. As the $L_o$ value of the copolymer is increased, for example, by forming a ternary blend by the addition of both constituent homopolymers, there is a shift from two rows to one row of the perpendicular cylinders within the center of the trench.

A block copolymer material of about $L_o$ is deposited to about fill the trenches 34 and, upon annealing, the block copolymer film will self-assemble into morphologies to form an array of elements that are oriented in response to the wetting properties of the trench surfaces. Entropic forces drive the wetting of a neutral wetting surface by both blocks, and enthalpic forces drive the wetting of a preferential-wetting surface by the preferred block (e.g., the minority block). The trench sidewalls 38 and ends 40 are structured to be preferential wetting by one block of the block copolymer to induce registration of elements (e.g., cylinders, half-cylinders, lamellae, etc.) as the polymer blocks self-assemble. Upon annealing, the preferred block of the block copolymer will segregate to the sidewalls and edges of the trench to assemble into a thin (e.g., ¼pitch) interface (wetting) layer, and will self-assemble to form elements according to the wetting surface of the trench floor 42.

For example, in response to neutral wetting properties of the trench floor surface material (e.g., crosslinked neutral wetting random copolymer mat) and preferential wetting sidewalls and ends, an annealed cylinder-phase block copolymer film will self-assemble to form cylinders in a perpendicular orientation to the trench floors in the center of a polymer matrix, and a lamellar-phase block copolymer film will self-assemble into a lamellar array of alternating polymer-rich blocks (e.g., PS and PMMA) that extend across the width and for the length of the trench and are oriented perpendicular to the trench floor and parallel to the sidewalls. In a trench having a preferential wetting floor, sidewalls and ends, an annealed cylinder-phase block copolymer film will self-assemble to form lines of half-cylinders in a polymer matrix extending the length of the trench and parallel to the trench floor.

The structuring of the trench sidewalls 38 and ends 40 to be preferential wetting causes one of the blocks of the copolymer material to form a thin wetting layer on those surfaces. To provide preferential wetting surfaces, for example, in the use of a PS-b-PMMA block copolymer, the material layer 32 can be composed of silicon (with native oxide), oxide (e.g., silicon oxide, $SiO_x$), silicon nitride, silicon oxycarbide, indium tin oxide (ITO), silicon oxynitride, and resist materials such as methacrylate-based resists, among other materials, which exhibit preferential wetting toward the PMMA block. In the use of a cylinder-phase copolymer material, the material will self-assemble to form a thin (e.g., ¼pitch) interface layer of PMMA and PMMA cylinders or half-cylinders (e.g., ½ pitch) in a PS matrix. In the use of a lamellar-phase block copolymer material, the material will assemble into alternating PMMA and PS lamellae (e.g., ½ pitch) within each trench, with PMMA at the sidewall interface (e.g., ¼pitch).

In other embodiments, a preferential wetting material such as a polymethylmethacrylate (PMMA) polymer modified with an —OH containing moiety (e.g., hydroxyethylmethacrylate) can be applied onto the surfaces of the trenches 34, for example, by spin coating and then heating (e.g., to about 170° C.) to allow the terminal OH groups to end-graft to oxide sidewalls 38 and ends 40 of the trenches 34. Non-grafted material can be removed by rinsing with an appropriate solvent (e.g., toluene). See, for example, Mansky et al., Science, 1997, 275, 1458-1460, and In et al., *Langmuir*, 2006, 22, 7855-7860.

The structuring of the trench floors 42 to be neutral wetting (equal affinity for both blocks of the copolymer) allows both blocks of the copolymer material to wet the floor of the trench. A neutral wetting material 30 can be provided by applying a neutral wetting polymer (e.g., a neutral wetting random copolymer) onto the base substrate 28, forming the material layer 32 and then etching the trenches to expose the underlying neutral wetting material, as illustrated in FIGS. 5-5B. A neutral wetting random copolymer can also be applied after forming the trenches, for example, as a blanket coat by casting or spin-coating into the trenches and thermally processing to flow the material into the bottom of the trenches by capillary action, which results in a layer (mat) composed of the crosslinked, neutral wetting random copolymer. In another embodiment, the random copolymer material within the trenches can be photo-exposed (e.g., through a mask or reticle) to crosslink the random copolymer within the trenches to form the neutral wetting material layer. Non-crosslinked random copolymer material outside the trenches (e.g., on the spacers 36) can be subsequently removed.

For example, in the use of a poly(styrene-block-methyl methacrylate) block copolymer (PS-b-PMMA), a thin film of a photo-crosslinkable random PS:PMMA copolymer (PS-r-PMMA) which exhibits non-preferential or neutral wetting toward PS and PMMA can be cast onto the base substrate 28 (e.g., by spin coating). The polymer material can be fixed in place by grafting (on an oxide substrate) or by thermally or photolytically crosslinking (any surface) to form a mat that is neutral wetting to PS and PMMA and insoluble due to the crosslinking.

In another embodiment, a neutral wetting random copolymer of polystyrene (PS), polymethacrylate (PMMA) with hydroxyl group(s) (e.g., 2-hydroxyethyl methacrylate (P(S-r-MMA-r-HEMA)) (e.g., about 58% PS) can be can be selectively grafted to a base substrate 28 (e.g., an oxide) as a layer 30 about 5-10 nm thick by heating at about 160° C. for about 48 hours. See, for example, In et al., *Langmuir*, 2006, 22, 7855-7860.

A surface that is neutral wetting to PS-b-PMMA can also be prepared by spin coating a blanket layer of a photo- or thermally crosslinkable random copolymer such as a benzocyclobutene- or azidomethylstyrene-functionalized random copolymer of styrene and methyl methacrylate (e.g., poly (styrene-r-benzocyclobutene-r-methyl methacrylate (PS-r-PMMA-r-BCB)). For example, such a random copolymer can comprise about 42% PMMA, about (58-x)% PS and x % (e.g., about 2-3%) of either polybenzocyclobutene or poly(para-azidomethylstyrene)). An azidomethylstyrene-functionalized random copolymer can be UV photo-crosslinked (e.g., 1-5 MW/cm^2 exposure for about 15 seconds to about 30 minutes) or thermally crosslinked (e.g., at about 170° C. for about 4 hours) to form a crosslinked polymer mat as a neutral wetting layer 30. A benzocyclobutene-functionalized random copolymer can be thermally crosslinked (e.g., at about 200° C. for about 4 hours or at about 250° C. for about 10 minutes).

In another embodiment in which the base substrate 28 is silicon (with native oxide), another neutral wetting surface for PS-b-PMMA can be provided by hydrogen-terminated silicon. For example, the floors 42 of trenches 34 can be etched, for example, with a hydrogen plasma, to remove the oxide material and form hydrogen-terminated silicon 30, which is neutral wetting with equal affinity for both blocks of a block copolymer material such as PS-b-PMMA. H-terminated silicon can be prepared by a conventional process, for example, by a fluoride ion etch of a silicon substrate (with native oxide present, about 12-15 Å) by exposure to an aqueous solution of hydrogen fluoride (HF) and buffered HF or ammonium fluoride ($NH_4F$), by HF vapor treatment, or by a hydrogen plasma treatment (e.g., atomic hydrogen). An H-terminated silicon substrate can be further processed by grafting a random copolymer such as PS-r-PMMA selectively onto the substrate resulting in a neutral wetting surface, for example, by an in situ free radical polymerization of styrene and methyl methacrylate using a di-olefinic linker such as divinylbenzene which links the polymer to the surface to produce an about 10-15 nm thick film.

In other embodiments, to induce formation of parallel half-cylinders in the trenches, the trenches are structured with a floor surface that is preferential wetting by one of the polymer blocks of a block copolymer. Annealing of a cylindrical-phase block copolymer material having an inherent pitch value of about $L_o$ will result in "n" rows or lines of half-cylinders (parallel to the sidewalls and trench floor) extending the length ($l_t$) and spanning the width ($w_t$) of the trenches.

Preferential wetting floors 42 can be provided by a silicon material with an overlying layer 30 of native oxide, or by forming a layer 30 of oxide (e.g., silicon oxide, $SiO_x$), silicon nitride, silicon oxycarbide, ITO, silicon oxynitride, resist material such as methacrylate-based resists, etc., over the base substrate 28.

Figure 7:
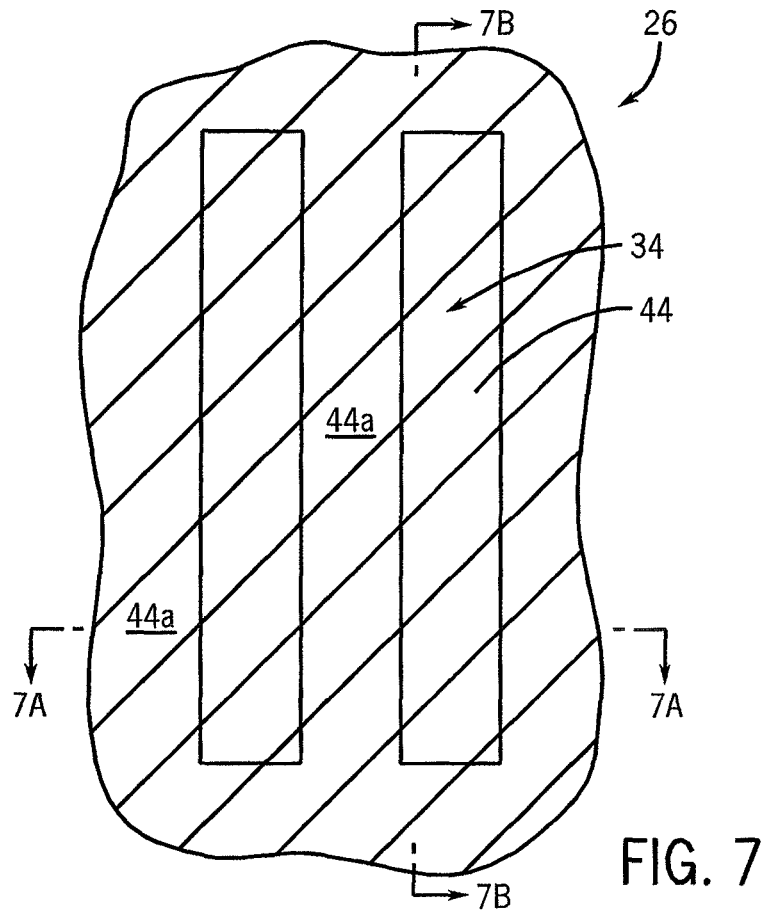
FIGS. 7 and 8 illustrate diagrammatic top plan views of the stamp of FIG. 5 at various stages of the fabrication of a self-assembled block copolymer film according to an embodiment of the present disclosure.
Figure 7A:
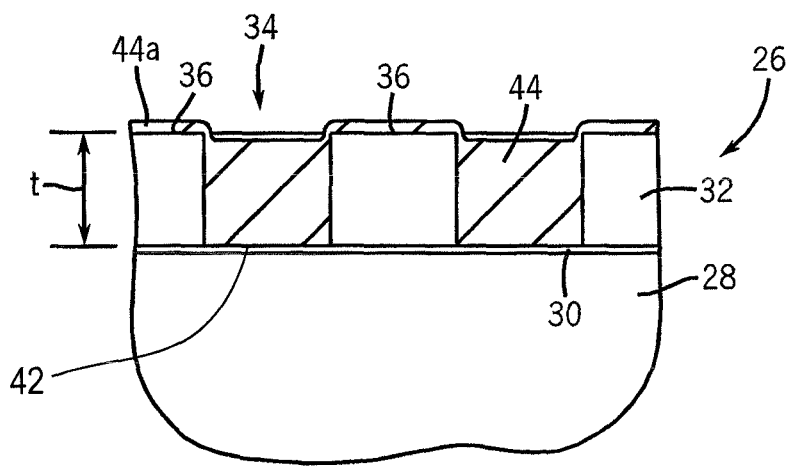
Figure 7B:
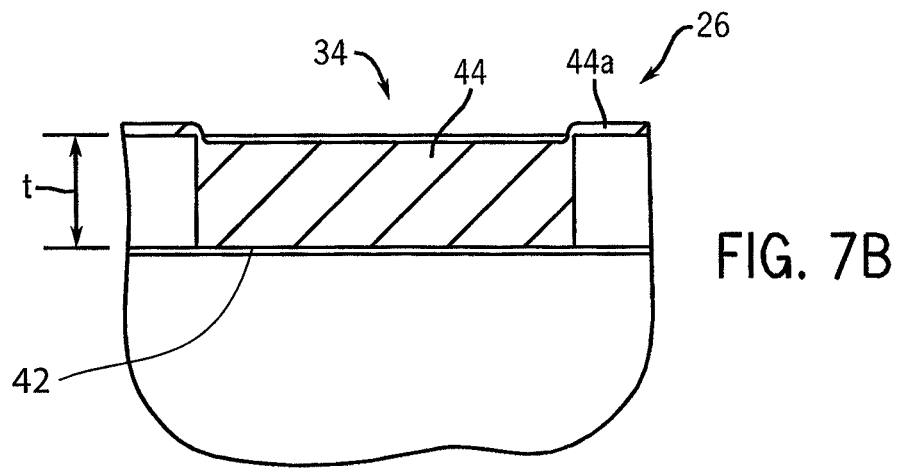
FIG. 7B is a cross-sectional view of the substrate depicted in FIG. 7 taken along lines 7B-7B.

Referring now to FIGS. 7-7B, a film of a self-assembling block copolymer material 44 having an inherent pitch at or about $L_o$ (or a ternary blend of block copolymer and homopolymers blended to have a pitch at or about $L_o$) is then deposited into the trenches 34 and onto the trench floors 42, and processed such that the copolymer material 44 will then self-assemble. The block copolymer material 44 can be deposited by spin casting or spin-coating from a dilute solution (e.g., about 0.25-2 wt % solution) of the copolymer in an organic solvent such as dichloroethane ($CH_2Cl_2$) or toluene, for example.

Capillary forces pull excess of the block copolymer material 44 (e.g., greater than a monolayer) into the trenches 34. In a trench having a depth ($D_t$) at or about the $L_o$ value of the copolymer material 44, the block copolymer is deposited to fill the trench 34 such that the film thickness ($t_f$) of the deposited block copolymer 44 is generally at or about $L_o$ and the film will self-assemble to form a single layer of elements (e.g., cylinders, lamellae, etc.) across the width ($w_t$) of the trench, the elements having a diameter/width at or about 0.5 $L_o$ (e.g., about 20 nm). For example, a typical thickness ($t_f$) of a lamellar-phase PS-b-PMMA block copolymer film 44 is about ±20% of the $L_o$ value of the copolymer (e.g., about 10-100 nm) to form alternating polymer-rich lamellar blocks having a width of about 0.5 $L_o$ (e.g., 5-50 nm) within each trench. In the use of a solvent anneal, the film can be much thicker than $L_o$, e.g., up to about +1000% of the $L_o$ value. The thickness of the block copolymer material 44 can be measured, for example, by ellipsometry techniques. As shown, a thin film 44a of the block copolymer material 44 can be deposited onto the spacers 36 of the material layer 32; this film will form a monolayer of elements with no apparent structure from a top-down perspective (e.g., lamellae in a parallel orientation).

The block copolymer material is fabricated such that each of the self-assembled polymer domains has a different solubility for a given ink chemical. The ink chemical is applied as an organic solution, either neat (undissolved) or combined with a solvent that will be selectively absorbed into and cause one of the polymer domains to swell and become impregnated with the ink chemical material. In some embodiments, the ink but not the solvent will be selectively absorbed into one of the polymer domains.

In some embodiments, the block copolymer can be chemically modified to include a functional group having chemical affinity for the ink material, for example, a thiol or amine group. For example, one of the blocks can inherently contain a thiol or amine functional group, for example, polyvinylpyridine.

The film morphology, including the domain sizes and periods ($L_o$) of the microphase-separated domains, can be controlled by chain length of a block copolymer (molecular weight, MW) and volume fraction of the AB blocks of a diblock copolymer to produce lamellar, cylindrical, or spherical morphologies, among others.

For example, for volume fractions at ratios greater than about 80:20 of the two blocks (AB) of a diblock polymer, a block copolymer film will microphase separate and self-assemble into periodic spherical domains with spheres of polymer B surrounded by a matrix of polymer A. For ratios of the two blocks generally between about 60:40 and 80:20, the diblock copolymer assembles into periodic cylindrical domains of polymer B within a matrix of polymer A. For ratios between about 50:50 and 60:40, lamellar domains or alternating stripes of the blocks are formed. Domain size typically ranges from 5-50 nm.

An example of a lamellae-forming PS-b-PMMA diblock copolymer ($L_o$=32 nm) to form about 16 nm wide lamellae is composed of a weight ratio of about 50:50 (PS:PMMA) and total molecular weight ($M_n$) of about 51 kg/mol. An example of a cylinder-forming PS-b-PMMA copolymer material ($L_o$=35 nm) to form about 20 nm diameter cylindrical PMMA domains in a matrix of PS is composed of about 70% PS and 30% PMMA with a total molecular weight ($M_n$) of 67 kg/mol.

Although PS-b-PMMA diblock copolymers are used in the illustrative embodiments, other types of block copolymers (i.e., triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyethyleneoxide-polystyrene, polyetheleneoxide-polymethylmethacrylate, polystyrene-polyvinylpyridine, polystyrene-block-polyisoprene (PS-b-PI), polystyrene-polybutadiene, polybutadiene-polyvinylpyridine, polyisoprene-polymethylmethacrylate, and polystyrene-polylactide, among others. Examples of triblock copolymers include poly(styrene-block methyl methacrylate-block-ethylene oxide).

The block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0% to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer.

The block copolymer film 44 is then annealed to cause the polymer blocks to phase separate and self-assemble according to the preferential and neutral wetting of the trench surfaces to form a self-assembled polymer film. The resulting morphology of the annealed film 46 (e.g., perpendicular orientation of lamellae) can be examined, for example, using atomic force microscopy (AFM), transmission electron microscopy (TEM), scanning electron microscopy (SEM).

In some embodiments, the deposited block copolymer film 44 can be solvent annealed. In embodiments of a solvent anneal, the film 44 can be swollen by exposure to a vapor of a "good" solvent for both blocks, and the vapor can then be removed. Vapors of a solvent such as benzene, chloroform or a chloroform/octane mixture, for example, can be exposed to the film 44 to slowly swell both blocks (PS, PMMA) of the film 44. The solvent and solvent vapors are then allowed to slowly evaporate to dry the film 44, resulting in self-assembled polymer domains.

The block copolymer film 44 can also be thermally annealed at the annealing temperature (e.g., about 150° C.-250° C.) in an atmosphere that is saturated or nearly saturated (but not supersaturated) with a solvent in which both blocks are soluble. The solvent-saturated vapor maintains a neutral air interface in conjunction with the surface interface with a neutral wetting floor 42. The existence of both neutral wetting air and surface interfaces induces the formation of perpendicular features throughout the film 44.

Figure 8:
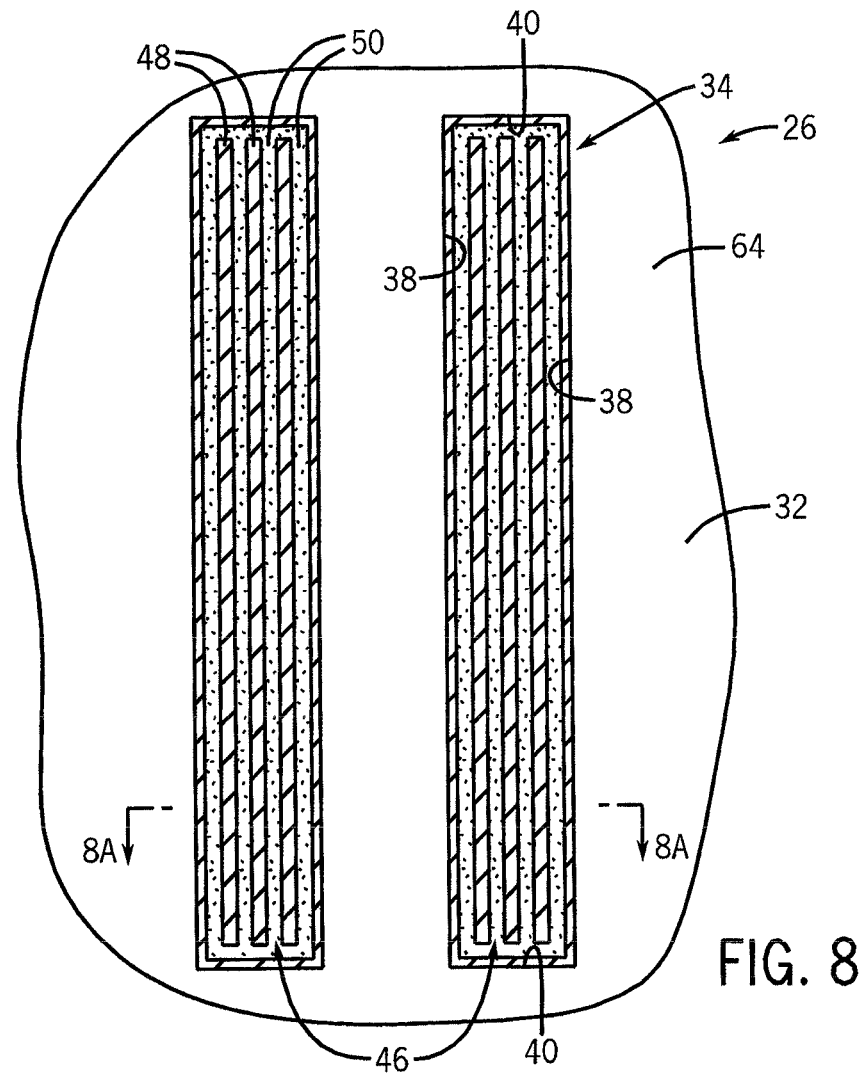
Figure 8A:
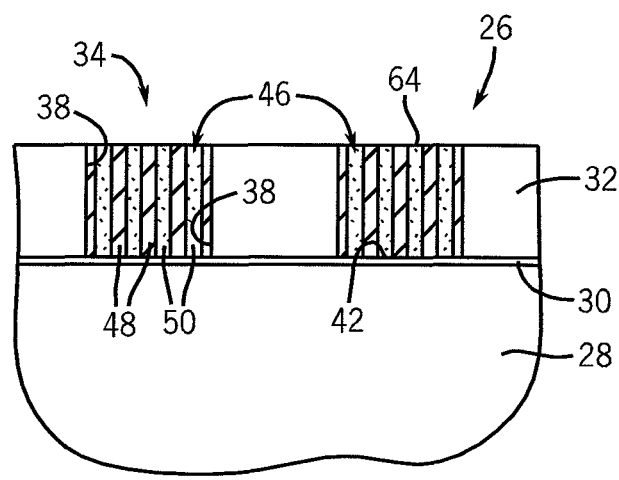

Referring to FIGS. 8-8A, upon annealing a lamellar-phase block copolymer film 44 (e.g., PS-b-PMMA of about $L_o$) within a trench 34 with preferential wetting sidewalls 38 and a neutral wetting trench floor 42 (exhibits neutral or non-preferential wetting toward both blocks, e.g., a random graft copolymer), the polymer material will self-assemble into a film 46 composed of alternating polymer-rich blocks 48, 50 (e.g., PS and PMMA). The lamellar blocks 48, 50 are oriented perpendicular to the trench floor 42 and parallel to the sidewalls 38, extending the length of the trench 34 and spanning the width ($w_t$) at an average pitch value at or about $L_o$. The constraints provided by the width ($w_t$) of the trenches 34 and the character of the copolymer composition combined with preferential or neutral wetting surfaces within the trenches result, upon annealing, in a single layer of n lamellae 48, 50 across the width ($w_t$) of the trench. The number "n" or pitches of lamellar blocks within a trench is according to the width ($w_t$) of the trench and the molecular weight (MW) of the block copolymer. For example, depositing and annealing an about 50:50 PS:PMMA block copolymer film (e.g., $M_n$=51 kg/mol; $L_o$=32 nm) in an about 160 nm wide trench will subdivide the trench into about 5 lamellar pitches. The stamping surface of a stamp 26 is thus defined by a lamellar array of polymer domains that define a linear pattern of lamellar blocks, each about 14-18 nm wide and several microns in length (e.g., about 10-4000 μm), and a center-to-center pitch of about 32 nm. A smaller pitch can be dialed in by using lower molecular weight diblock copolymers.

In embodiments in which a film of a cylindrical-phase block copolymer is deposited into trenches with preferential wetting sidewalls and a neutral wetting trench floor, upon annealing, the cylinder-phase copolymer film will self-assemble into a film composed of perpendicular-oriented cylinders of one of the polymer blocks (e.g., PMMA) within a polymer matrix of the other polymer block (e.g., PS) registered to the sidewalls of the trench.

Figure 9:
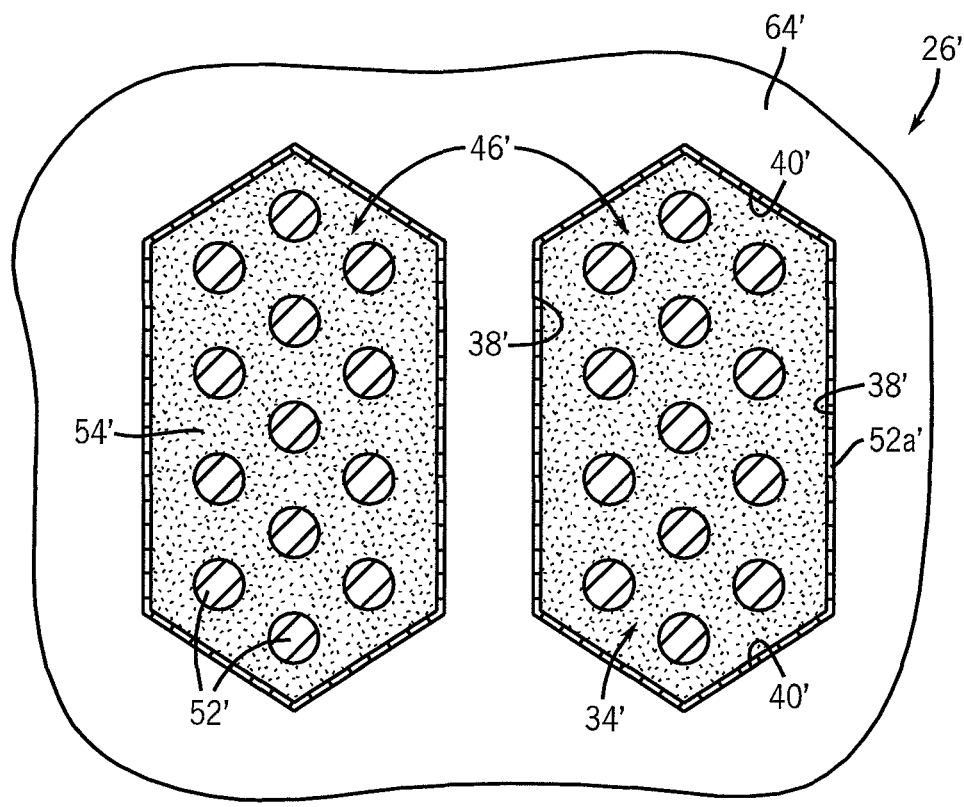
FIG. 9 is a top plan view of the stamp of FIG. 6 at a subsequent stage of fabrication showing a self-assembled polymer film composed of a hexagonal array of cylinders within the trenches.

FIG. 9 illustrates an embodiment of a stamp 26' composed of an annealed cylinder-phase copolymer film 46' in the formation of an array of hexagonal close-packed array of perpendicularly oriented cylinders 52' within a polymer matrix 54'. The sidewalls 38' and angled ends 40' of the trenches 34' are used as constraints to induce orientation and registration of cylindrical copolymer domains to achieve the hexagonal cylindrical array registered to the trench sidewalls. The width ($w_t$) of the trenches 34' is at or about $L_o*\cos(\pi/6)$ or $L_o*0.866$, which defines the number of rows of cylinders, and the trench length ($l_t$) is at or about $mL_o$, which defines the number of cylinders per row. The ends 40' of the trenches are angled to the sidewalls 38', for example, at an about 60° angle, and in some embodiments can be slightly rounded. A cylindrical-phase diblock copolymer material having an inherent pitch at or about $L_o$ (or blend with homopolymers) and a thickness (t) of about $L_o$ will self-assemble upon annealing to form a hexagonal array of cylindrical domains 52' of the minor (preferred) polymer block (i.e., like domains such as PMMA) that are oriented perpendicular to the neutral wetting floor 42' of the trench 34' within a matrix 54' of the major polymer block (e.g., PS). The minor (preferred) polymer block (e.g., PMMA) will segregate to the preferential wetting sidewalls 38' and ends 40' to form a wetting layer 52a'. The hexagonal array contains n single rows of cylinders according to the width ($w_t$) of the trench with the cylinders 52' in each row being offset from the cylinders in the adjacent rows. Each row contains a number of cylinders, generally m cylinders, which number can vary according to the length ($l_t$) of the trench and the shape of the trench end (e.g., rounded, angled, etc.) with some rows having greater or less than m cylinders. The cylinders 52' are generally spaced apart at a pitch distance ($p_1$) at or about $L_o$ between each cylinder in the same row and an adjacent row (center-to-center distance), and at a pitch distance ($p_2$) at or about $L_o * \cos(\pi/6)$ or $0.866 L_o$ being the distance between two parallel lines where one line bisects the cylinders in a given row and the other line bisects the cylinders in an adjacent row. The stamping surface 64' of the stamp 26' is thus defined by an array of polymer domains that define a hexagonal or honeycomb pattern of perpendicular-oriented cylinders 52', each about 20-22 nm in diameter with a center-to-center pitch of about 42 nm.

Figure 10:
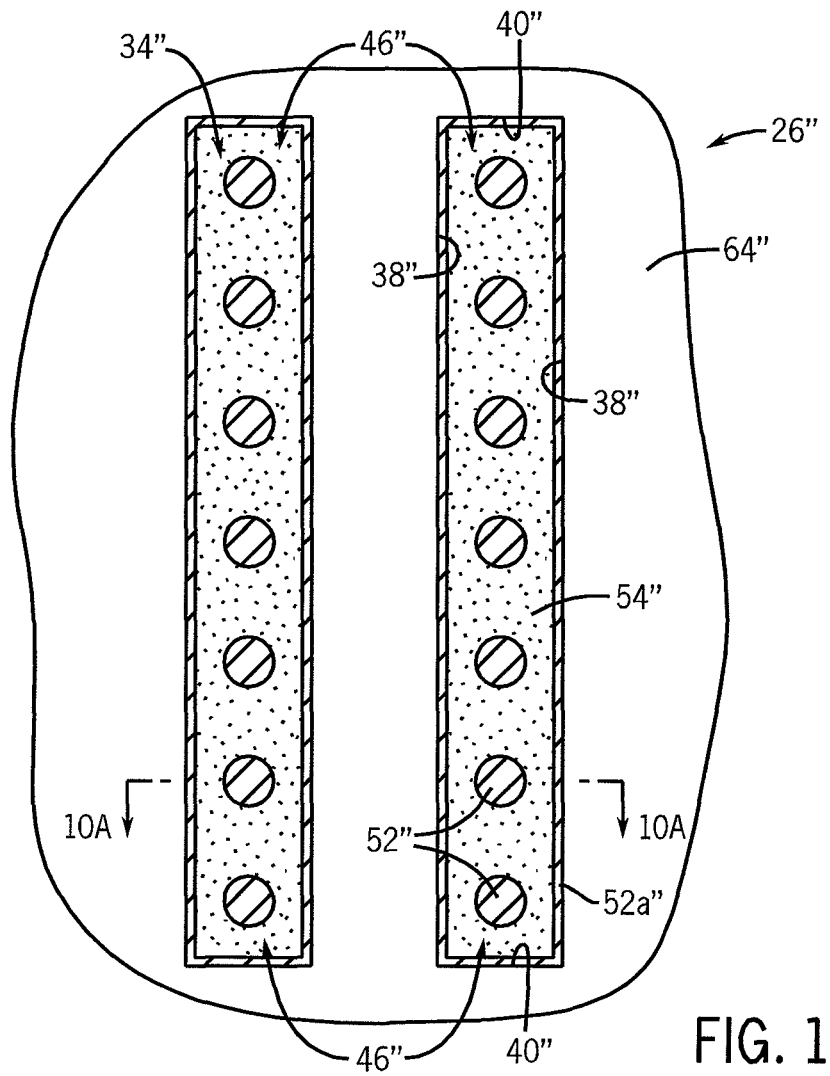
FIG. 10 is a top plan view of the stamp of FIG. 5 at a subsequent stage of fabrication according to another embodiment of the invention, showing a self-assembled polymer film composed of a single row of cylinders with the trenches.
Figure 10A:
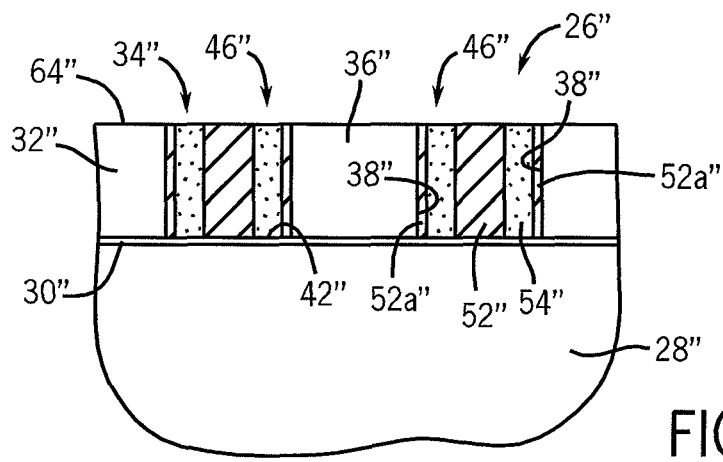
FIG. 10A is a cross-sectional view of the substrate depicted in FIG. 10 taken along lines 10A-10A.

In another embodiment using a cylindrical-phase copolymer material, the trench dimensions can be modified to use the trench sidewalls and ends as constraints to induce orientation and registration of cylindrical copolymer domains in a single row parallel to the trench sidewalls. The trenches are structured to have a width ($w_t$) that is at or about 1.0-1.75* the $L_o$ value of the block copolymer material, a neutral wetting floor, and sidewalls and ends that are preferential wetting by the minority (preferred) block (e.g., the PMMA block) of the diblock copolymer (e.g., PS-b-PMMA). A cylindrical-phase diblock copolymer (or blend with homopolymers) having an inherent pitch at or about $L_o$ can be deposited into the trenches to a thickness ($t_t$) of about the $L_o$ value of the copolymer material (as in FIGS. 7 and 7A). As illustrated in FIGS. 10 and 10A, the annealed block copolymer film self-assembles to form film 46". The constraints provided by the width ($w_t$) of trench 34" and the character of the block copolymer composition combined with a neutral wetting trench floor 42" and preferential wetting sidewalls 38" results in a one-dimensional (1D) array or single row of perpendicularly oriented cylindrical domains 52" of the minority (preferred) polymer block (e.g., PMMA) within a matrix 54" of the major polymer block (e.g., PS), with the preferred block segregating to the sidewalls 38" of the trench 34" to form a wetting layer 52a". In some embodiments, the cylinders have a diameter at or about $0.5 L_o$ (e.g., about 20 nm), the number n of cylinders in the row is according to the length of the trench, and the center-to-center distance (pitch distance) (p) between each like domain (cylinder) is at or about $L_o$ (e.g., about 40 nm). The resulting stamping surface 64" of the stamp 26" is defined by an array of polymer domains that define a single row of perpendicular-oriented cylinders 52", each about 20-22 nm in diameter with a center-to-center pitch of about 42 nm.

Figure 11:
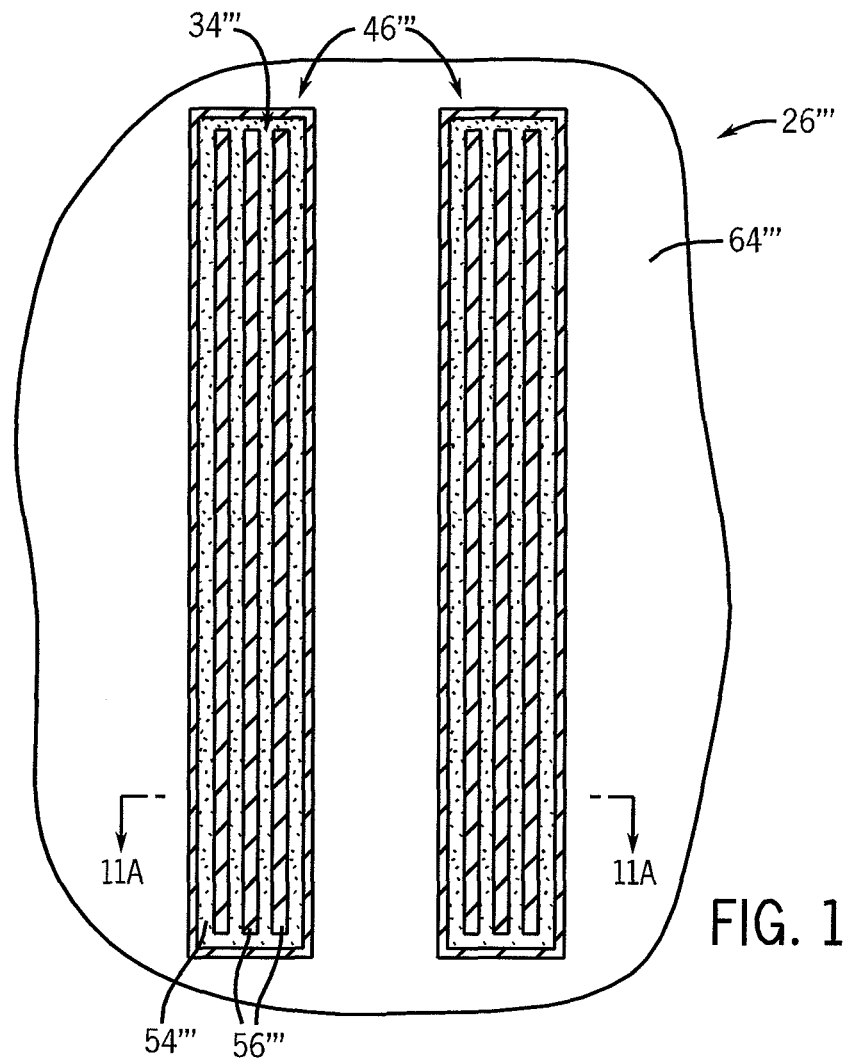
FIG. 11 is a top plan view of the stamp of FIG. 5 at a subsequent stage of fabrication according to another embodiment of the invention, showing a self-assembled polymer film composed of a parallel row of half-cylinders with the trenches.
Figure 11A:
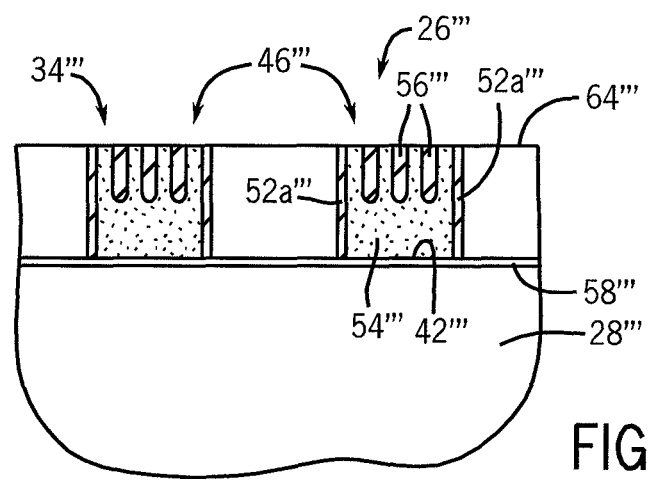
FIG. 11A is a cross-sectional view of the substrate depicted in FIG. 10 taken along lines 11A-11A.

Referring now to FIGS. 11 and 11A, in yet another embodiment using a cylindrical-phase copolymer material, the trenches 34''' can be structured with preferential wetting surfaces 38, 40, 42 to induce formation of half-cylinder copolymer domains 56''' in a polymer matrix 54''' that are in a parallel orientation to the trench floors 42''' and registered to the sidewalls 38'''. A preferentially wetting floor 42''' can be provided, for example, by a layer 58''' of oxide, silicon nitride, silicon oxycarbide, among others. The stamping surface 64''' of the stamp 26''' is defined by an array of polymer domains that define lines of half-cylinders, each about 20-22 nm wide and several microns in length (e.g., about 10-4000 µm), and a center-to-center pitch of about 42 nm.

Figure 12:
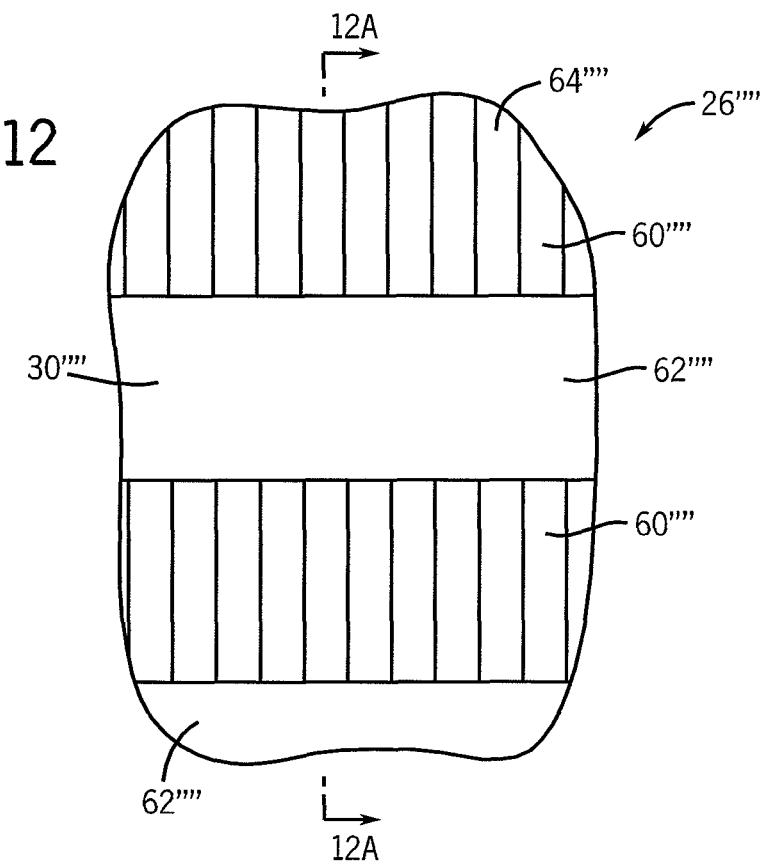
FIG. 12 illustrates a diagrammatic top plan view of a portion of a stamp at a preliminary processing stage according to another embodiment of the disclosure, showing a chemically differentiated stamping surface.
Figure 12A:
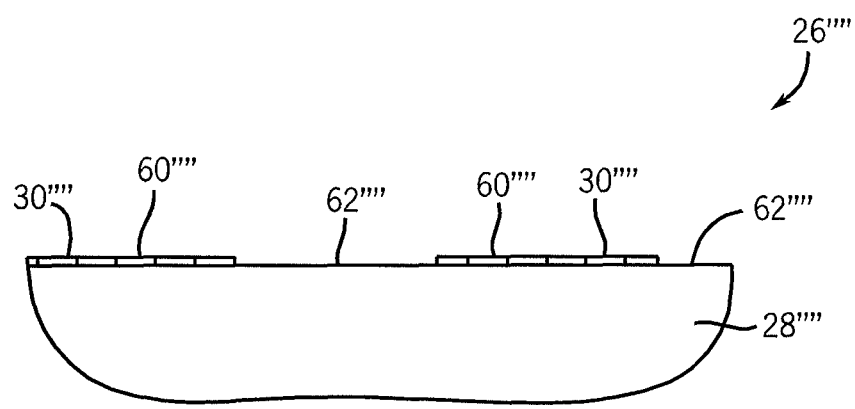
FIG. 12A is an elevational, cross-sectional view of the substrate depicted in FIG. 12 taken along lines 12A-12A.

In another embodiment of the invention, graphoepitaxy (topographic features, e.g., sidewalls, ends, etc.) is used to influence the formation of arrays in one dimension, and the trench floors provide a wetting pattern that can be used to chemically control formation of the arrays in a second dimension. For example, as illustrated in FIGS. 12 and 12A, a neutral wetting material 30'''' (e.g., random copolymer) can be formed on the base substrate 28'''' and crosslinked in select regions 60'''', such as by photo-exposure through a reticle or a patterned mask (e.g., photoresist). As shown, the non-crosslinked regions of the neutral wetting material 30'''' have been removed (e.g., by wet processing using a solvent) to expose the sections 62'''' of the underlying base substrate 28'''', resulting in a pattern of discrete regions 60'''' of the crosslinked neutral-wetting material 30'''' (random copolymer) and sections 62'''' of the exposed preferential-wetting base substrate 28''''.

As depicted in FIGS. 13-13B, the material layer 32'''' can then be formed and trenches 34'''' etched to expose the sections 60'''' of the neutral wetting material 30'''' and sections 62'''' of the exposed base substrate 10'''' on the trench floors 18'''' as a series of stripes oriented perpendicular to the trench sidewalls 38''''. The trench floors 42'''' are thus defined by alternating preferential wetting sections 62'''' (base substrate 28'''') and neutral wetting sections 60''' (a mat of the crosslinked random copolymer 30'''). In some embodiments, each of the sections can have a width ($w_{r1}$) at or about $L_o$, and in other embodiments, the neutral wetting sections 60'''' can have a width ($w_{r2}$) at or about $nL_o$ and the preferential wetting sections 62'''' have a width at or about $L_o$. The trench sidewalls 38'''' and ends 40'''' (e.g., of oxide) are preferential wetting to the minority (preferred) block of the block copolymer.

A cylindrical-phase block copolymer film (e.g., pitch $L_o$) can then be cast or spin-coated into the trenches 34'''' to a film thickness (t) of about $L_o$ and annealed. As illustrated in FIGS. 14-14B, the differing wetting patterns on the trench floor 42'''' imposes ordering on the cylindrical-phase block copolymer film as it is annealed, resulting in a 1D array of alternating perpendicular-oriented cylinders 52'''' and parallel-oriented half-cylinders 56'''' for the length ($nL_o$) of each trench.

After the copolymer film is annealed and ordered, the film can then be treated to crosslink the polymer segments (e.g., the PS segments) to fix and enhance the strength of the self-assembled polymer blocks. The polymers can be structured to inherently crosslink (e.g., upon exposure to ultraviolet (UV) radiation, including deep ultraviolet (DUV) radiation), or one or both of the polymer blocks of the copolymer material can be formulated to contain a crosslinking agent.

Optionally, the unstructured thin film 44a of the block copolymer material outside the trenches (e.g., lamellae in a parallel orientation on spacer 36 in FIG. 7A) can then be removed, as illustrated in FIGS. 8 and 8A. In embodiments in which the ink chemical would be absorbed by the film 44a, the film would be removed.

For example, the trench regions can be selectively exposed through a reticle (not shown) to crosslink only the annealed and self-assembled film 46 within the trenches 34, and a wash can then be applied with an appropriate solvent (e.g., toluene) to remove the non-crosslinked portions of the block copolymer material 44a on the spacers 36, leaving the registered self-assembled film within the trench and exposing the surface of material layer 32 on the spacers 36 above/outside the trenches. In another embodiment, the annealed film 46 can be crosslinked globally, a photoresist material can be applied to pattern and expose the areas of the film 44a over the spacers 36 outside the trench regions, and the exposed portions of the copolymer film can be removed, for example, by an oxygen ($O_2$) plasma treatment.

The resulting stamp is structured with a stamping surface 64 composed of an ordered array of polymer domains (e.g., 48, 50) in the desired pattern for stamping onto a receptor substrate. The stamp can then be inked and brought into contact with the receptor substrate to produce the pattern on the substrate.

The ink chemical material is selected such that it will be absorbed selectively into a polymer domain of the self-assembled polymer film by Van der Waals forces or other non-covalent force or bond (e.g., hydrogen bond, etc.) and will form a self-assembled monolayer (SAM) on the receptor substrate. The ink chemical can include one or more functional groups that chemically react with the receptor substrate. The chemical affinity between the ink material and the receptor substrate is greater than the chemical affinity between the ink material and the polymer domain in which it is absorbed.

In embodiments of the invention, the ink chemical can have amino, thiol, alcohol or alkyne functional groups. Examples of ink chemicals include thiols such as 2-aminoethanethiol, aminothiophenol, cysteine, homocysteine, leucinethiol, 2-butylaminoethanethiol, 2-cylcohexylaminoethanethiol, etc.; mercaptoalcohols such as mercaptoethanols (e.g., 2-mercaptoethanol ($HS-CH_2CH_2OH$)), mercaptopropanols (e.g., 2-mercaptopropanol) and mercaptobutanols (e.g., 4-mercapto-1-butanol, 2-mercaptobutanol); and acetylenics with hydrocarbon tails or other functional groups such as alcohols, thiols, amines, halides, etc., (e.g., carboxylates such as propiolic acid, 4-butynoic acid, 5-pentynoic acid), and the like.

The ink chemical material is in the form of an organic solution such that it will diffuse into and be selectively absorbed by one of the polymer domains causing the polymer domain to swell. The ink chemical material can be in the form of a neat (undiluted) solution or combined with an organic solvent that will promote diffusion of the material selectively into the selected polymer domain. Examples of solvents that can be utilized include methanol, ethanol, isopropanol, ethylene glycol, propylene glycol and acetic acid. Typically, the concentration of the ink chemical material in solution is about 1-10 k mM.

In another embodiment, the ink chemical material can be provided in a vaporous form, which can provide a higher level of control with respect to the amount of ink material that is absorbed into the stamp. The stamp would be exposed to a vapor of the ink chemical for a sufficient time period for absorption of an adequate quantity of the ink chemical by the polymer domain.

FIGS. 15-18 illustrate an embodiment of a stamping process utilizing a stamp 26 according to the invention, as depicted in FIGS. 8 and 8A.

Figure 15:
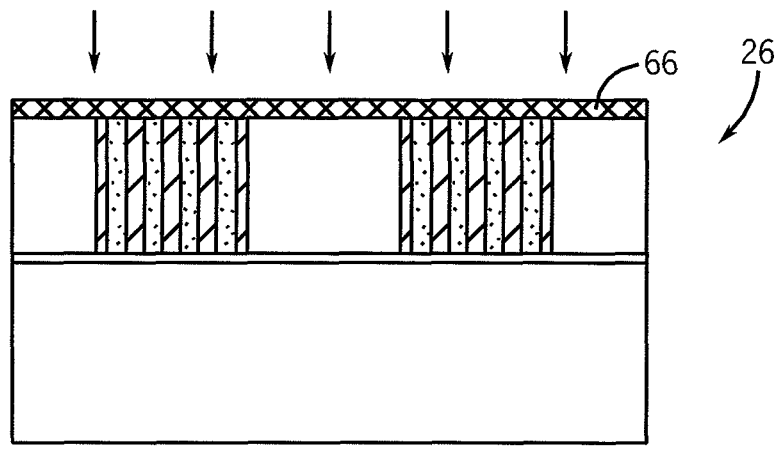
FIGS. 15-18 illustrate subsequent steps in the use of the stamp of FIGS. 8 and 8A in a contact printing process to form a pattern on a substrate according to an embodiment of the invention.

Referring to FIG. 15, a stamping process can be conducted by applying (arrows ↓) a solution of the ink chemical material (either neat or in a solvent) 66 onto the stamping surface 64 or, in other embodiments, by exposing the stamping surface 64 to a vapor of the ink chemical. The contact of the ink chemical solution with the stamping surface 64 of the stamp is for a time effective to enable the ink material to diffuse into and be selectively absorbed by the targeted polymer domain.

Figure 16:
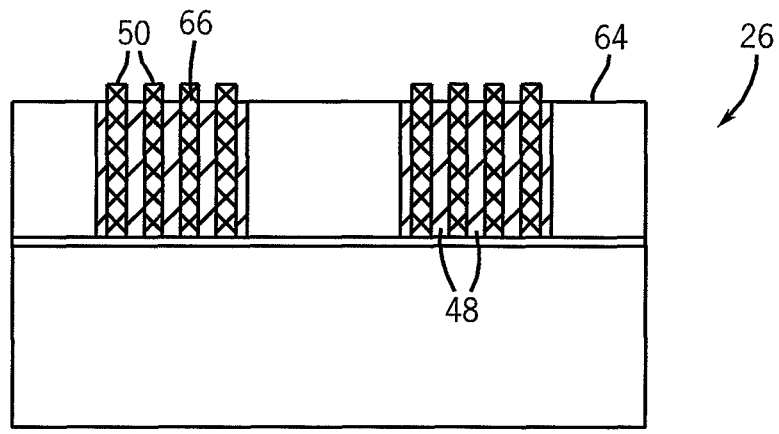

Upon contact of the stamp with the ink chemical, the polymer domain 50 with affinity for the ink chemical solution (e.g., PS domain) is swelled by absorption of the ink chemical solution, as illustrated in FIG. 16. The other polymer domain 48 with substantially no affinity for the ink chemical (e.g., PMMA domain) remains unchanged. This results in the stamping surface 64 of the stamp 26 having a relatively corrugated surface that defines the lines of the swollen polymer domains 50.

Figure 17:
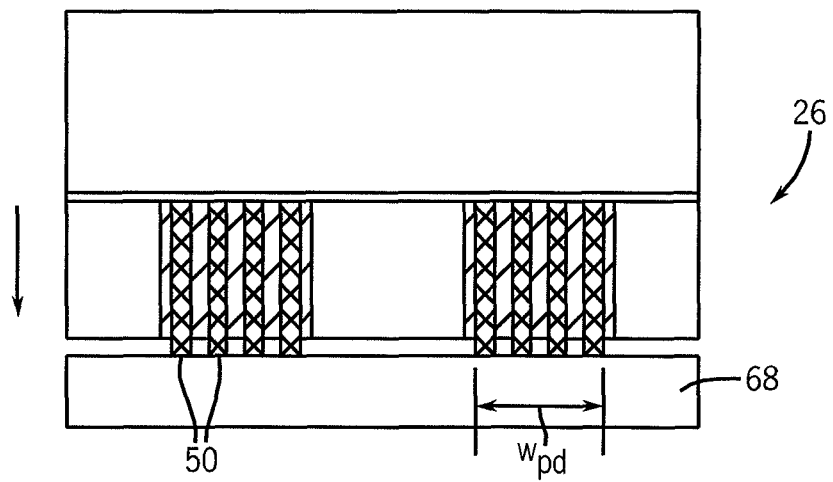
Figure 18:
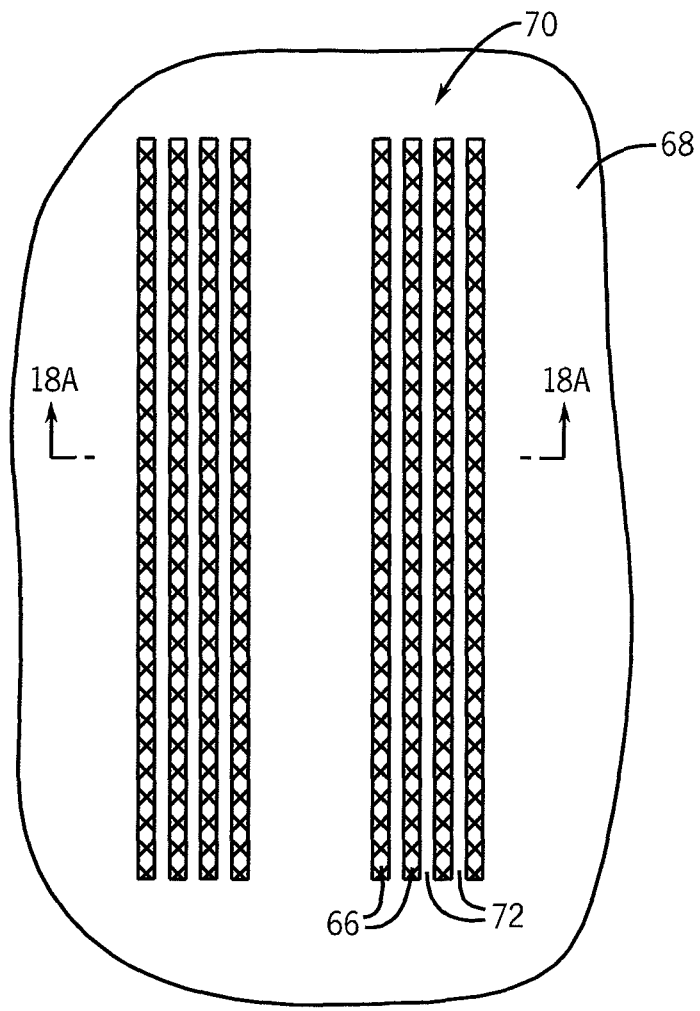
Figure 18A:
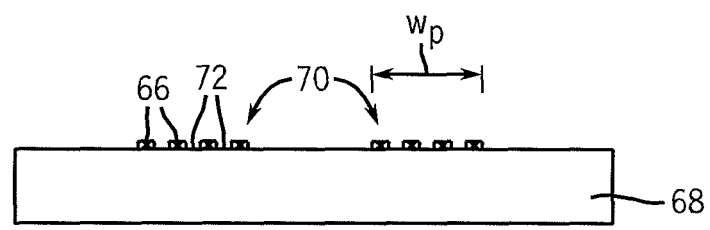
FIG. 18A is a cross-sectional view of the substrate shown in FIG. 18, taken along lines 18A-18A.

As illustrated in FIG. 17, a receptor substrate 68 is then brought into contact (arrows ↓) with the swollen and ink-containing polymer domains 50 situated on the stamping surface 64 of the stamp 26 to effect transfer of the ink material 66 onto the receptor substrate 68, resulting in a pattern 70 on the receptor substrate, as shown in FIGS. 18 and 18A. The ink chemical material 66 is transferred from the stamp 26 by chemical bonding of one or more functional groups of the ink material with a functional group(s) on the surface of the receptor substrate 68.

Examples of the receptor substrate 68 include silicon oxide, silicon wafers, silicon-on-insulator ("SOI") substrates, silicon-on-sapphire ("SOS") substrates, and other semiconductor substrates such as silicon-germanium, germanium, gallium arsenide and indium phosphide, chalcogenide-class of materials, magnetic materials (e.g., Ni, Fe, Co, Cu, Ir, Mn, Pt, Tu, etc.), and other substrates used in disk drives or optical storage devices. Optionally, the receptor substrate 68 can be modified to incorporate functional groups that enhance chemical bonding and transfer of the ink material from the stamp/template (e.g., stamp 26), as indicated in Table 1 (below). Substrates modified with a glycidoxy functionality will be reactive to inks having amine or thiol functional groups. Substrates modified with an isocyanate functionality will be reactive to inks having alcohol or amino functional groups. Substrates modified with chlorosilyl groups will be reactive to inks with amino, alcohol or thiol functional groups. Alkylazido-modified substrates will be reactive to inks with alkyne functional groups. For example, a silicon oxide substrate can be modified with azide groups to facilitate binding of an acetylenic carboxylate ink.

Table 1 (below) provides examples of ink chemical materials that can be used for selective absorption by one of the polymer block domains (i.e., PMMA) of a stamp according to the invention, and embodiments of receptor substrate modifications that can be used in combination with the ink chemical material to effect transfer of the ink onto the receptor substrate to form SAMs in a stamped pattern.

| Ink Material | Receptor Substrate modification |
|---|---|
| Thiols, such as:<br>2-aminoethanethiol<br>aminothiophenol<br>cysteine | Glycidoxy-modified substrates such as $SiO_2$ grafted with a glycidoxypropyl(trialkoxy) silane (e.g., glycidoxypropyl trimethoxysilane) |

-continued

| Ink Material | Receptor Substrate modification |
| --- | --- |
| homocysteine<br>leucinethiol<br>2-butylaminoethanethiol<br>2-cylcohexylaminoethanethiol | Isocyanato-modified substrates such as SiO$_2$ grafted with a isocyanatopropyl(trialkoxy) silane (e.g., isocyanatopropyl triethoxysilane, isocyanatopropyl trimethoxysilane, etc.) Chlorosilyl-modified substrates such as chlorine-terminated silicon (Si—Cl) (e.g., from H-terminated silicon exposed to Cl$_2$ gas) |
| Mercaptoalcohols, such as:<br>mercaptoethanols<br>mercaptopropanols<br>mercaptobutanols | Isocyanato-modified substrates such as SiO$_2$ grafted with a isocyanatopropyl(trialkoxy) silane (e.g., isocyanatopropyl triethoxysilane, isocyanatopropyl trimethoxysilane, etc.) Chlorosilyl-modified substrates such as chlorine-terminated silicon (Si—Cl) |
| Acetylenics with hydrocarbon tails or other functional groups such as alcohols, thiols, amines, halides, etc., such as:<br>propiolic acid (or acetylene monocarboxylic acid)<br>butynoic acid<br>pentynoic acid | Alkylazido-modified substrates such as SiO$_2$ grafted with 6-azidosulfonylhexyl (triethoxy)silane, or with an 11-azidoundecyl group (e.g., formed from 11-bromoundecyl(triethyoxy)silane reacted with sodium azide). |

An alkylazido-modified receptor substrate 68 can be prepared, for example, as a silicon dioxide (SiO$_2$) substrate grafted with 6-azidosulfonylhexyl(triethoxy)silane or with an 11-azidoundecyl group monolayers that can be formed by grafting 11-bromoundecyl(triethyoxy)silane to a SiO$_2$ substrate then derivatizing with sodium azide, as described, for example, by Rozkiewicz et al., *Angew. Chem. Int. Ed. Eng.*, 2006, 45, 5292-5296. A chlorosilyl-modified receptor substrate 68 can be prepared, for example, as chlorine-terminated silicon (Si—Cl) by chlorination of hydrogen-terminated silicon surfaces by exposure to chlorine gas (Cl$_2$) (e.g., at 80° C. or exposure to a tungsten lamp), as described, for example, by Zhu et al., *Langmuir*, 2006, 16, 6766-6772.

The temperature during the stamping process generally ranges from about room temperature (20° C.) to near the boiling point of the ink chemical solution. Contact of the stamp 26 with the receptor substrate 68 is for a time effective to enable chemical bonds to form between functional groups on the receptor substrate and the ink chemical material 66, generally about 1 minute to about 4 hours, and typically about 1-15 minutes.

The receptor substrate and the ink material may react to form a urea or urethane linkage through a mercapto alcohol, a disulfide linkage through a thiol (R-SH) functional group, a bond involving acid/base groups, or an amine linkage through an amine/epoxide reaction of a triazole image through reaction between an azide and alkyne. Diffusion (or other transfer mechanism) of the ink material from the polymer domains of the stamp onto the receptor substrate (where the ink reacts) can create a concentration gradient, which then draws additional ink onto the surface of the receptor substrate from the inked polymer domains.

Upon completion of the ink transfer to the receptor substrate, the stamp is then removed leaving the ink chemical material 66 as a pattern 70 on portions of the receptor substrate 68 corresponding to the inked polymer domains 50 on the stamping surface 64 of the stamp 26 and exposed portions 72 of the substrate, as shown in FIGS. 18 and 18A. In some embodiments, the ink chemical material is processed to form a self-assembled monolayer (SAM) on the surface of the receptor substrate 68. The stamp 26 may then be re-inked, if needed, for further stamping of the same or another receptor substrate.

The ink pattern 70 on the receptor substrate 68 has identical or substantially identical resolution to the pattern of the inked polymer domains on the stamping surface 64 of the stamp 26. The patterned stamp 26 can be used to produce features (pattern 70) on the receptor substrate that are sub-lithographic, for example, a thickness of about 1-10 angstroms, and lateral width ($w_p$) that corresponds to the dimension (width ($w_{pd}$)) of the pattern of the "inked" polymer domains on the stamping surface 64 of the stamp 26 (FIG. 17).

In the embodiment illustrated in FIGS. 18 and 18A, the ink (e.g., SAM) pattern 70 formed using the stamp 26 having a stamping surface 64 composed of a lamellar array of polymer domains defines a linear pattern of fine, parallel lines of nanometer-scale to sublithographic dimensions about 5-50 nm wide and several microns in length (e.g., about 10-4000 μm), and a center-to-center pitch of about 10-100 nm. Stamp 26''' (FIGS. 11 and 11A), for example, also provides a stamping surface having parallel lines of polymer domains. In other embodiments, the stamp can have a stamping surface composed of a cylindrical array of polymer domains as described, for example, with respect to stamps 26' and 26'' (FIGS. 9-10A).

After applying the ink pattern on the receptor substrate, further processing may be conducted as desired.

For example, the inked pattern 70 of the stamped regions or elements 66 shown in FIG. 18A, can be used to guide the formation of etch masks to pattern portions of the underlying receptor substrate 68.

In one embodiment, the inked pattern 70 of elements 66 can be formed as a chemically differentiated surface in a pattern of hydrophobic and hydrophilic materials (or neutral and preferential-wetting materials), which can be used as a template to guide and chemically control the self-assembly of a block copolymer to match the template pattern of elements on the receptor substrate. For example, as depicted in FIGS. 18 and 18A, using a template such as stamp 26 (FIG. 16), an ink material that will form a SAM composed of a hydrophobic material such as octadecylthiol (ODT) can be transferred as a pattern 70 of elements 66 (e.g., parallel lines) onto a receptor substrate 68 that has an epoxide surface. Unstamped regions 72 of the substrate adjacent to the line elements 66 can be made hydrophilic by reacting the exposed substrate with a material such as 11-hydroxyundecylthiol. The pattern of hydrophobic material line elements 66 and the hydrophilic substrate regions 72 on the substrate can then be used as a template for guided self-assembly of a block copolymer material.

Figure 19:
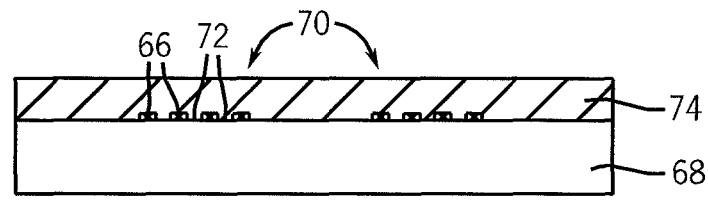
FIGS. 19 and 20 illustrate an embodiment of the use of a chemically differentiated surface of the substrate shown in FIG. 18A for the selective deposit and formation of a self-assembled block copolymer film, shown in a cross-sectional view.
Figure 20:
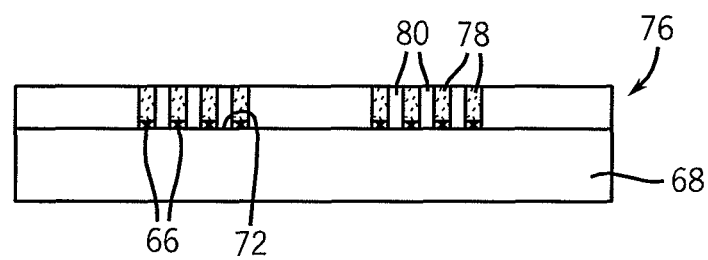
Figure 21:
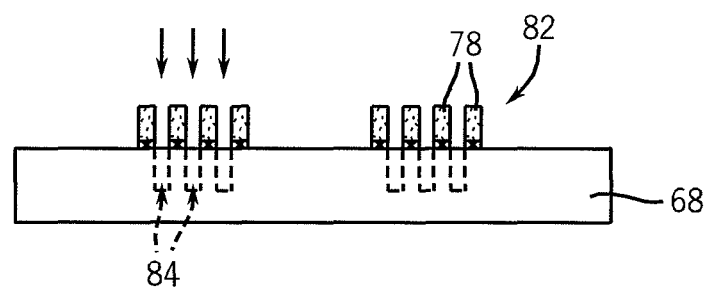
FIGS. 21 and 22 illustrate the use of the self-assembled block copolymer film of FIG. 20 after removal of one of the polymer blocks, as a mask to etch the substrate and filling of the etched opening.
Figure 22:
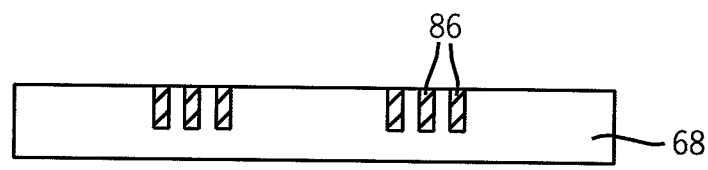

Referring to FIG. 19, a block copolymer material having domains that are selectively wetting to the template (seed layer) formed by the hydrophobic line elements 66 and the hydrophilic substrate regions 72, can be deposited as a film 74 onto the substrate. The copolymer film 74 can then be annealed to form a self-assembled polymer film 76 with lamellae 78, 80 registered to the hydrophobic and hydrophilic regions 66, 72 of the template below, as illustrated in FIG. 20. Then, as shown in FIG. 21, one of the polymer domains (e.g., lamellae 80) of the self-assembled film 76 can be selectively removed and the resulting film 82 can be used as a mask to etch (arrows ↓↓) the underlying substrate 68, for example, by a non-selective RIE etching process, to delineate a series of openings 84 (shown in phantom). Further processing can then be performed as desired, such as filling the openings 84 with a material 86 as shown in FIG. 22, for example, with a dielectric material to separate active areas, or with a conductive material such as a metal or other conductive material to form nanowire channel arrays for transistor channels, semiconductor capacitors, and other structures that can extend to an active area or element in the substrate or an underlayer. Further processing can then be performed as desired. The self-assembly of block copolymers to an underlying chemical pattern is rapid relative to other methods of "top-down" or graphoepitaxy ordering and registration.

In other embodiments, the inked pattern of elements 66 can be used as a template for selective deposition of a hydrophobic or hydrophilic material onto either the inked elements 66 or the unstamped areas 72 of the substrate.

Figure 23:
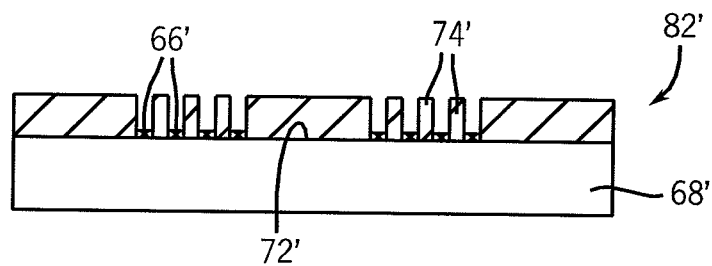
FIG. 23 illustrates another embodiment of the use of the stamped pattern of an ink material shown in FIG. 18A to guide deposition of a material onto exposed portions of the substrate to form a chemically differentiated surface, shown in a cross-sectional view.
Figure 24:
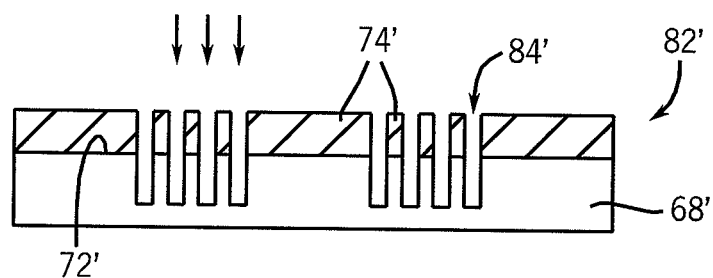
FIG. 24 illustrates the use of the deposited material of the structure shown in FIG. 23 as a mask to etch the underlying substrate.

For example, referring to FIG. 23, the inked pattern of elements 66' can be used as an "anti-seed" guide or template for the global application and selective deposition of a material 74' that is chemically different from the stamped regions (elements) 66' onto adjacent exposed regions 72' of the substrate 68'. For example, elements 66' composed of a hydrophobic ink material (e.g., octadecyl thiol) can be stamped onto the substrate 68', and a hydrophilic material 74' (e.g., an oxide) can be selectively applied to the non-stamped substrate areas 72', for example, by a vapor deposition, resulting in the structure shown in FIG. 23. The resulting film 82' can be used as a mask to etch (arrows ↓↓) the underlying substrate 68' to form openings 84', as depicted in FIG. 24.

Figure 25:
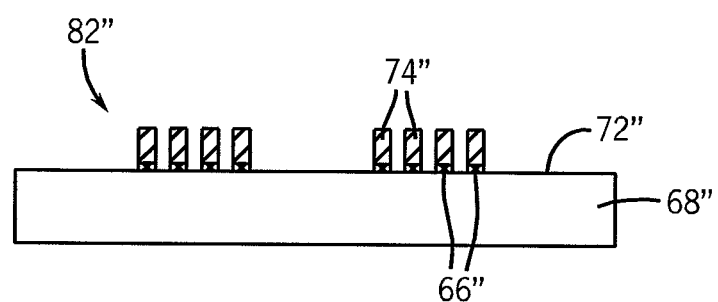
FIG. 25 illustrates yet another embodiment of the use of the stamped pattern of an ink material shown in FIG. 18A as a seed material for selective deposition of an additional material to increase the thickness and/or hardness of the ink elements on the substrate, shown in a cross-sectional view.
Figure 26:
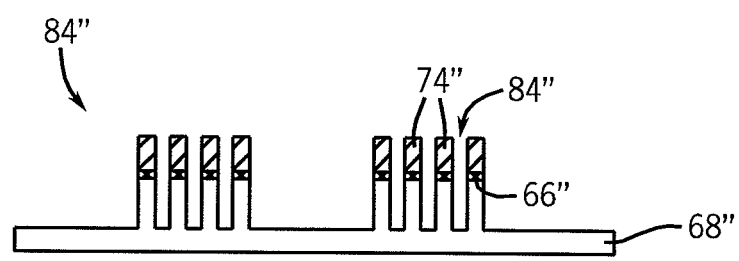
FIG. 26 illustrates the use of the ink pattern with added material shown in FIG. 25 as a mask to etch openings in the underlying substrate.

In another embodiment, as shown in FIG. 25, elements 66" can be used as a seed material for the selective deposition of additional material 74" to increase the thickness and/or hardness of the elements 66" and produce a hard mask for etching the substrate 68". For example, elements 66" can be formed from acetylenic hydrocarbons or esters of acetylenic carboxylates with hydrocarbon conjugates (e.g., hexylpropynoate ester), with subsequent selective deposition of an inorganic material 74" such as silicon oxide to increase the thickness and/or hardness of the elements 66". In another example, a material 74" such as silicon nitride can be selectively deposited onto the elements 66" by ALD methods to form a hardmask 82" composed, for example, of a series of lines according to the pattern of the elements 66". In other embodiments, elements 66" can be formed as a seed layer from an ink material having a functional group on its tail end (e.g., ink chemical with a bromine functional group) that will selectively initiate polymer growth, and an atom transfer radical polymerization (ATRP) can then be conducted to add additional polymer material 74" to increase the thickness and/or hardness of the elements 66" and produce a hard mask for etching openings 84". The hardmask 82" can be then used, for example, to mask the etch of the underlying substrate 68" (e.g., film stack, etc.) to form openings 84", as shown in FIG. 26.

Another embodiment of the invention illustrated in FIGS. 27-32, utilizes chemical patterning of a substrate to direct self-assembly of a block copolymer. In some embodiments, the process utilizes a stamp/template 88 that is formed with transparent sections 90, non-transparent sections 92, and a stamping surface 94. The transparent sections 90 are composed of a material that is substantially transparent to UV or DUV radiation in order to allow light to pass therethrough, for example, glass (e.g., quartz ($SiO_2$)), calcium fluoride ($CaF_2$), diamond, or a transparent plastic or polymeric material, and the non-transparent (opaque) sections 92 can be composed, for example, of a elastomeric polymer material such as poly (dimethylsiloxane) (PDMS).

Figure 27:
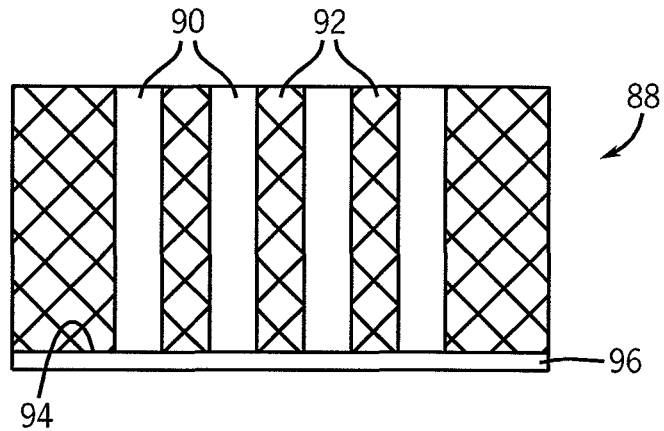
FIGS. 27-32 illustrate steps in another embodiment of a method according to the invention to chemically pattern a substrate, shown in a cross-sectional view.
Figure 28:
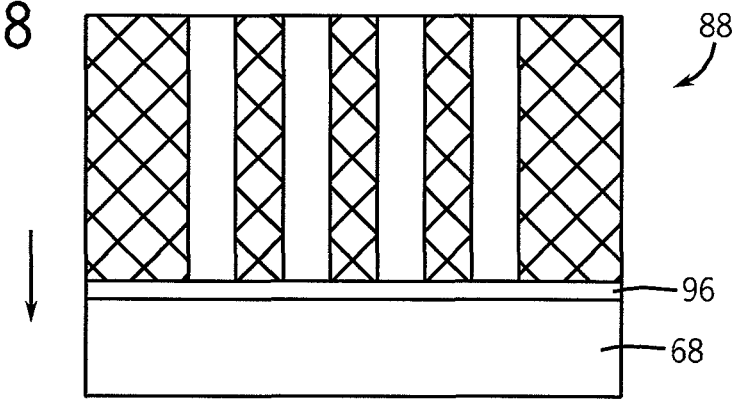
Figure 29:
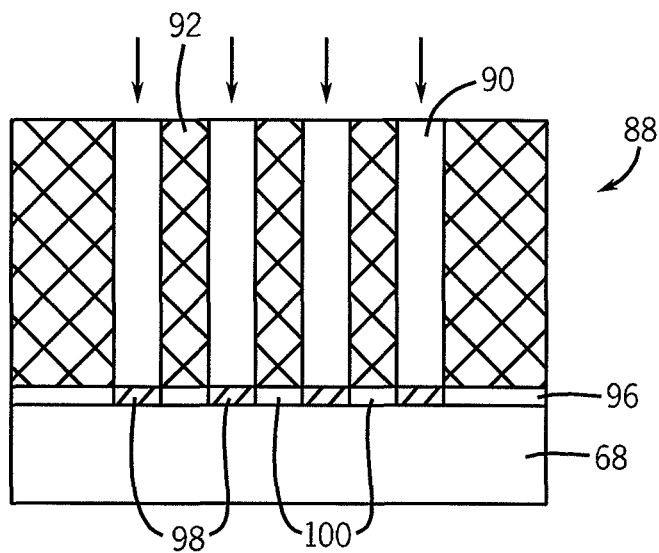
Figure 30:
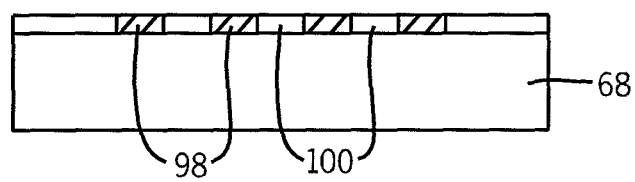

As shown in FIG. 27, the stamping surface 94 can be coated with a thin film 96 of a polymerizable neutral wetting material that exhibits non-preferential or neutral wetting toward the blocks of a block copolymer, such as a random block copolymer (e.g., PS-r-PMMA). The template 88 can then be pressed (arrow ↓) onto a receptor substrate 68 (e.g., a preferential wetting material such as silicon (with native oxide), oxide, etc.) as shown in FIG. 28 to transfer the polymer material 96 onto the substrate 68. Then, as illustrated in FIG. 29, a radiation source (e.g., UV or DUV radiation) can then be transmitted (arrows ↓↓) through the transparent sections 90 of the stamp/template 88 to photolytically crosslink discrete sections 98 of the polymer material 96 on the substrate 68. The template 88 can then be removed from contact with the receptor substrate 68, leaving the crosslinked polymer sections 98 and non-crosslinked polymer material 100, as depicted in FIG. 30.

Figure 31:
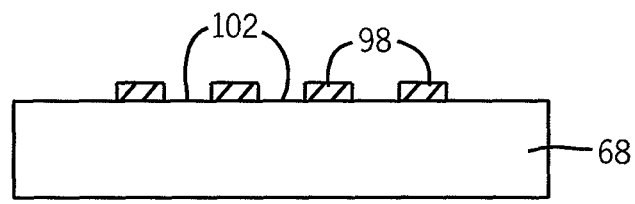
Figure 32:
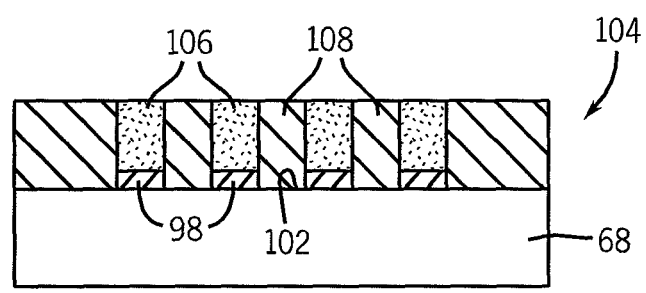

Further processing can then be conducted as desired. For example, as shown in FIG. 31, the non-crosslinked polymer material 100 can be removed, for example, by wet processing by a chemical dissolution process using a solvent to expose sections 102 of the receptor substrate 68, resulting in discrete neutral wetting sections 98 composed of the crosslinked polymer material (e.g., crosslinked random copolymer) and preferential wetting sections 102 composed of the exposed receptor substrate (e.g., oxide). A block copolymer material can then be cast or spin-coated onto the chemically differentiated surface and annealed to form a self-assembled block copolymer layer 104. As illustrated in FIG. 32, the annealed block copolymer film 104 will register to the differing wetting patterns (98, 102) on the receptor substrate 68, for example, to form lamellae 106, 108 as shown. The resulting film 104 can be further processed, for example, to selectively remove one of the polymer blocks to produce a hard mask for use in a dry etch to transfer the pattern into the underlying substrate material.

Patterning a substrate using conventional lithographic techniques has been hampered by difficulties such as high costs and/or incompatibility with high throughput production methods. With embodiments of the present invention, a stamp can be prepared using conventional lithography (to form the trenches) but, because the stamp can be used repeatedly to pattern multiple substrates, the production cost per stamped substrate is reduced. In addition, the use of the stamped pattern (e.g., SAM ink pattern 70) for chemically controlling the formation of a self-assembled block copolymer film, can subsequently provide an etch mask on a nanoscale level that can be prepared more inexpensively than by electron beam lithography or EUV photolithography. The feature sizes produced and accessible by this invention cannot be prepared by conventional photolithography.

In another embodiment of the invention illustrated in FIGS. 33-60A, the ordering of a self-assembling block copolymer material (e.g., film) is induced and directed by overlaying a topographically flat stamp that is chemically patterned on its surface. The chemically patterned stamp overlaid on a BCP film cast onto a substrate that has been globally modified to be equally wetting to both blocks of the BCP will direct self-assembly of the BCP film to match the pattern on the stamp. The present embodiment of the invention achieves a pattern transfer to a block copolymer (BCP) without leaving a physically formed impression in the substrate and without a transfer of material to the substrate or the BCP material.

Figure 33:
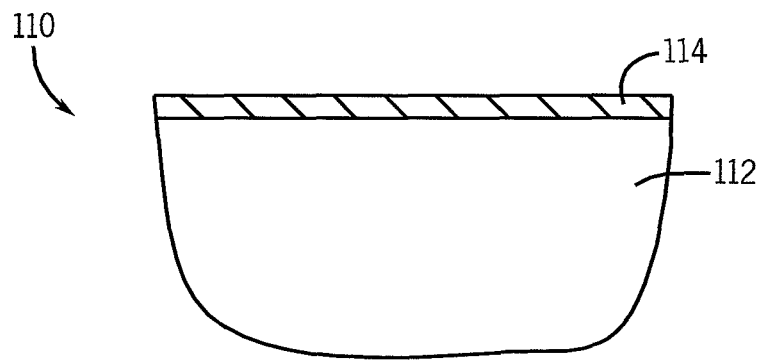
FIG. 33 illustrates an elevational, cross-sectional view of an embodiment of a substrate bearing a neutral wetting layer at a preliminary processing step.

FIG. 33 illustrates a substrate (generally 110) to be patterned. The substrate 110 can be composed of a base material 112, which can be, for example, silicon, silicon oxide, silicon nitride, silicon oxynitride, silicon oxycarbide, among other material. As shown, a non-preferential or neutral wetting material 114 (equal affinity for blocks of the copolymer) is formed over the base material.

The neutral wetting material 114 can be formed, for example, by blanket coating a random copolymer material onto the base material 112 by casting or spin-coating, and fixing the polymer material in place by grafting (on an oxide substrate) or by thermally or photolytically crosslinking (any surface). For example, a material that is neutral wetting to a PS-b-PMMA block copolymer can be formed from a thin film of a photo-crosslinkable random PS:PMMA copolymer, for example, PS-r-PMMA (60% PS) grafted to an oxide substrate.

As previously described, a neutral wetting layer can also be formed on a base material 112 such as an oxide by grafting and heating a random copolymer of polystyrene (PS) and polymethacrylate (PMMA) with a few % (e.g., less than or equal to about 5%) hydroxyl group(s) (e.g., 2-hydroxyethyl methacrylate (P(S-r-MMA-r-HEMA)) on the base material. In another embodiment, a surface that is neutral wetting to PS-b-PMMA can also be prepared by spin coating and crosslinking a benzocyclobutene- or azidomethylstyrene-functionalized random copolymer of styrene and methyl methacrylate (e.g., poly(styrene-r-benzocyclobutene-r-methyl methacrylate (PS-r-PMMA-r-BCB)) on the base material.

In yet another embodiment, a base material 112 of silicon (with native oxide) can be treated by a fluoride ion etch (e.g., with aqueous HF, buffered HF or $NH_4F$, HF vapor treatment, etc.) or a hydrogen plasma etch as previously described, to form hydrogen-terminated silicon, which is neutral wetting to a block copolymer material such as PS-b-PMMA. An H-terminated silicon material 114 can be further processed by grafting of a random copolymer such as PS-r-PMMA onto the material 114 (e.g., in situ free radical polymerization of styrene and methyl methacrylate with a di-olefinic linker).

Figure 34:
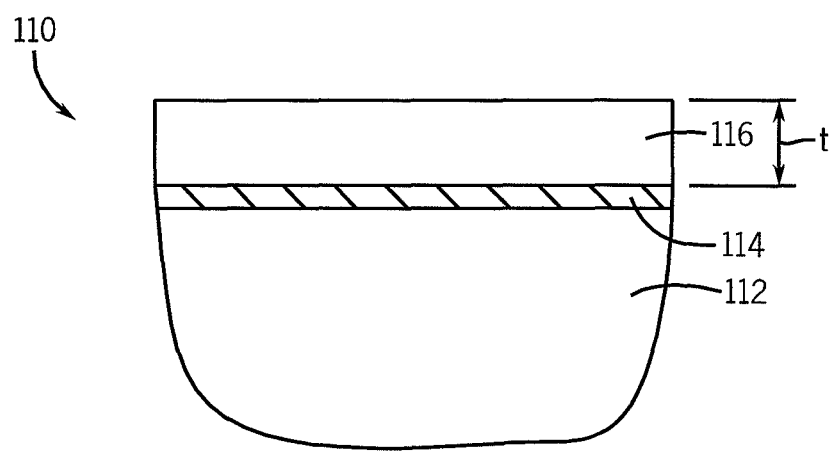
FIG. 34 illustrates the substrate of FIG. 33 at a subsequent processing step.

Referring now to FIG. 34, a lamellar- or cylindrical-phase block copolymer material 116 is then cast as a film onto the neutral wetting material 114 on the substrate 110. The block copolymer material 116 has an inherent pitch at or about $L_o$ (or a ternary blend of block copolymer and homopolymers blended to have a pitch at or about $L_o$). The block copolymer material 116 can be deposited by spin casting or spin-coating from a dilute solution (e.g., about 0.25-2 wt % solution) of the copolymer in an organic solvent such as dichloroethane ($CH_2Cl_2$) or toluene, for example. The thickness (t) of the block copolymer material 116 is at or about $L_o$.

The block copolymer material 116 is then induced to self-assemble by contact with a stamp, which, according to the invention, is topographically flat and chemically patterned on its surface.

FIGS. 35-39B illustrate an embodiment of a process for forming a master template for forming a stamp for use in inducing self-assembly of a block copolymer material on a substrate. The master template (generally 118), which is topographically flat, is prepared by forming a pattern of chemically differentiated areas on the surface of a base substrate 120. The base substrate 120 can be composed, for example, of silicon dioxide or gold.

Figure 35:
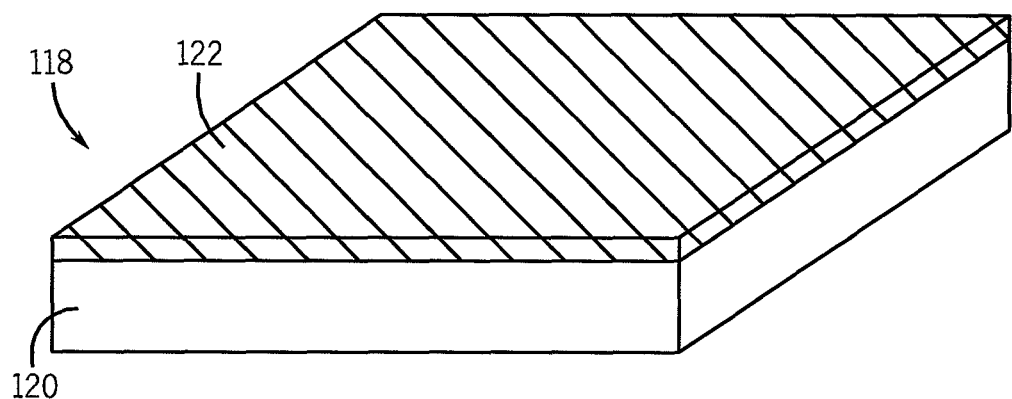
FIGS. 35-39 illustrate an embodiment of a process according to the invention for forming a chemically patterned master template for use in inducing self-assembly of a lamellar-phase block copolymer material on a substrate.

Referring to FIG. 35, in one embodiment, a hydrophilic material 122 on the base substrate 120 can be micropatterned to form the chemical master template 118. The hydrophilic material 122 can be, for example, silicon (with native oxide), oxide (e.g., silicon oxide, $SiO_x$), indium tin oxide (ITO), silicon nitride, silicon oxycarbide, silicon oxynitride. In another embodiment, the hydrophilic material 122 can be composed of a metal, for example, gold, silver, copper, palladium or platinum, on the base substrate 122 and an overlying SAM of an alkane thiol such as hydroxyundecylthiol (HUT), or other hydrophilic alkane thiol. The hydrophilic material 122 can be formed on the base substrate 120 as a monolayer (SAM) of about 0.5-5 nm thick.

Figure 36:
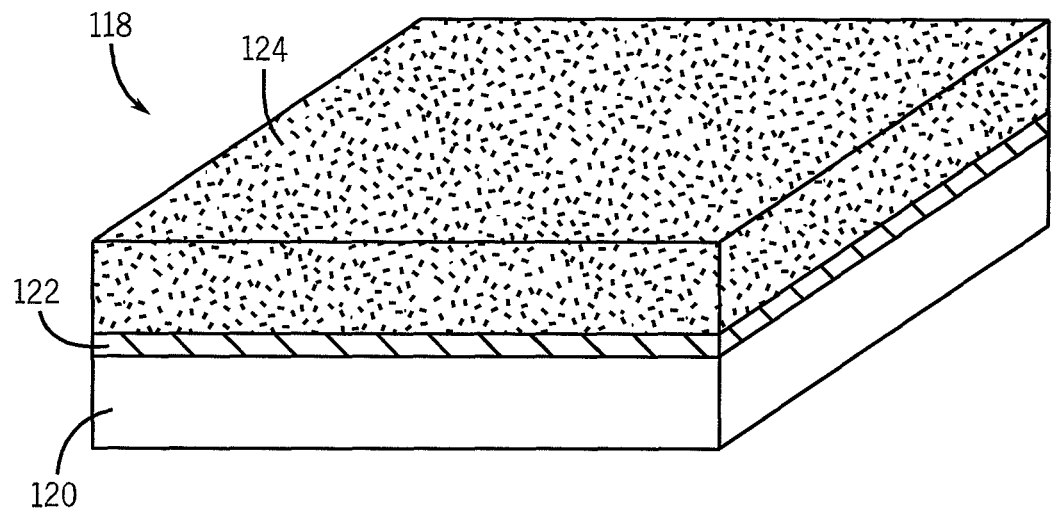
Figure 37:
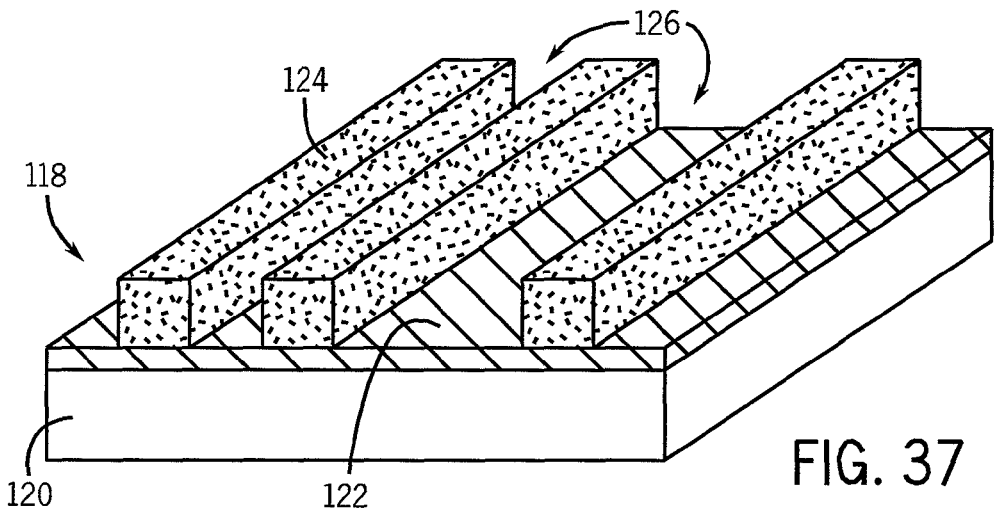
Figure 37A:
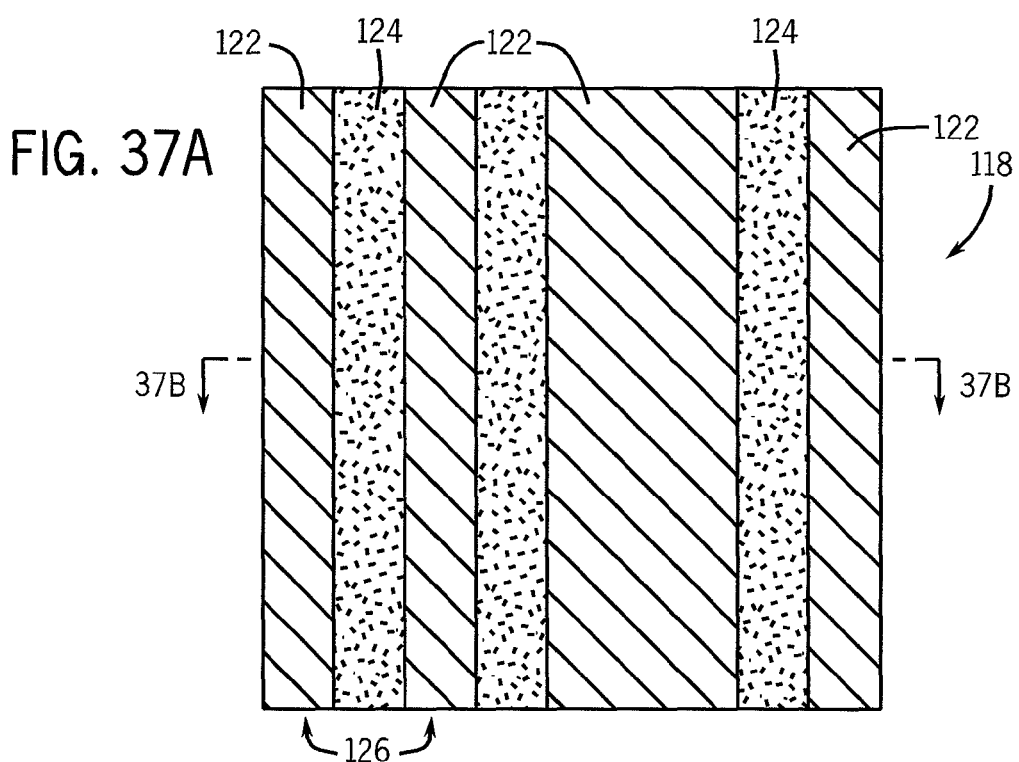
FIGS. 37A, 38A, and 39A illustrate top plan views
Figure 37B:
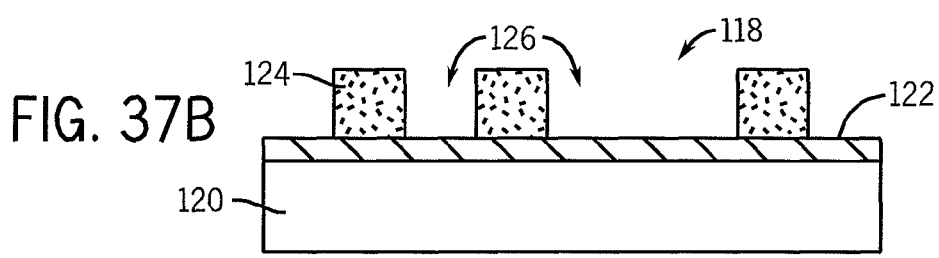
FIGS. 37B, 38B, and 39B illustrate elevational, cross-sectional views of the substrates shown in FIGS. 37, 38, and 39, respectively.

As shown in FIG. 36, a layer of resist material 124 can be formed on the hydrophilic material 122, and then developed in a desired pattern and removed (FIGS. 37-37B) to expose portions of the hydrophilic material 122. The resist material 124 can be patterned using a lithographic tool having an exposure system capable of patterning at the scale of at or about $L_o$ (10-100 nm). The material for the resist 124 is selected based on the required sensitivity and compatibility with the exposure system that is used. Such exposure systems include, for example, extreme ultraviolet (EUV) lithography, electron beam (e-beam) lithography, immersion lithography, and proximity X-rays as known and used in the art. The pattern formed in the resist material 124 can be composed, for example, of a series of linear openings (stripes) 126, as shown in FIGS. 37-37B.

Figure 38:
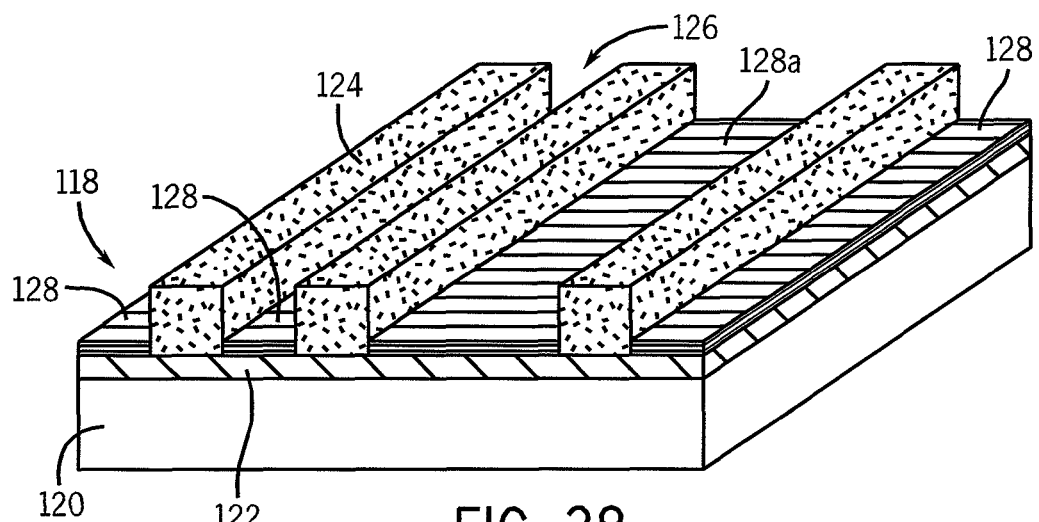
Figure 38A:
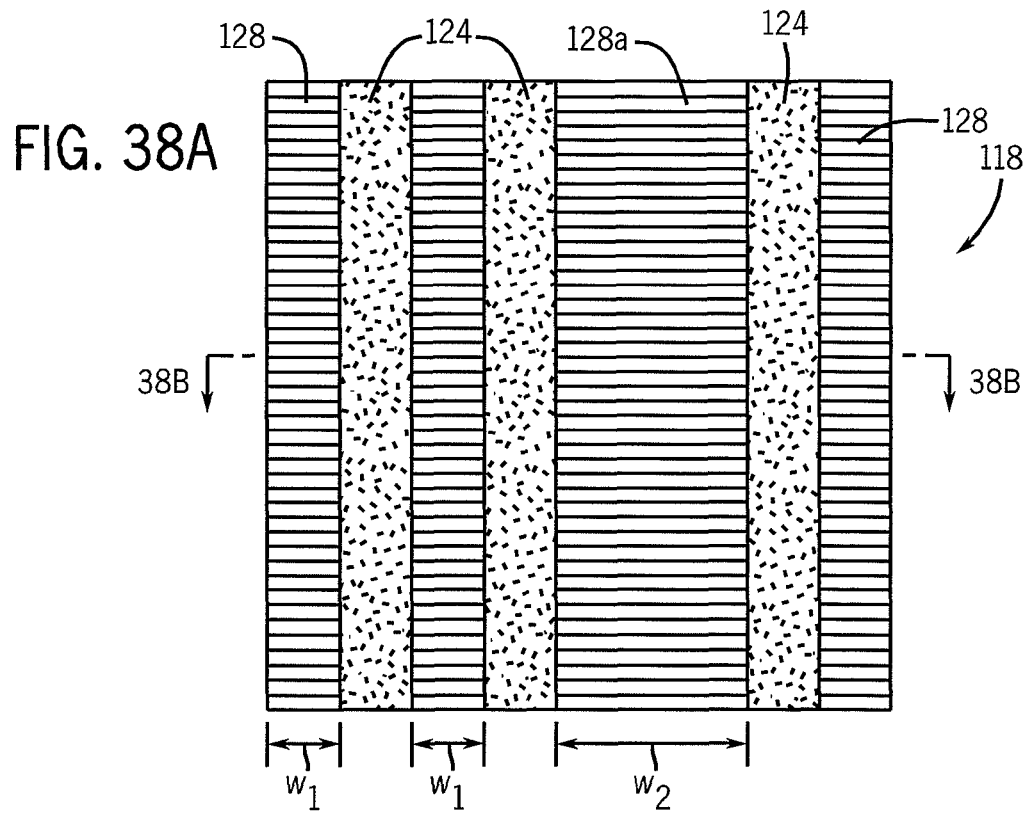
Figure 38B:
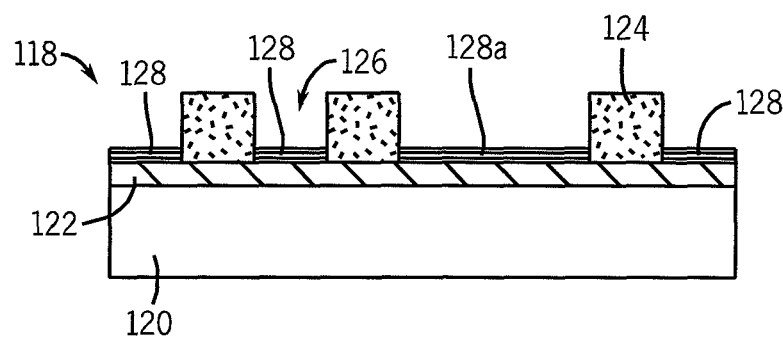

Referring now to FIGS. 38-38B, a hydrophobic material 128 can then be deposited onto the exposed sections of the hydrophilic material 122 using the resist 124 as a mask. The hydrophobic material 128 can be, for example, an alkyl trialkoxysilane such as methyltrimethoxysilane, methyltriethoxysilane, methyltriisopropoxysilane, ethyltrimethoxysilane, ethyltriethoxysilane, n-propyltrimethoxysilane and n-propyltriethoxysilane; an alkylthiolate such as dodecanethiol or octadecanethiol (ODT); among others. The hydrophobic material 128 can be deposited as a monolayer (e.g., self-assembled monolayer (SAM)) of about 0.5-5 nm thick.

Figure 39:
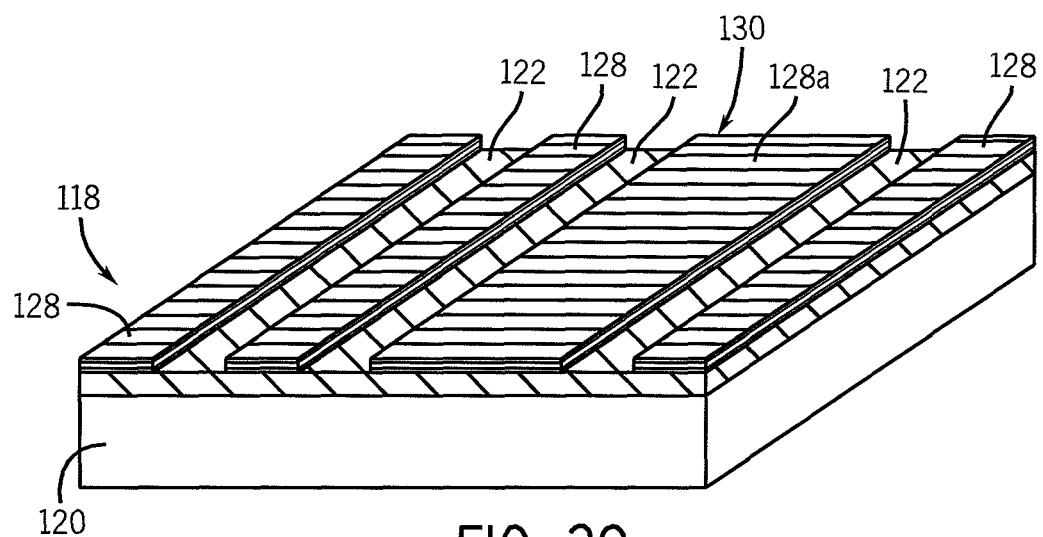
Figure 39A:
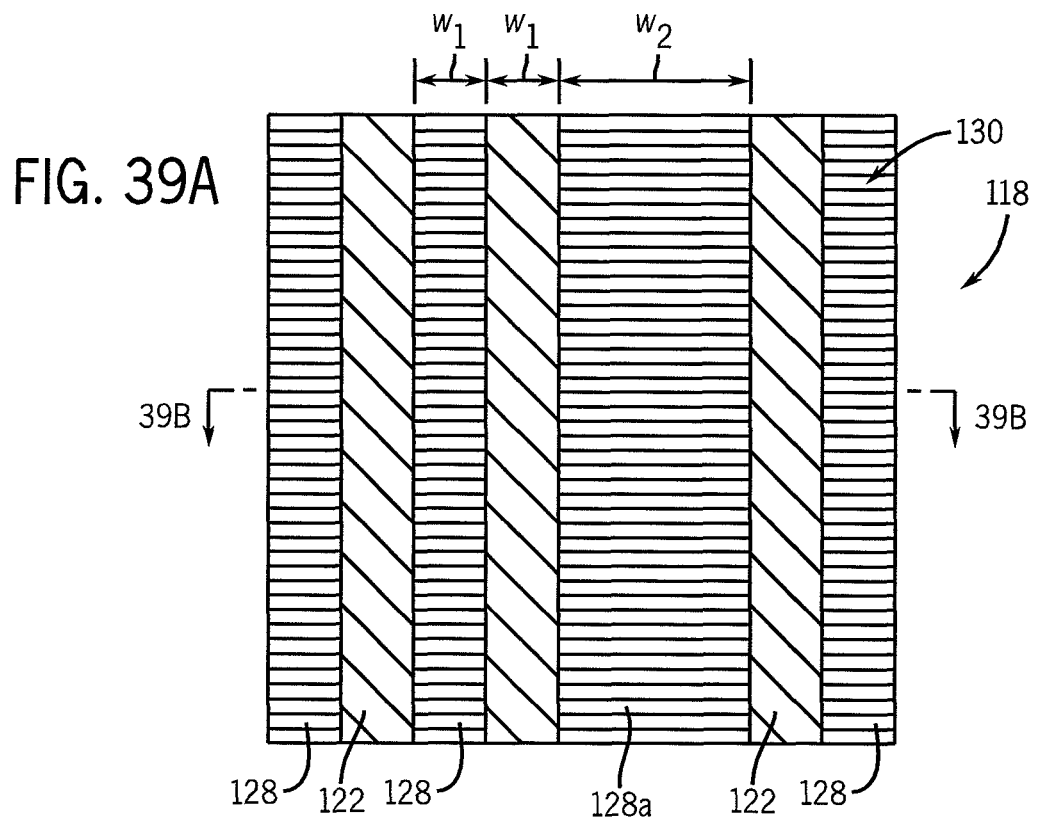
Figure 39B:
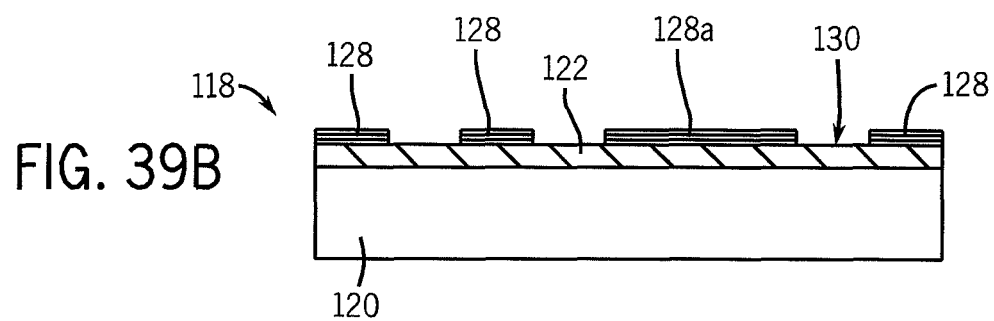

As illustrated in FIGS. 39-39B, the resist 124 can then be stripped to expose the previously masked portions of the hydrophilic material 122. The resulting master template 118 now bears a chemically patterned surface 130 composed of lines of the hydrophobic material 128 (e.g., alkyl trialkoxysilane) adjacent to lines of the hydrophilic material 122 (e.g., oxide). For example, a master template 118 can be prepared with a surface patterned with hydrophobic SAM 128 of octadecanethiol (ODT) adjacent to a hydrophilic SAM 122 of 11-hydroxyundecane-1-thiol (HUT), as described by van Poll et al., *Angew. Chem. Int. Ed.:* 46, 6634-6637 (2007).

The hydrophilic 122 and hydrophobic 128 material elements on the surface of the master template 118 are dimensioned with a width ($w_1$) that matches or substantially matches the inherent self-assembled structure (e.g., $L_o$ value) of the block copolymer material (BCP) 116 that is deposited on the substrate 110 (FIG. 34) in those sections of the polymer material 116 where self-assembly into perpendicular-oriented structures (e.g., lamellae, cylinders) is desired. In areas of the polymer material 116 where a lack of formation of perpendicular-oriented elements is desired, a hydrophobic region 128a (FIG. 39) (or hydrophilic region) can be formed with dimensions (i.e., width ($w_2$)) that are greater than the $L_o$ value of the BCP material 116.

Figure 40:
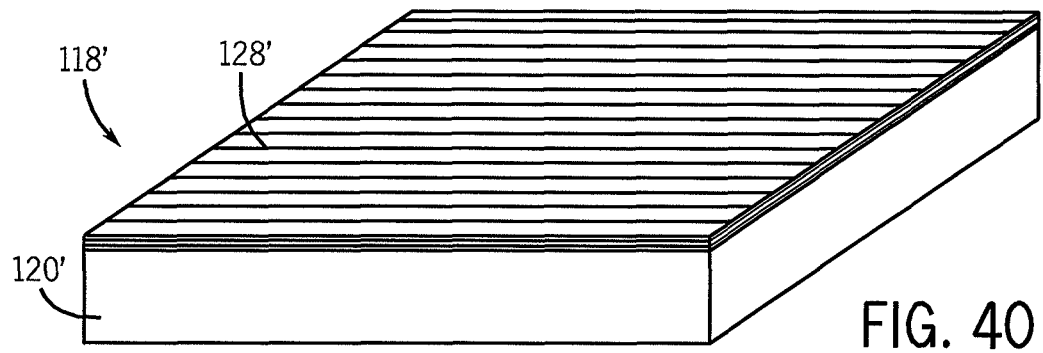
FIGS. 40-43 illustrate another embodiment of a process for forming a chemically patterned master template for use in forming a stamp for directing self-assembly of a lamellar-phase block copolymer material.
Figure 41:
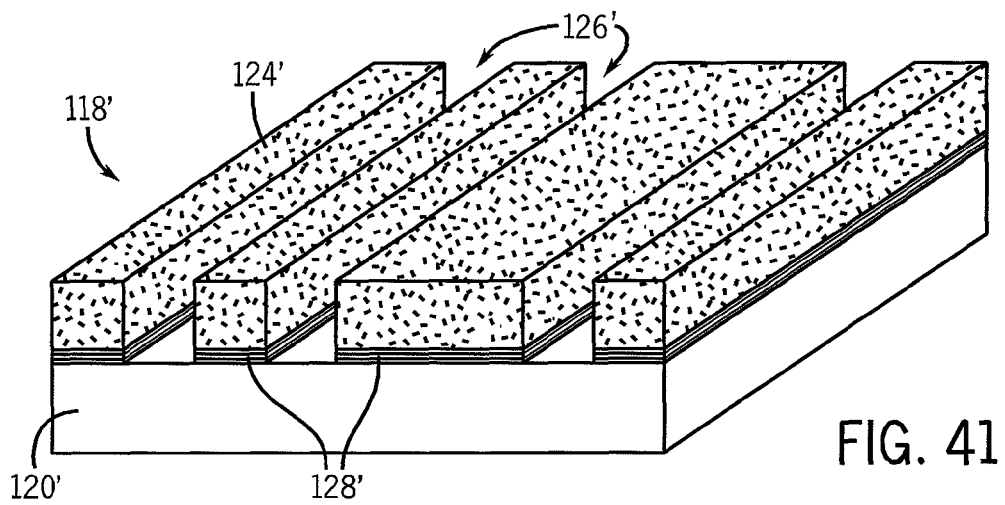
Figure 41A:
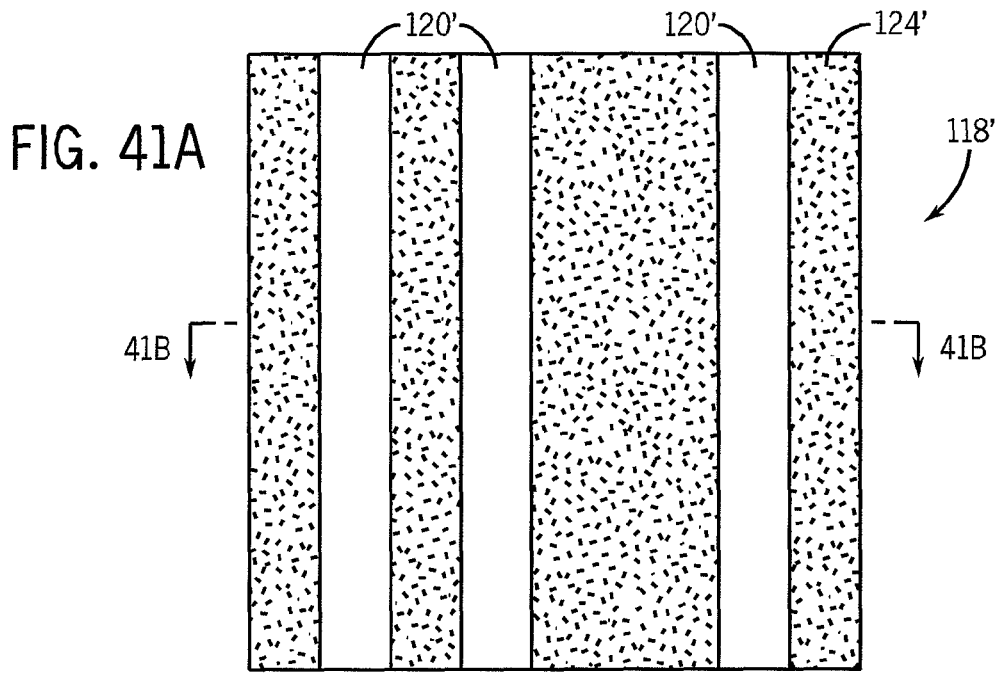
FIGS. 41A, 42A, and 43A illustrate top plan views
Figure 41B:
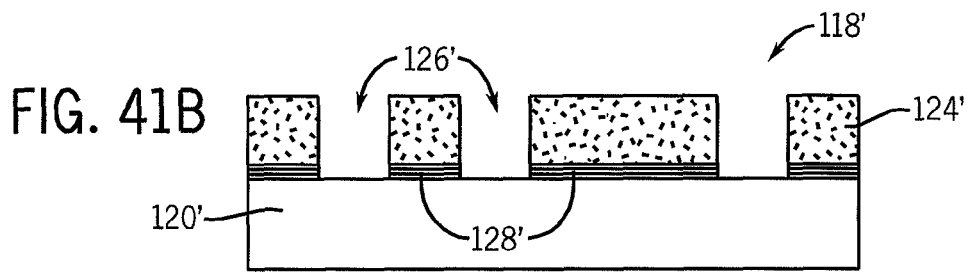
FIGS. 41B, 42B, and 43B illustrate elevational, cross-sectional views of the substrates shown in FIGS. 41, 42, and 43, respectively.
Figure 42:
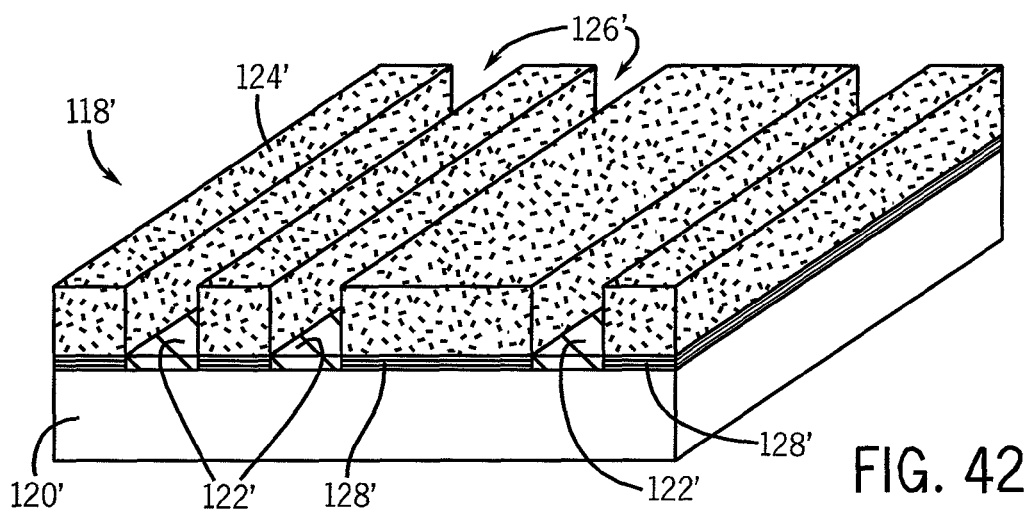
Figure 42A:
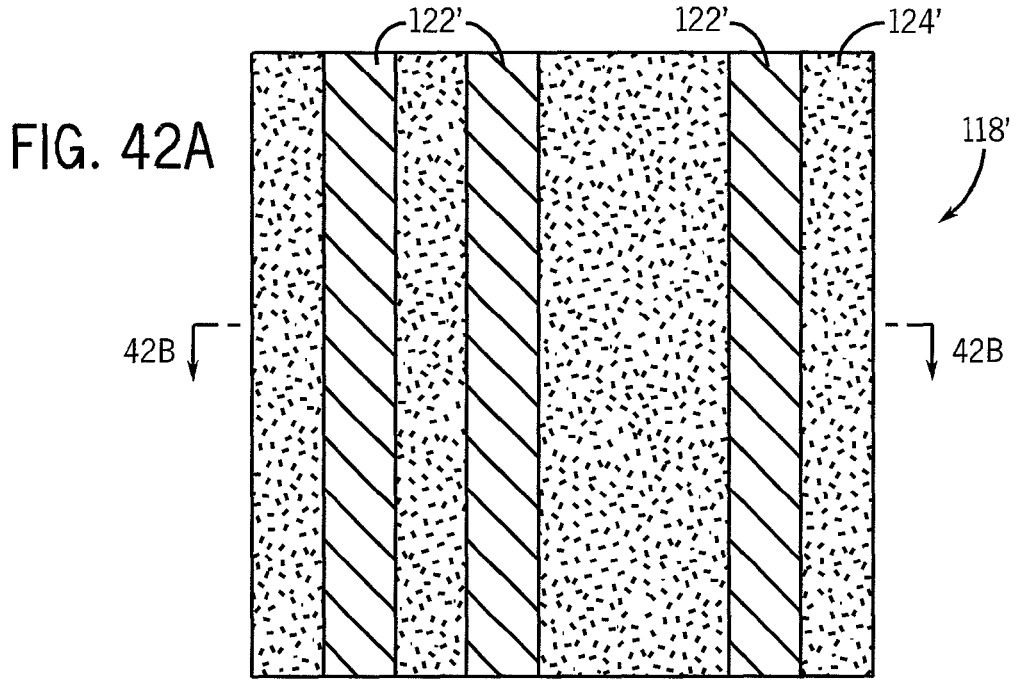
Figure 42B:
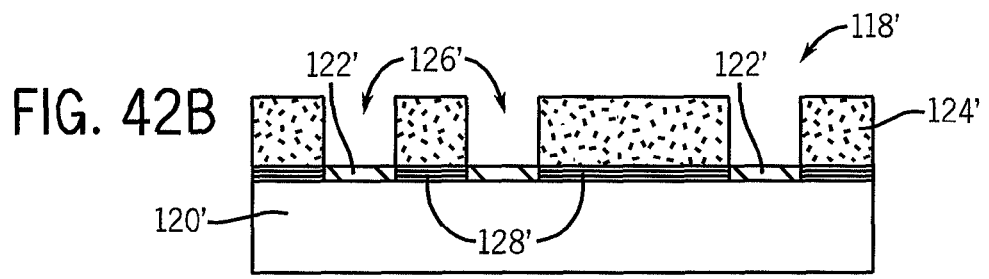
Figure 43:
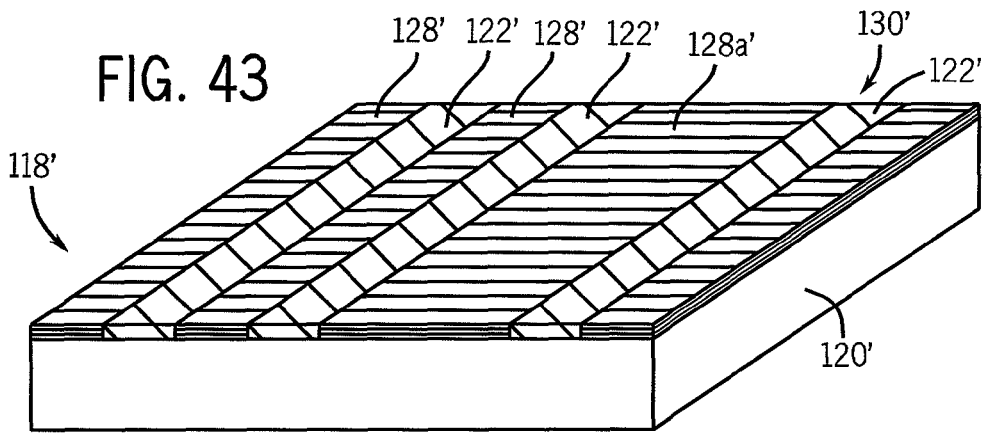
Figure 43A:
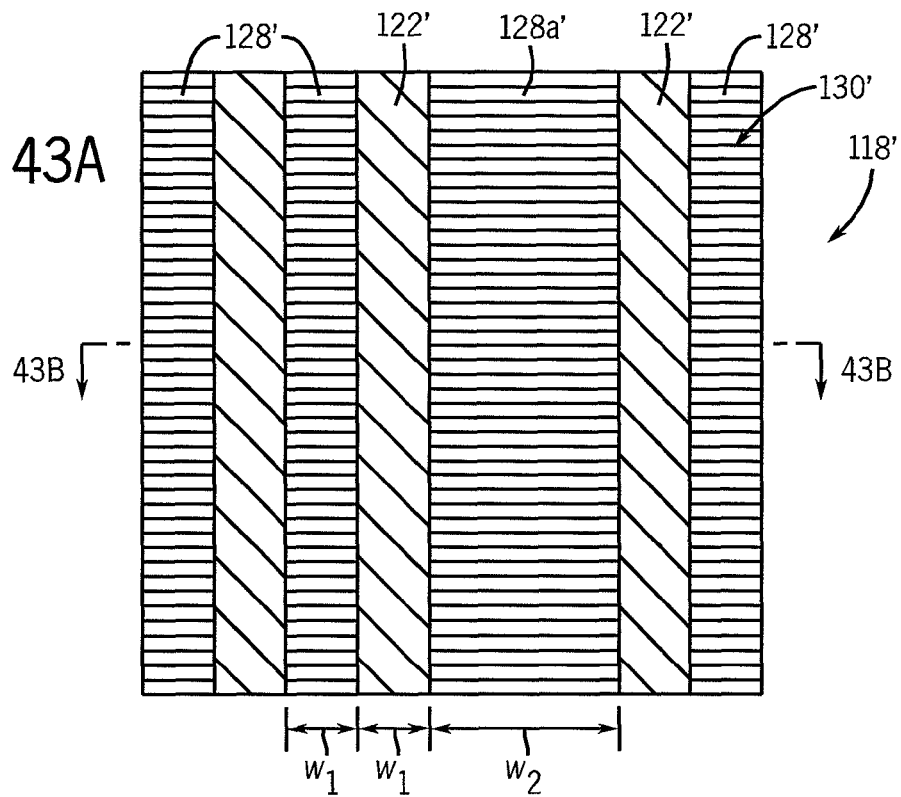
Figure 43B:
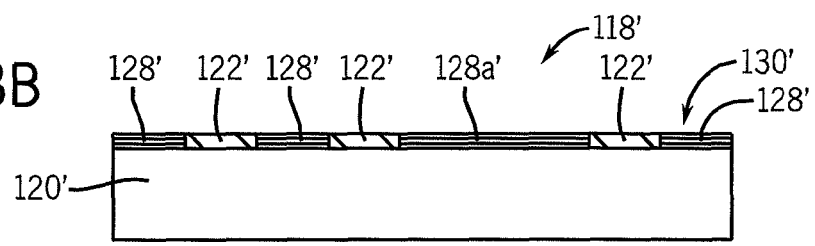

Referring to FIG. 40, in another embodiment of forming a chemical master template 118', a hydrophobic material 128' (e.g., an alkyl trialkoxysilane) can be blanket deposited onto a base substrate 120' such as silicon or silicon oxide, for example. The hydrophobic material 128' can then be patterned and removed using a resist 124' as a mask as shown in FIGS. 41-41B, to expose portions of the base substrate 120'. Then, as depicted in FIGS. 42-42B, the exposed base substrate 120' can then be selectively oxidized to form a hydrophilic monolayer (SAM) 122', or in other embodiments, a hydrophilic material (e.g., oxide, SiN, alkane thiol, etc.) can be deposited onto the exposed base substrate 120'. Then, as illustrated in FIGS. 43-43B, the resist 124' can be stripped, with the surface 130' of the master template 118' now bearing a pattern of lines of the hydrophobic material 128a' adjacent to lines of the hydrophilic material 122'.

Using the master template 118 (e.g., FIG. 39) as a guide, a stamp (generally 132) is then formed with hydrophilic and hydrophobic elements in a mirror image of the pattern of elements on the master template surface. The chemically differentiated surface of the stamp 132 can then be used to direct self-assembly of the block copolymer material 116 on the substrate 110 (FIG. 33).

Figure 44:
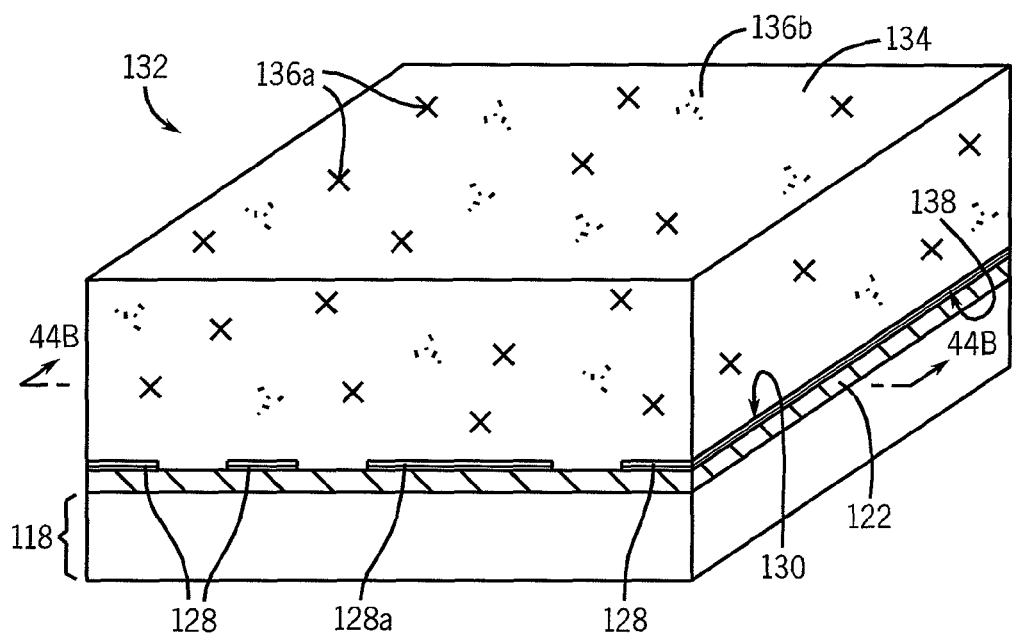
FIGS. 44-47 illustrate an embodiment according to the invention for forming a stamp on a master template as illustrated in FIG. 39.
Figure 44A:
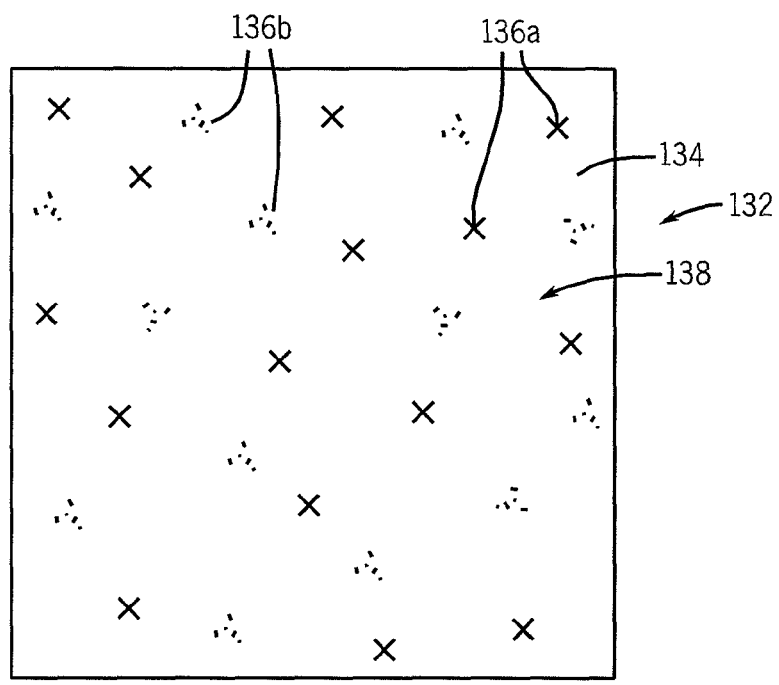
FIGS. 44A and 45A illustrate top plan views and FIGS. 44B and 45B illustrate elevational, cross-sectional views of the master template/stamp material complex shown in FIGS. 44 and 45, respectively.
Figure 44B:
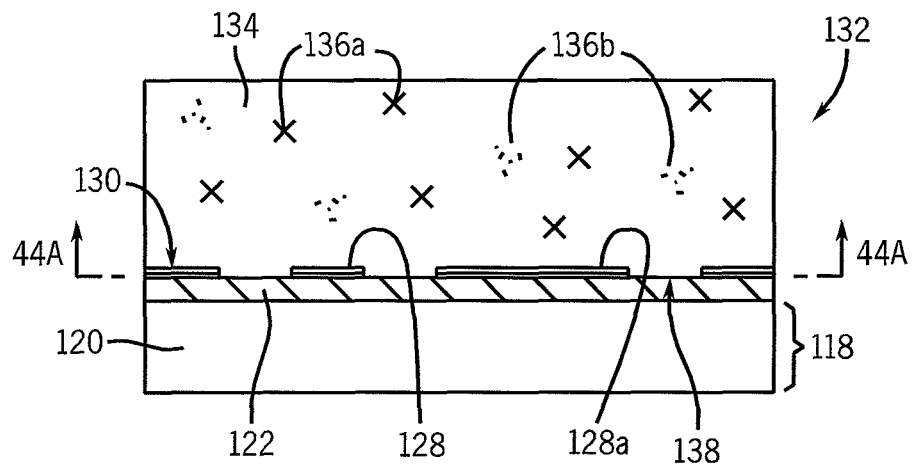
Figure 45:
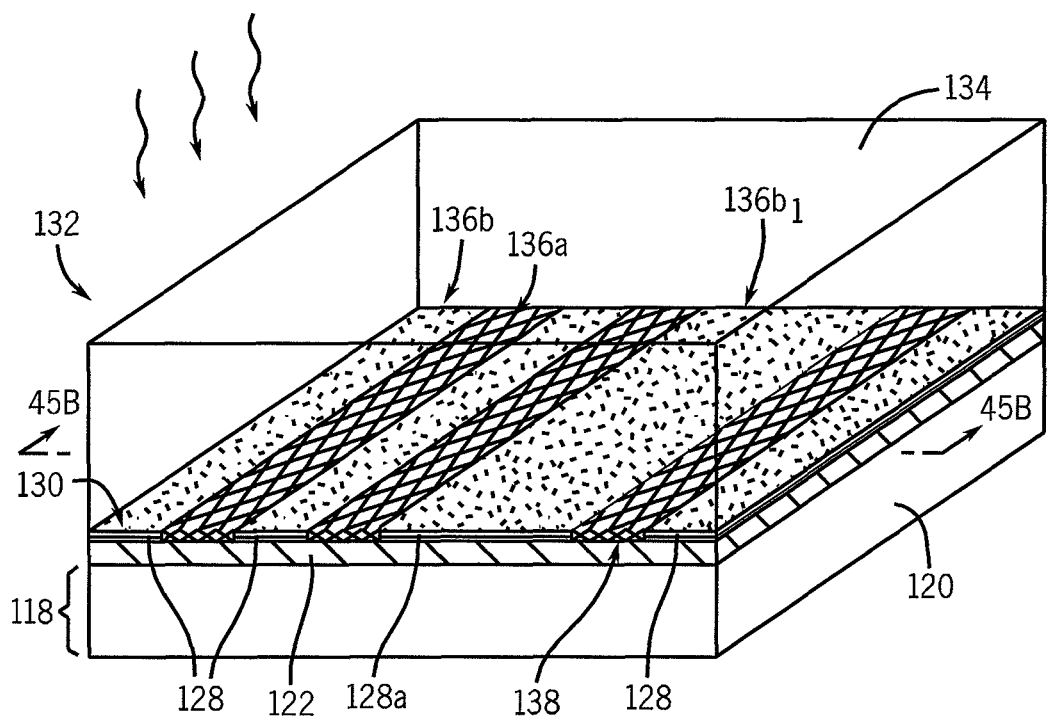
Figure 45A:
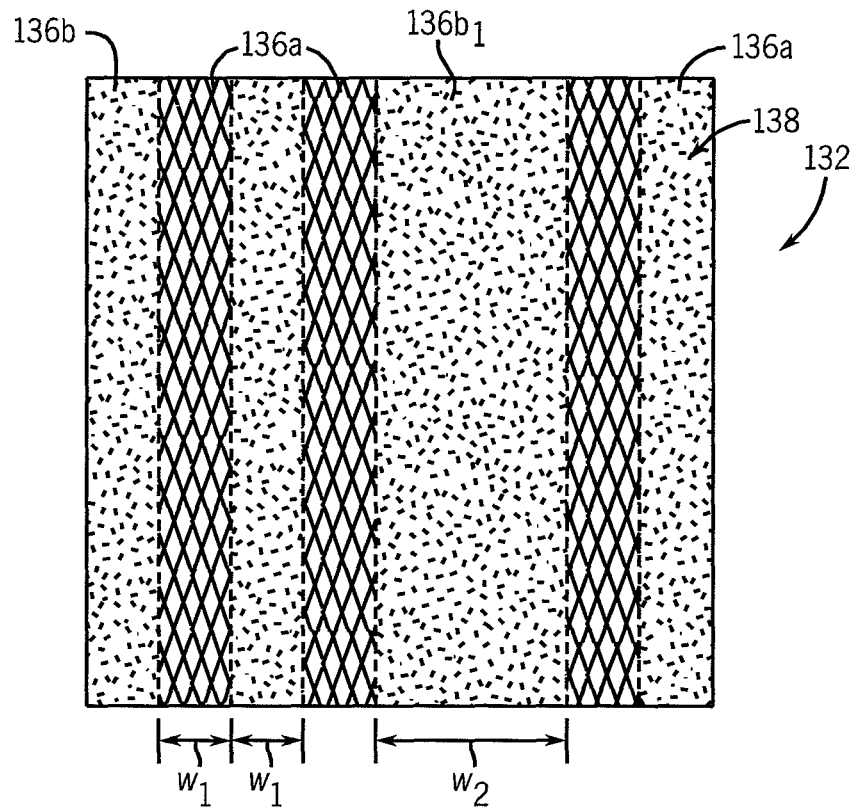
Figure 45B:
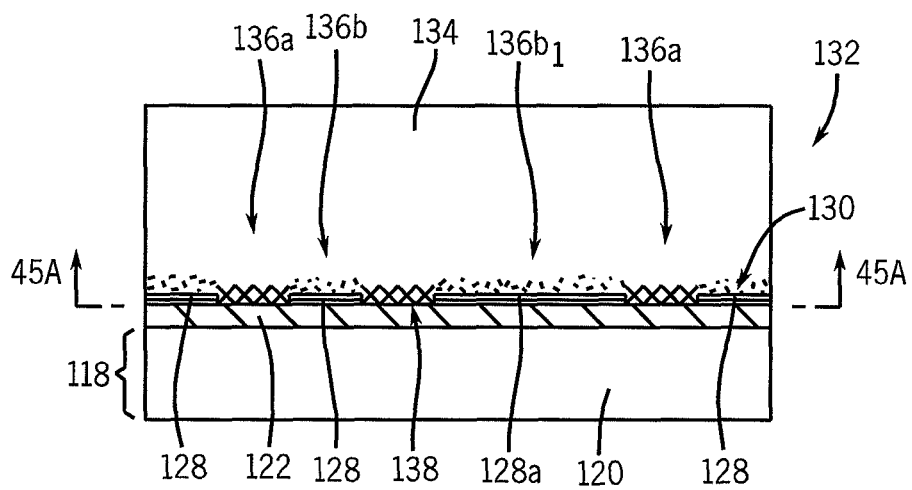

Referring to FIGS. 44-44B, in some embodiments, a soft, flexible or rubbery material 134 such as a polydimethylsiloxane (PDMS) elastomer or other elastomeric, crosslinkable polymer material (e.g., silicones, polyurethanes, etc.) is deposited onto the chemically patterned surface 130 of the master template 118 to form a stamp 132. The unmodified surface of a PDMS material is hydrophobic. To modify the surface of the stamp, the polymer material can be prepared as a mixture of the elastomeric polymer with different functional small molecules, e.g., a hydrophilic molecule 136a and a hydrophobic molecule 136b. As illustrated in FIGS. 45-45B, preferential wetting by molecules 136a, 136b over the polymer material 134 against the master template 118 (arrow ↓) directs the migration and preferential accumulation (self-assembly) of the small molecules 136a, 136b at the surface 138 of the polymer stamp 132 in response to the hydrophilic 122 and hydrophobic 128 regions or elements on the functionalized surface 130 of the master template 118. During curing, a crosslinking agent of the polymer material 134 reacts with the small molecules 136a, 136b and with functional groups of the polymer to "freeze" the pattern of small hydrophilic and hydrophobic molecules 136a, 136b into the polymer (e.g., PDMS elastomer) stamp 132 against the hydrophilic 122 and hydrophobic 128 surfaces, respectfully, of the master template 118. The resulting stamp 132 has a flat surface 138 that bears a pattern of sub-micrometer features of different chemical functionalities (hydrophilic 136a and hydrophobic 136b) that replicates the pattern of hydrophilic (122) and hydrophobic (128) elements on the master template 118.

For example, a PDMS elastomer material, such as SYLGARD® 184 (Dow Corning), can prepared as a mixture of PDMS and small functional hydrophobic and hydrophilic molecules (e.g., vinyl-terminated molecules with different head groups), as described by van Poll et al., Angew. Chem. Int. Ed.: 46, 6634-6637 (2007). Examples of small hydrophobic molecules include perfluorinated alkenes (e.g., 1H,1H, 2H-perfluorodecene), vinyl esters (e.g., alky 2-bromo-2-methyl propionic acid ester), and hydrocarbon alkenes (e.g., 11-undecene), among others. Examples of small hydrophilic molecules include oligo(ethylene glycol) methacrylate (OEGMA), undec-11-enyl hexaethylene glycol monomethyl ether ($PEG_6$ derivative), and vinylic (mono- or divinyl) poly (ethylene glycol), among others. The PDMS can be mixed, for example, with equimolar amounts of a small amount of the small molecules, generally less than about 5 wt % (e.g., about 2-3 wt %). During curing, the molecules will self-assemble according to the functionalized monolayer on the template surface and react with the PDMS backbone by a hydrosilylation reaction during curing.

Figure 46:
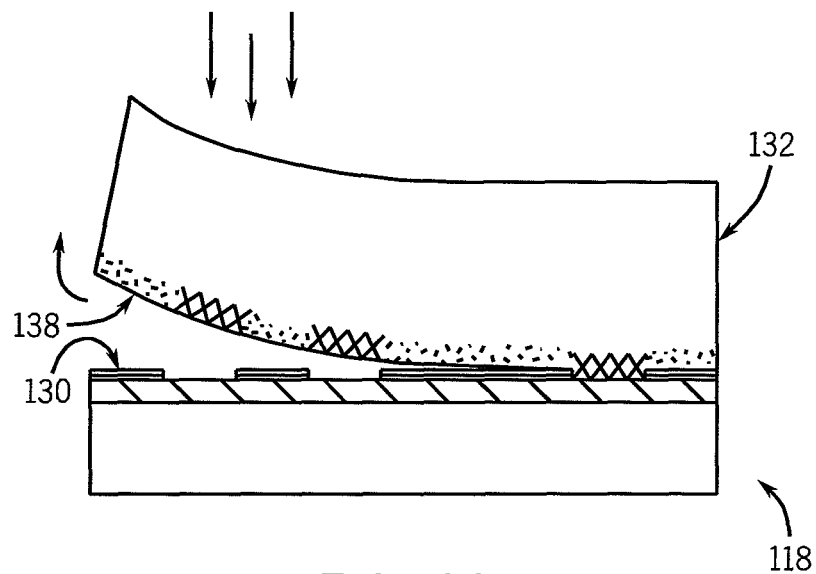
Figure 47:
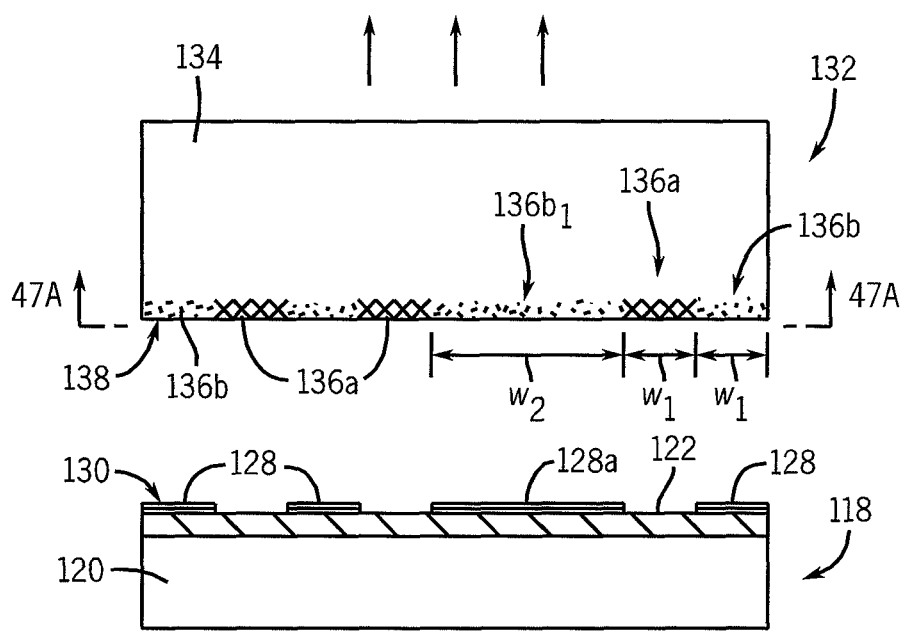
Figure 47A:
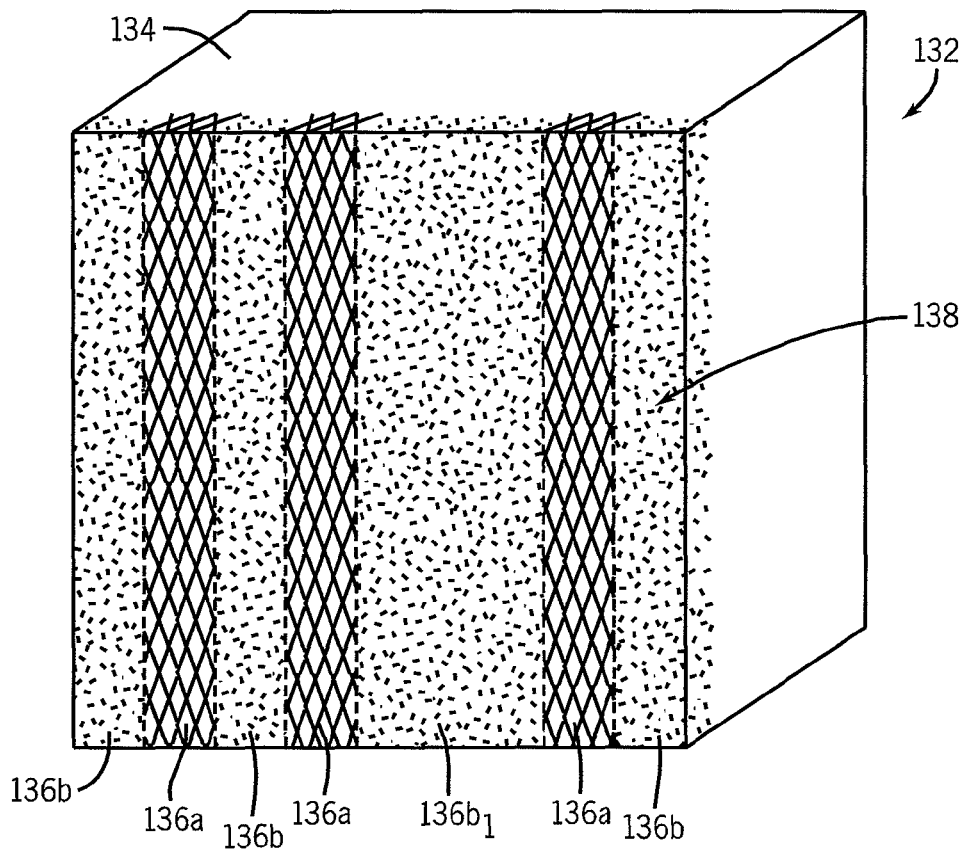
FIG. 47A illustrates a perspective view of the stamp of FIG. 47, showing the chemically patterned surface of the stamp.

Referring now to FIGS. 46 and 47 and 47A, the now chemically functionalized polymer stamp 132 can then be removed (arrows ↑↑) from the surface 130 of the master template 118. For example, a solvent such as water (arrows ↓↓) can be applied or the stamp/template complex soaked in the solvent, which will permeate and swell the stamp body 132 and weaken the interfacial bonds on the hydrophilic areas, and the stamp can then be peeled from the surface of the master template, as shown in FIG. 46.

As illustrated, the surface 138 of the stamp 132 is chemically differentiated according to the pattern of hydrophilic and hydrophobic elements on the master template 118. The surface of the stamp 132 is composed of hydrophilic lines 136a that are preferential wetting to one domain of the block copolymer (e.g., PMMA) and hydrophobic lines 136b that are preferential wetting to the other block of the block copolymer (e.g., PS). As on the master template, the dimensions (i.e., width ($w_1$)) of the lines 136a, 136b match or substantially match the dimensions (i.e., $w_1$) of the hydrophilic lines 122 and hydrophobic lines 128, respectively, on the surface 130 of the master template 118, as well as the $L_o$ value of the block copolymer material (BCP) 116 on the substrate 110 (FIG. 34). The stamp 132 includes a hydrophobic section $136b_1$ that has a width ($w_2$) that corresponds to the dimensions ($w_2$) of the hydrophobic section 128a on the chemical master 118, which is greater than the BCP $L_o$ value.

Figure 48:
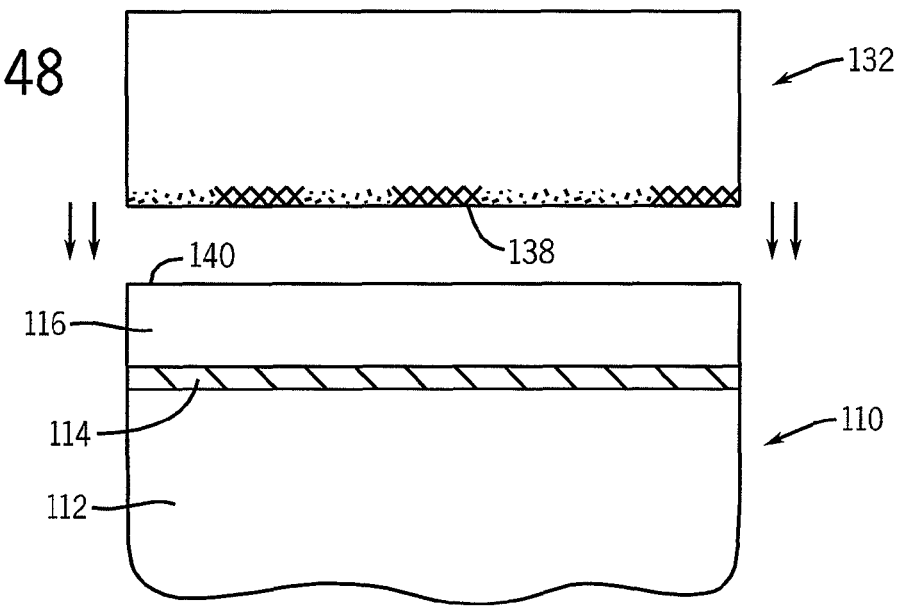
FIGS. 48-52 illustrate an embodiment of the invention for using the stamp illustrated in FIGS. 47 and 47A for directing ordering of a lamellar-phase block copolymer material.
Figure 49:
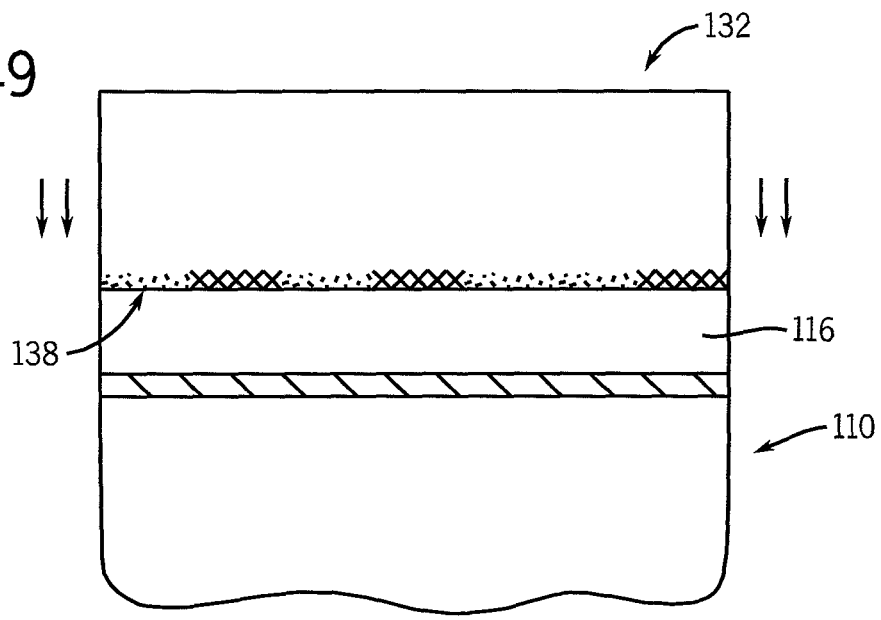
Figure 50:
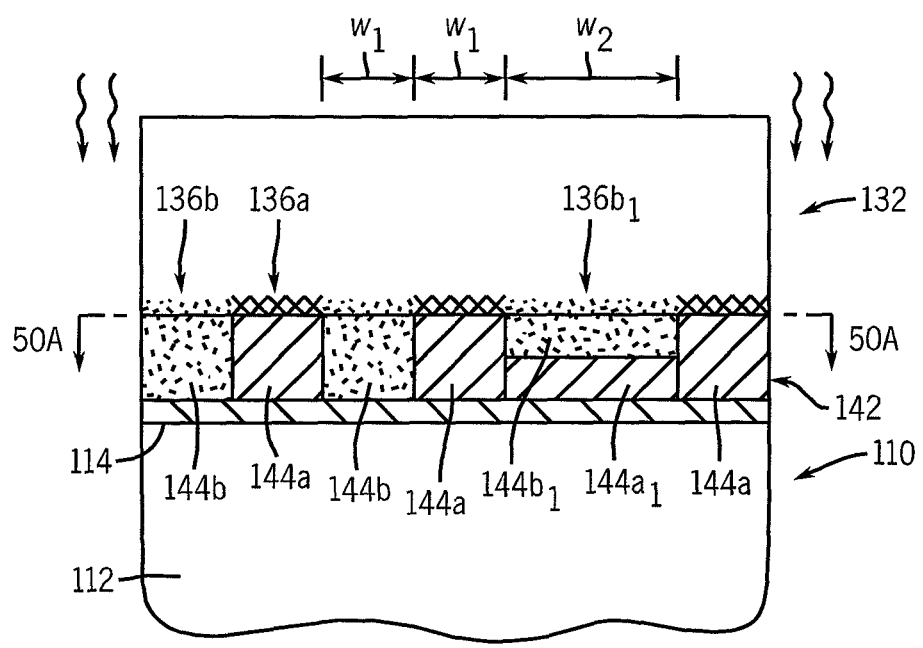

Referring now to FIG. 48, the chemically patterned surface 138 of the stamp 118 is now brought into contact with a surface 140 of the block copolymer material 116 situated on the neutral wetting material 114 on the substrate 110, for example, by pressing the stamp surface 138 onto the block copolymer material (FIG. 49). The rubbery or flexible body of the stamp 132 allows the stamp to conform to the topography of the block copolymer material 116. As depicted in FIG. 50, the block copolymer material 116 is then annealed (arrows ↓↓) while in contact with the chemically patterned stamp surface to form a self-assembled polymer material 142.

The chemical pattern of hydrophilic and hydrophobic lines 136a, 136b on the surface of the stamp 132 will direct the self-assembly and perpendicular ordering of the polymer domains of the block copolymer material 116 in regions in which the pitch ($w_1$) of the elements 136a, 136b on the stamp surface is at or about the inherent pitch or $L_o$ value of the block copolymer material 116.

Figure 50A:
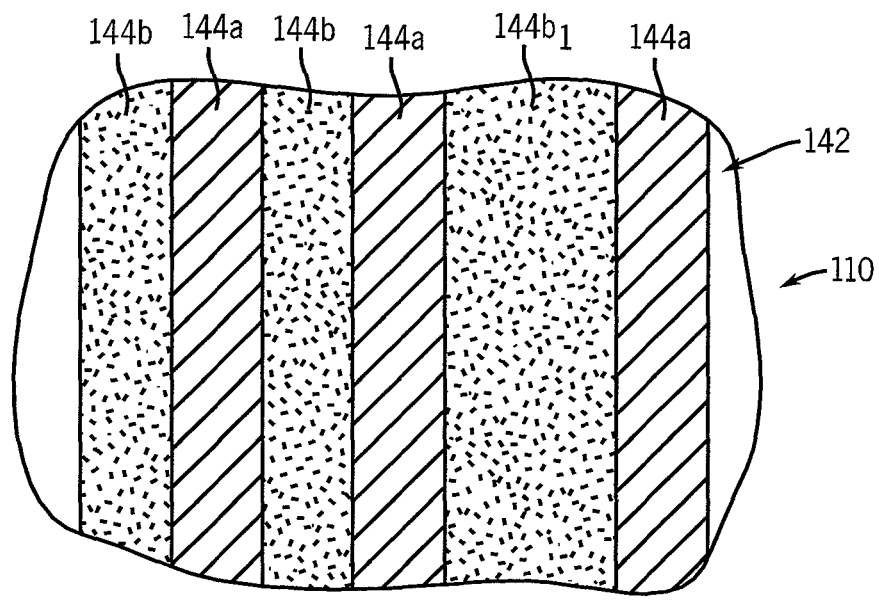
FIG. 50A illustrates a top plan view of the surface of the annealed block copolymer material of FIG. 50.

For example, as depicted in FIGS. 50 and 50A, in the use of a lamellar-phase block copolymer (e.g., PS-b-PMMA), during the anneal, the PMMA block will align with and preferentially wet the hydrophilic material (lines) 136a on the surface of the stamp 132 and the PS block will align with and preferentially wet the hydrophobic material (lines) 136b to form lines of PMMA lamella 144a and PS lamella 144b. The neutral wetting material 114 on the substrate 110 ensures that the perpendicular-oriented lamellae extend completely through the self-assembled polymer material 142 from the interface with the neutral wetting material 114 to the surface 138 of the stamp 132 on those lines 136a, 136b that have a pitch ($w_1$) that is at or about the $L_o$ value of the block copolymer material.

In regions of the substrate 110 where subsequent patterning (using the self-assembled BCP layer as a mask) is not desired, the contact of the block copolymer material with a stamp region (e.g., $136b_1$) which has a width ($w_2$) that is greater than the $L_o$ value of the block copolymer and is preferential wetting to only one domain of the block copolymer, will result in the formation of parallel-oriented lamellae $144a_1$, $144b_1$ for a corresponding width ($w_2$) within the self-assembly polymer material 142.

Figure 51:
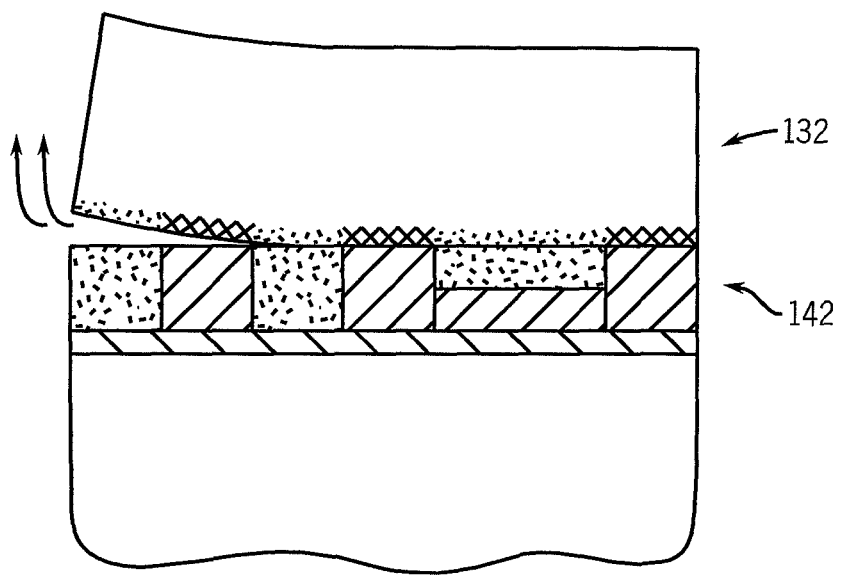
Figure 52:
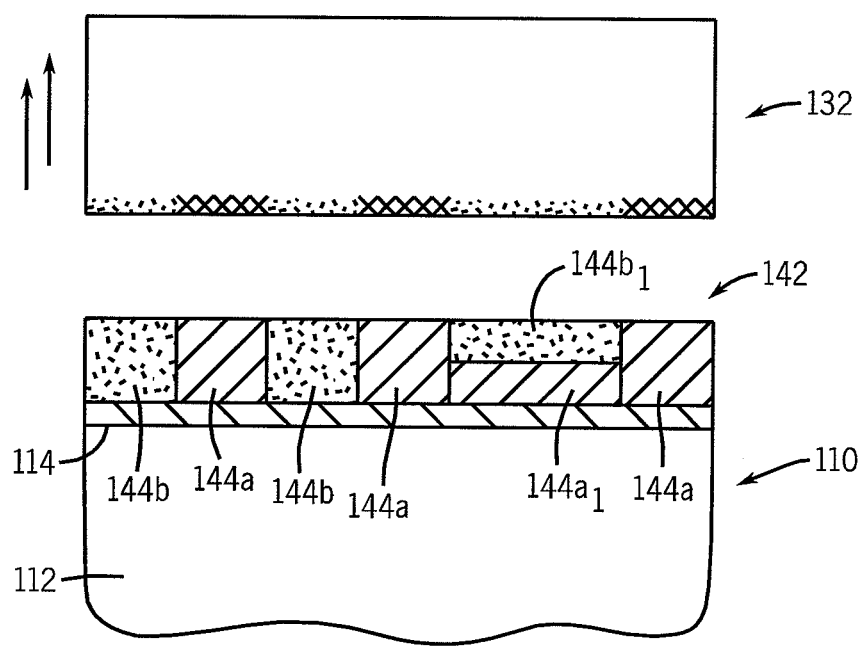

Referring now to FIGS. 51 and 52, the stamp 132 is then removed from contact (↑↑) with the surface of the self-assembled polymer layer 142. To break the adhesive forces (e.g., Van der Waals forces) and lift the stamp from the polymer surface, in some embodiments, the stamp/solvent complex can be soaked in a solvent (e.g., water, isopropyl alcohol, acetic acid, etc.) that will permeate and swell the body of the stamp 132 (e.g., PDMS) but not the polymer domains 144a, 144b of the annealed, self-assembled polymer material 142. In some embodiments, a solvent can be used that also swells one but not both of the polymer domains of the self-assembled polymer material, e.g., the polymer domain that is subsequently selectively removed (e.g., PMMA lamellae 144a). After separation and removal of the stamp 132 from the self-assembled polymer material, the stamp 132 can then be re-used for further templating on another area or substrate bearing a BCP material layer.

Figure 53:
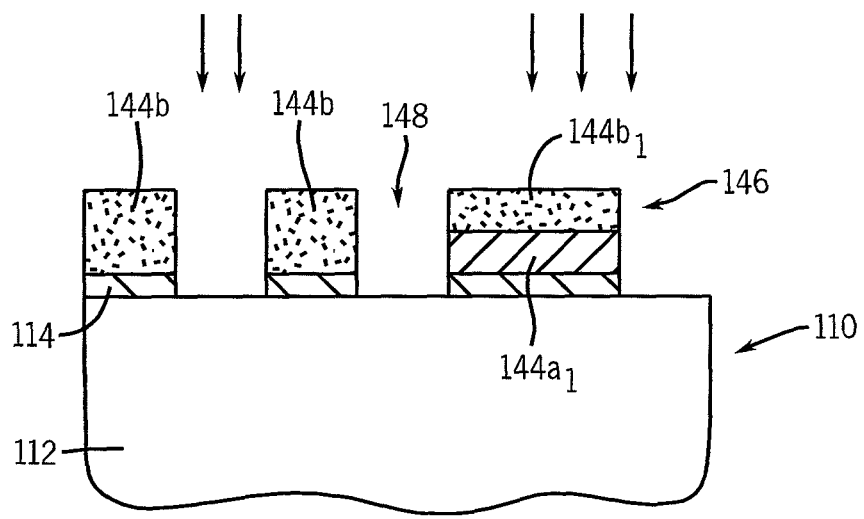
FIGS. 53-55 illustrate the use of the self-assembled lamellar-phase block copolymer material of FIG. 52 to mask and etch an underlying substrate.
Figure 53A:
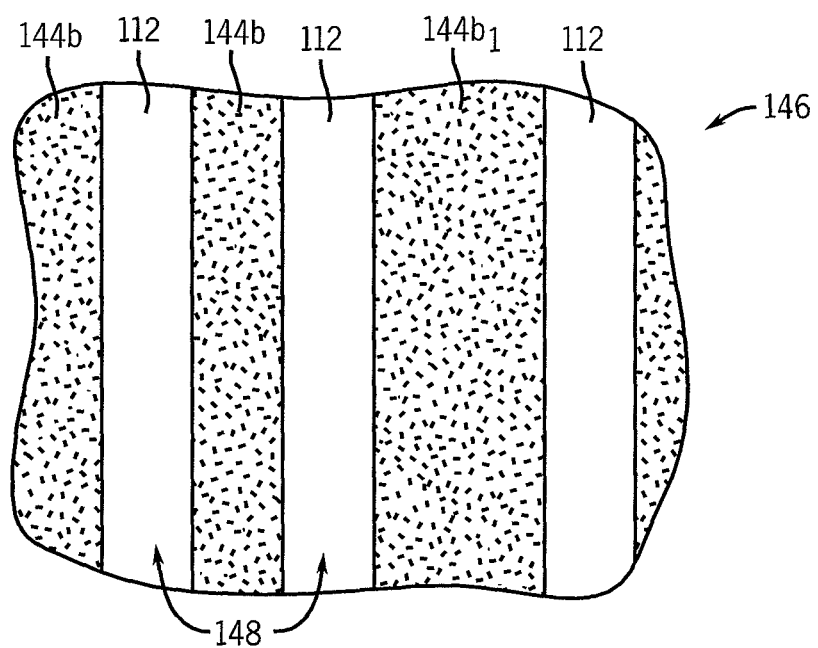
FIGS. 53A, 54A, and 55A are top plan views of the substrate shown in FIGS. 53, 54, and 55, respectively.
Figure 54:
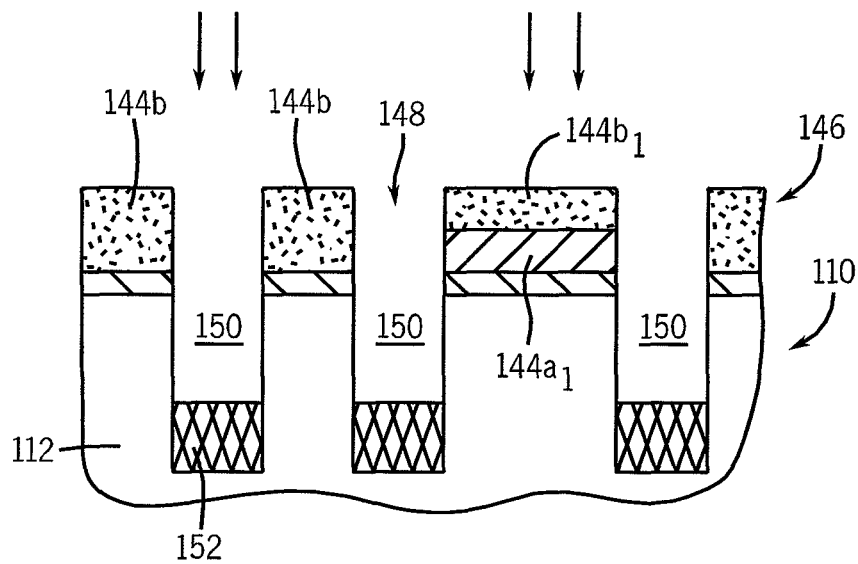
Figure 54A:
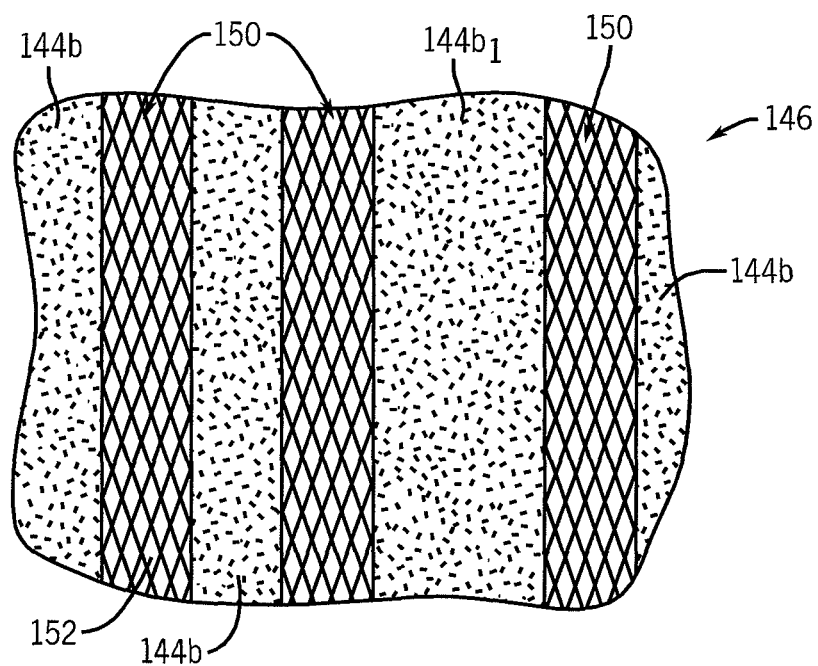
Figure 55:
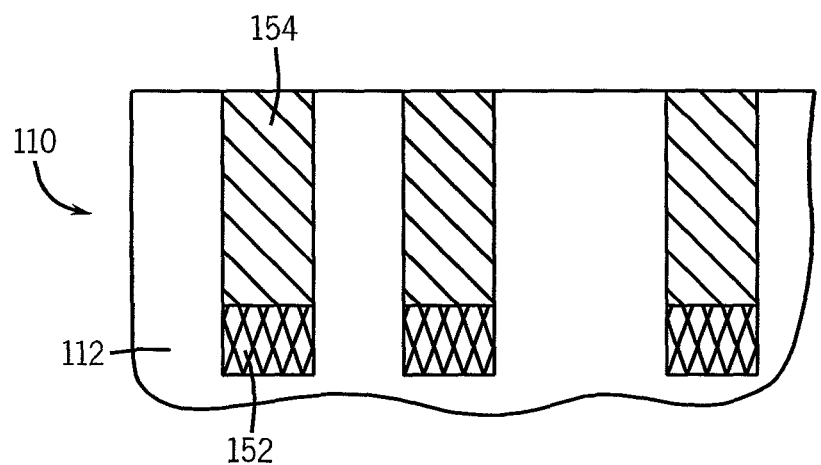
Figure 55A:
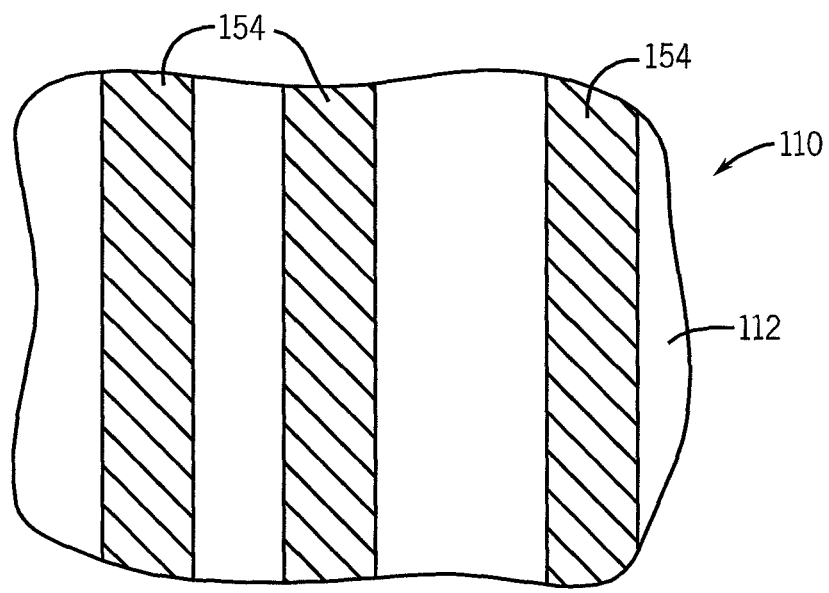

The self-assembled polymer material 142 can then be developed to selectively remove one of the polymer domains (e.g., PMMA lamellae 144a) to produce a mask 146 composed of the remaining polymer domain (e.g., PS lamellae 144b) with openings 148 in the desired pattern of lines exposing the substrate 112, as shown in FIGS. 53 and 53A. The underlying substrate 112 can then be etched (arrows ↓↓) using the mask 146, as shown in FIGS. 54 and 54A, to form openings 150 to an underlying active area or element 152. The residual mask 146 (i.e., PS lamellae 144b, 144$b_1$ and PMMA lamella 144a) can then be removed and the openings 150 filled with a material 154, e.g., a metal or conductive alloy such as Cu, Al, W, Si, and $Ti_a N_4$, among others, as shown in FIGS. 55 and 55A to form arrays of parallel conductive lines 154 having a width over a range of about 5-50 nm, to the underlying active area, contact, or conductive line 152. Further processing can be conducted as desired.

Figure 56:
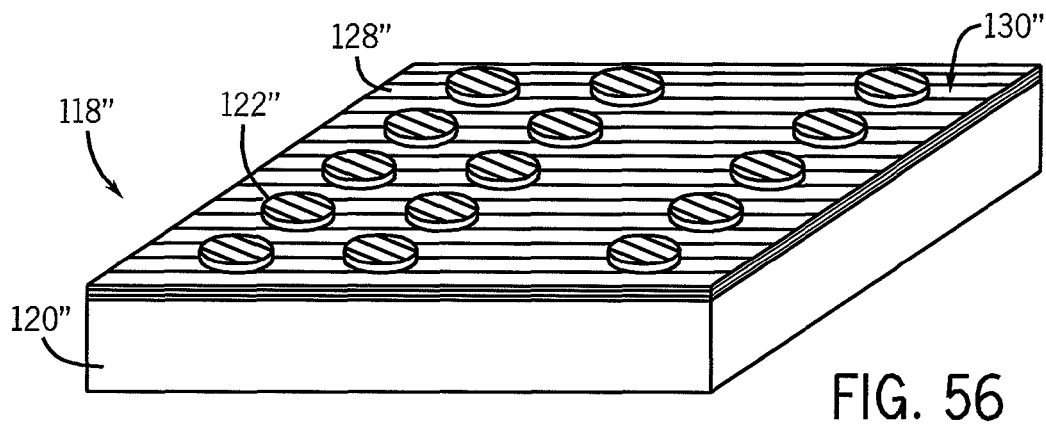
FIGS. 56-58 illustrate another embodiment of a process for forming a chemically patterned master template and stamp for directing self-assembly of a cylinder-phase block copolymer material.
Figure 56A:
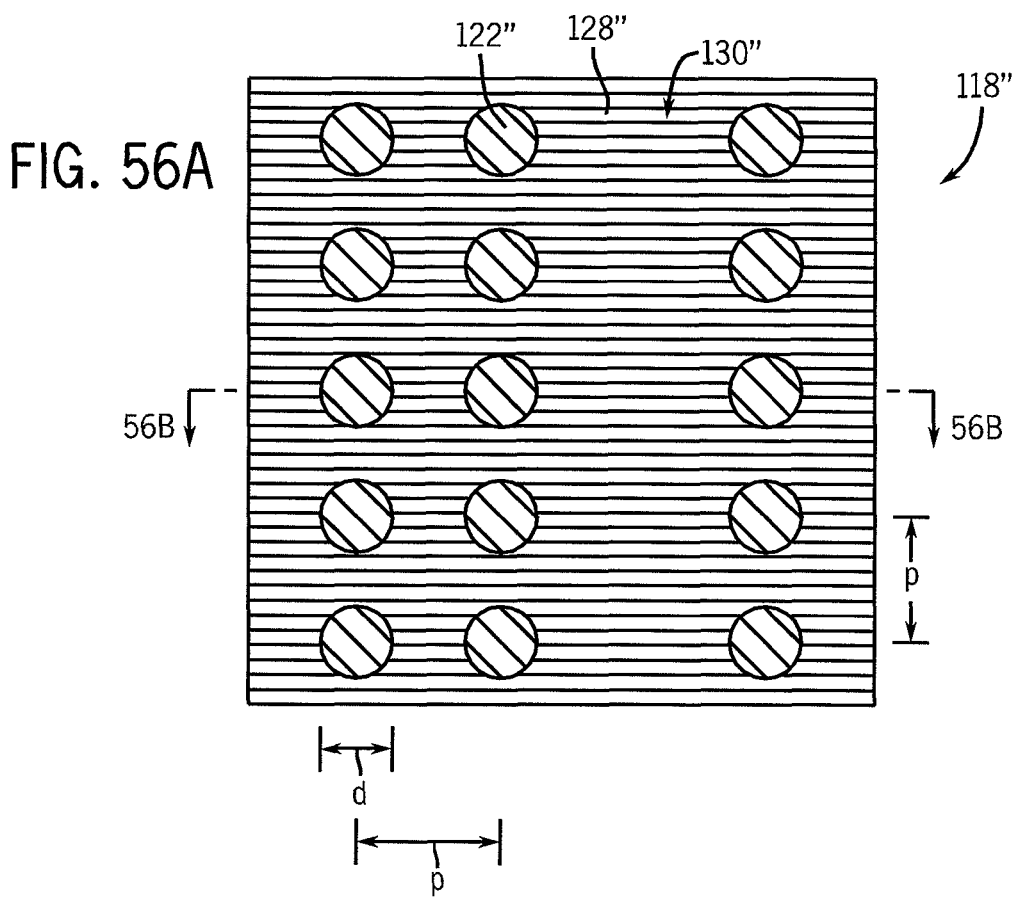
FIG. 56A is a top plan view and FIG. 56B is an elevational, cross-sectional view of the master template shown in FIG. 56.
Figure 56B:
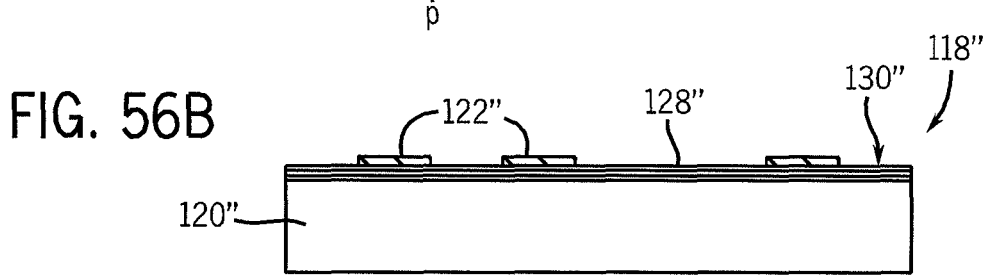

In other embodiments, the block copolymer material 116 can be cylindrical-phase block copolymer (BCP) on a neutral wetting layer 114 (FIG. 34). Referring to FIGS. 56 and 56B, a master template 118" can be formed with "dots" of a hydrophilic material 122" (e.g., oxide) surrounded by a hydrophobic material 128" (e.g., an alkyl trialkoxysilane). The dots of the hydrophilic material 122" are formed in regions where perpendicular cylinders in the BCP material are desired, and have a diameter (d) and pitch (p) equal to the $L_o$ value of the cylindrical-phase block copolymer (BCP) material or within about 10% or less than the $L_o$ value. Other regions (128") of the master template 118" where perpendicular cylinders are not desired are chemically patterned to be hydrophobic.

Figure 57:
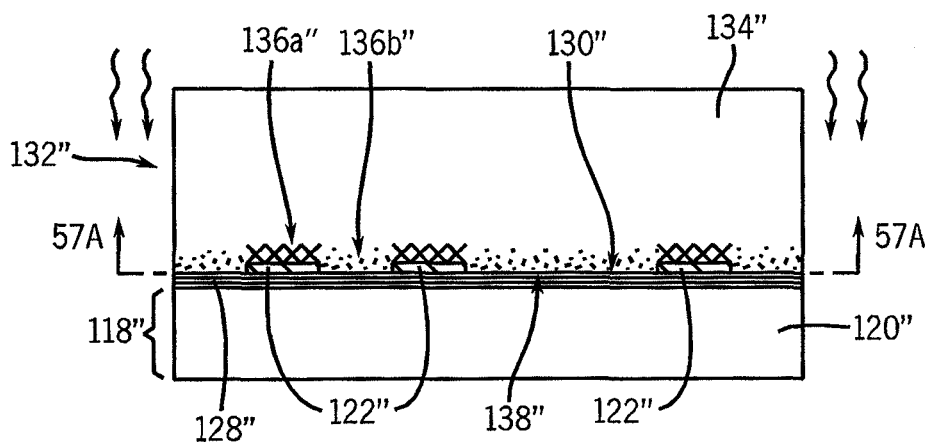
Figure 57A:
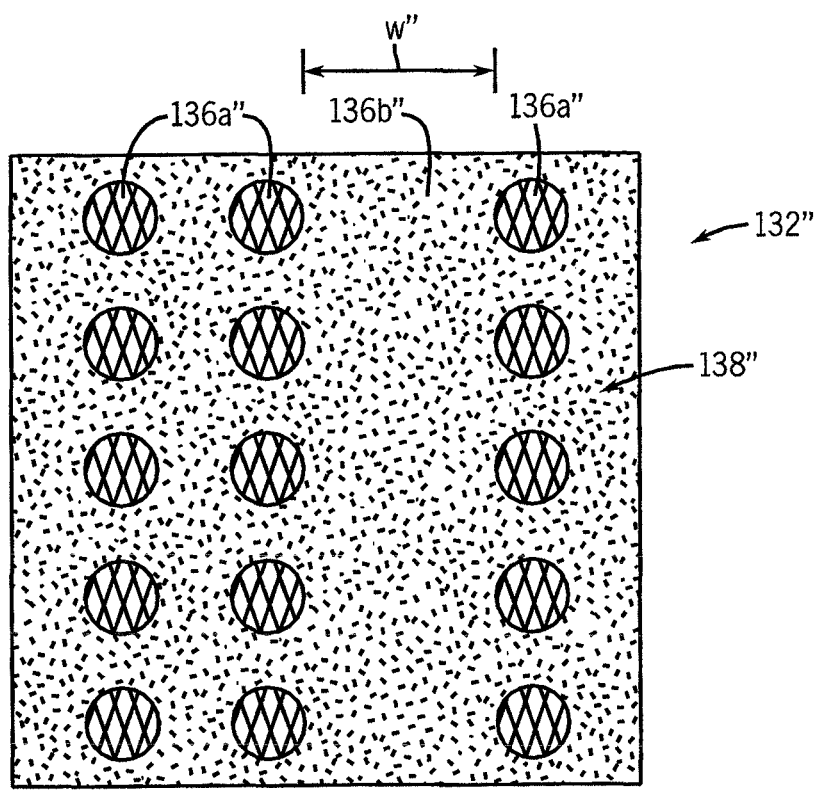
FIG. 57A is a top plan view of the surface of the stamp of FIG. 57.
Figure 58:
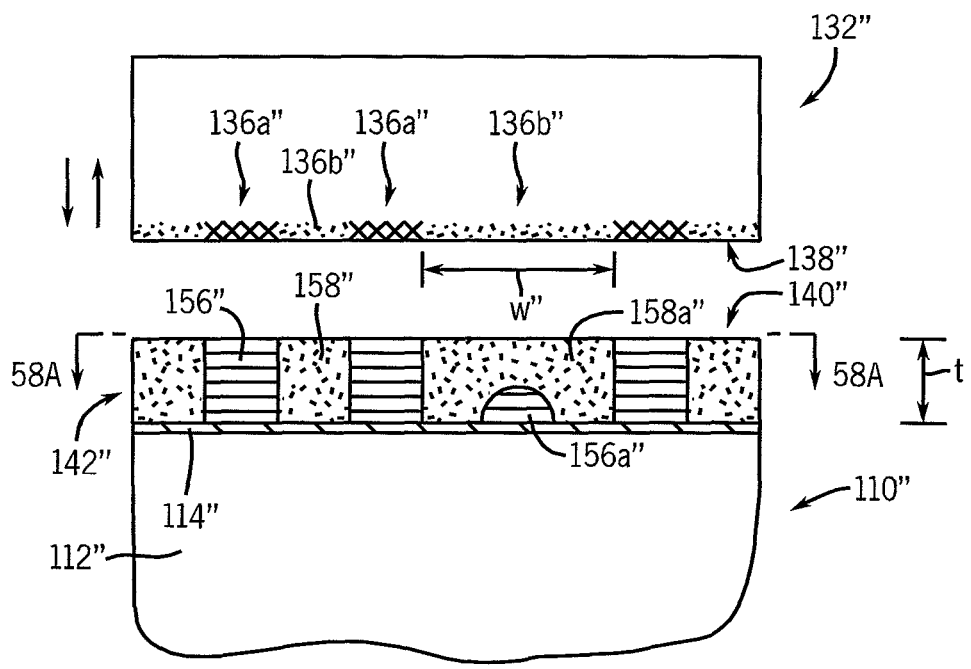
Figure 58A:
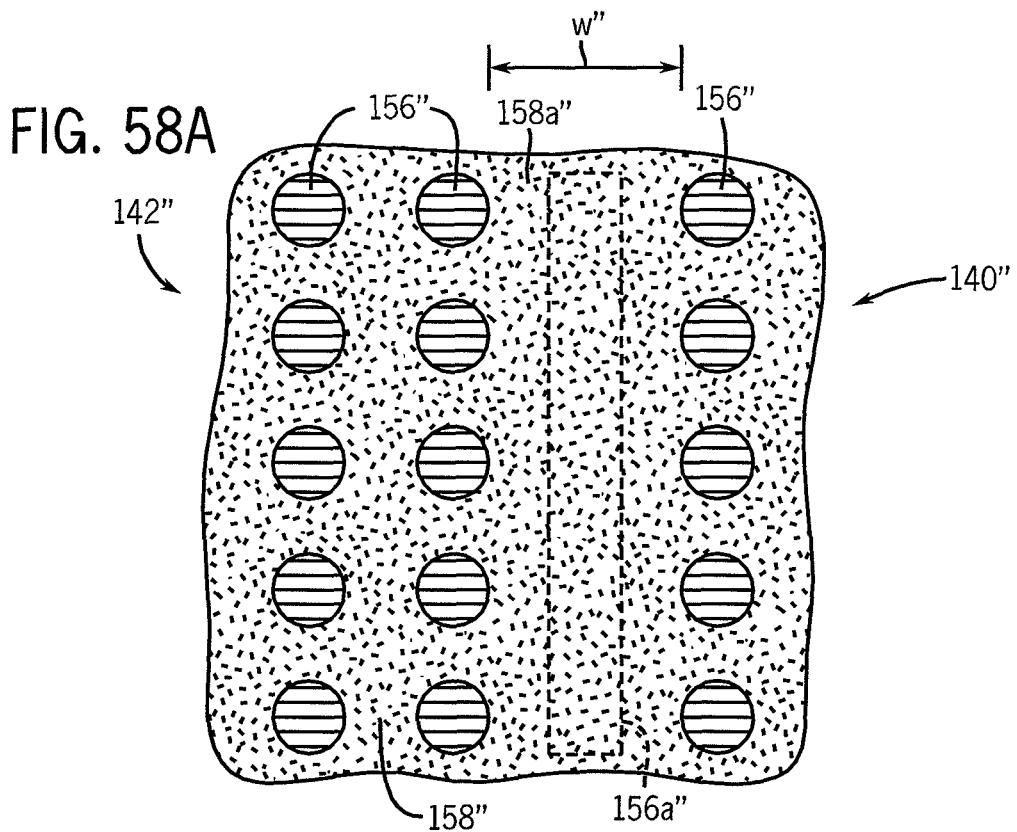
FIG. 58A illustrates a top plan view of the surface of the annealed and ordered block copolymer material of FIG. 58.

As shown in FIGS. 57 and 57A, a polymer material (e.g., PDMS) composed of hydrophilic 136a" and hydrophobic 136b" components (e.g., molecules) is formed and cured (arrows ↓↓) on the master template 118". Upon curing, the hydrophilic components 136a" of the stamp material 134" align with the hydrophilic dots 122" and the hydrophobic components 136b" align with the hydrophobic regions 128" on the master template 118". The cured stamp 132" is then removed from the master template 118" and applied to a cylindrical-phase block copolymer material (e.g., 116 in FIG. 34), which is annealed while in contact with the stamp (FIGS. 58 and 58A (arrow ↓).

Upon annealing, the cylindrical-phase BCP (116), will self-assemble into perpendicular-oriented cylinders 156" composed of one polymer block (e.g., PMMA) in response to and aligned with the hydrophilic dots 136a" on the surface 138" of the stamp 132", surrounded by a matrix 158" of the other polymer block (e.g., PS) in response to the hydrophobic areas 136b" on the stamp surface. In response to areas where the hydrophobic area 136b" has a width (w") that is greater than or equal to $1.5*L_o$, the block copolymer material will self-assemble to form one or more lines of half-cylinders 156a", which are oriented parallel to and in contact with the neutral wetting layer 114". The number of lines of half-cylinders 156a" can vary according to the width (w"), for example, a single line of a parallel half-cylinder will form from a block copolymer ($L_o$=50 nm) where the hydrophobic area 136b" has a width (w") of about 70-80 nm. The stamp 132" is then removed (arrow ↑) from the surface of the annealed and self-assembled block copolymer material 142".

Figure 59:
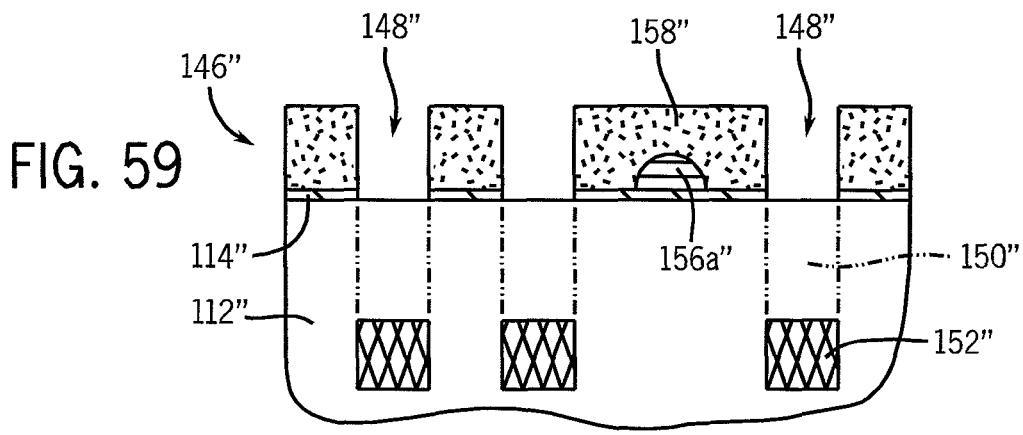
FIG. 59 illustrates an elevational, cross-sectional view of the use of the self-assembled cylindrical-phase block copolymer material of FIGS. 58 and 58A to mask and etch an underlying substrate.
Figure 60:
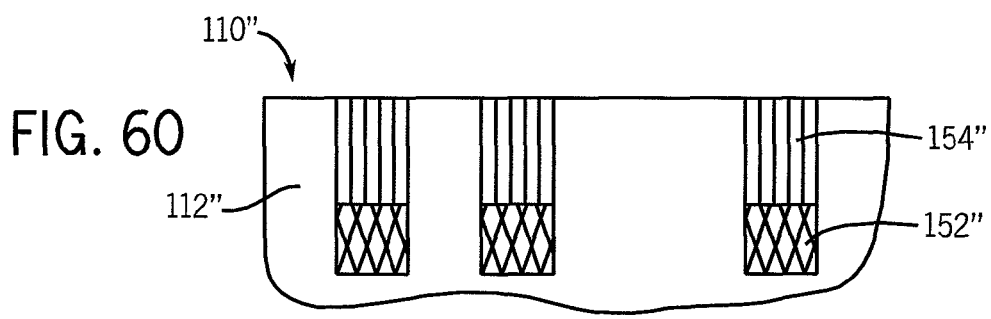
FIG. 60 illustrates the substrate shown in FIG. 59 at a subsequent processing stage to fill the cylindrical openings in the substrate.
Figure 60A:
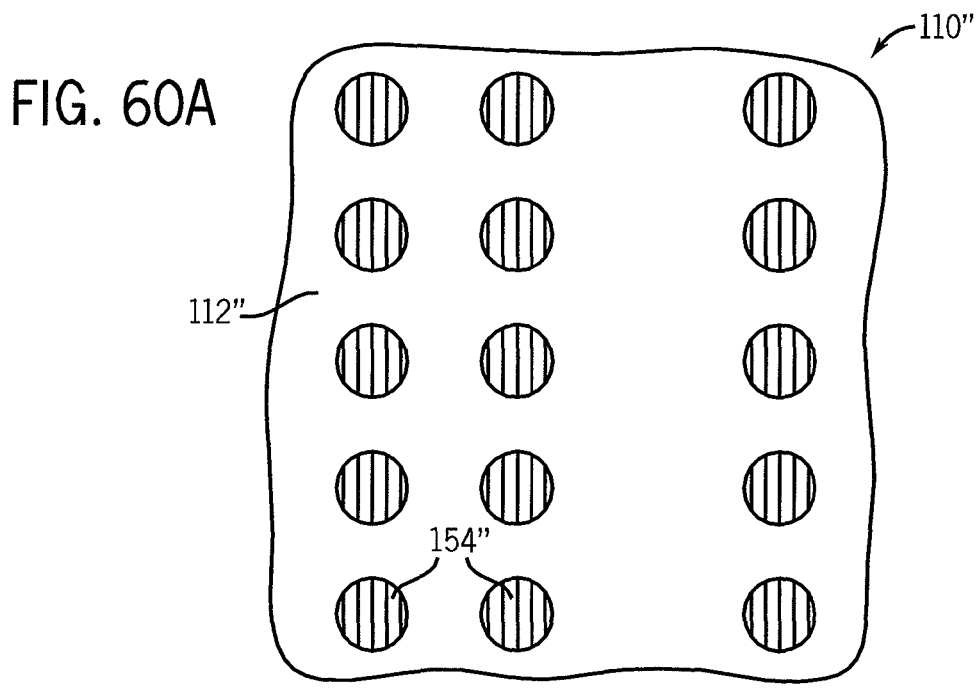
FIG. 60A is a top plan view of the substrate shown in FIG. 60.

As depicted in FIG. 59, the cylinders 156" (e.g., PMMA block) can then be selectively removed to form a mask 146" composed of cylindrical openings 148" within the matrix 158" of the other polymer block (e.g., of PS) to expose the base substrate 112". The substrate 112" can then be etched using the mask 146" to form cylindrical openings 150" (shown in phantom) to active areas 152" in the substrate 112". The etched openings 150" can be filled with an appropriate material 154" to form contacts to the underlying active areas 152" (e.g., conductive lines), as depicted in FIGS. 60 and 60A. The substrate can then be additionally processed as needed.

The present embodiment of the invention of overlying a chemically patterned stamp to direct self-assembly of a BCP film eliminates the need for forming a substrate template pattern, which requires the use of a patterning technique such as EUV lithography or other sub-lithographic patterning techniques to physically or chemically pattern the surface of a substrate, e.g., with chemical stripes (chemical templating), each stripe being preferentially wetted by the alternate blocks of a block copolymer to cause polymer domains to orient themselves above the preferred stripes and perpendicular to the surface. The present embodiment of a chemically patterned stamp provides a low cost and re-usable method to provide registered self-assembled block copolymers with long-range order without the need for patterning a substrate.

The use of a chemically patterned stamp to direct ordering of a self-assembling block copolymer material does not require patterning of the substrate to form a topographically varied surface as required by graphoepitaxial self-assembly, which significantly reduces costs. Also, only an original master template requires patterning using sub-lithographic tools (e.g., EUV, e-beam, etc.), and at least two levels of amplification result including the fabrication of multiple stamps from a single master template, and the ability to use each stamp multiple times to direct ordering of BCP materials. As a result, the cost of preparing the master template is significantly amortized. In addition, since the stamp is topographically flat, problems of lift-off from a self-assembled polymer film are minimized in conjunction with the surface areas in contact, which provides a significant advantage over nanoimprint lithography. Long-range order and defectivity of a self-assembled block copolymer film is also improved as the stamp templates and directs the proper order in each region of the film. By comparison, graphoepitaxy requires force fields generated from topographic features to impose order from a distance.

Figure 61:
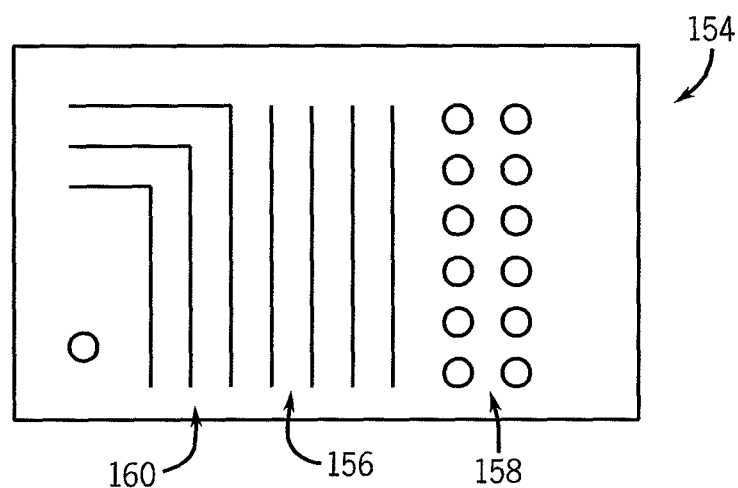
FIG. 61 illustrates geometries for an integrated circuit layout that can be prepared using embodiments of the invention.

As depicted in FIG. 61, the present stamp embodiments can be used to form a variety of geometries for integrated circuit layouts 154, including periodic conductive lines 156 and contacts 158, lines with bends 160, isolated lines and contacts, etc., as needed for the circuit design. Dies comprising the conductive lines and contacts can be incorporated into a circuit module, device or electronic system, including processor systems.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method of forming a stamp, comprising:
    forming a trench in a material overlying a substrate, the trench comprising an unpatterned, neutral wetting floor, opposing preferential wetting ends, and opposing parallel preferential wetting sidewalls separated from one another by a fixed width;
    chemically modifying a polymer block of a PS-b-PMMA copolymer having an inherent pitch ($L_o$) equal to a depth of the trench to comprise a thiol functional group or an amine functional group to form a modified PS-b-PMMA copolymer comprising a first polymer block having chemical affinity for and swellable by an ink material and a second polymer block not having chemical affinity for and not swellable by the ink material;
    filling the trench with the modified PS-b-PMMA copolymer; and
    annealing the modified PS-b-PMMA copolymer to form a stamping surface comprising an ordered array of polymer domains of the first polymer block in a matrix of the second polymer block.

2. The method of claim 1, wherein the stamping surface comprises an ordered array of perpendicularly oriented cylindrical domains of the first polymer block in the matrix of the second polymer block.

3. The method of claim 1, further comprising chemically patterning the floor of the trench to form a combination of preferential wetting areas and neutral wetting areas prior to filling the trench with the block copolymer material, the block copolymer material comprising a cylindrical-phase block copolymer.

4. The method of claim 1, further comprising applying the ink material to the stamping surface to selectively absorb the ink material into and swell the first polymer block but not the second polymer block.

5. The method of claim 4, wherein the ink material comprises a functional group selected from the group consisting of an amine group, an amino group, an alkyne group, a thiol group, an alcohol group, a mercaptoalcohol group, and an acetylenic group with a functional tail group selected from the group consisting of hydrocarbons, alcohols, thiols, amines and halides.

6. A method of forming a pattern on a receptor substrate, comprising:
    applying an ink chemical material to a surface of a stamp comprising a self-assembled block copolymer material comprising an ordered array of polymer domains within a trench, the trench comprising an unpatterned floor, opposing ends, and opposing sidewalls being parallel to each other from one end to the opposing end, wherein the ink chemical material is selectively absorbed into and swells the domains of a first polymer block but not the domains of a second polymer block of the block copolymer material;
    contacting the surface of the stamp with the receptor substrate to transfer the ink chemical material from the stamp onto the receptor substrate to form the pattern on the receptor substrate; and
    removing the stamp from contact with the receptor substrate wherein the pattern of the ink chemical material remains on the receptor substrate.

7. The method of claim 6, wherein the receptor substrate comprises a glycidoxy-, isocyanato-, alkylazido- or chlorosilyl-functional group, and wherein the ink chemical material chemically bonds with the receptor substrate through a linkage selected from the group consisting of a urea linkage, a urethane linkage, a disulfide linkage, an acid-base linkage or an amine linkage.

8. The method of claim 6, further comprising selectively depositing a material on the ink chemical material on the receptor substrate to increase the thickness or the hardness of the ink chemical material.

9. The method of claim 8, further comprising etching the receptor substrate using the ink chemical material as an etch mask.

10. The method of claim 6, further comprising selectively forming a material on exposed areas of the receptor substrate, the material chemically different than the ink chemical material.

11. The method of claim 6, further comprising:
    forming the ink chemical material to comprise a hydrophobic material;
    selectively forming a hydrophilic material on exposed areas of the receptor substrate;
    forming a block copolymer material on the ink chemical material and the hydrophilic material;
    annealing the block copolymer material to form another self-assembled block copolymer material, domains of one polymer block of the another self-assembled block copolymer material registered to the ink chemical material and domains of another polymer block of the another self-assembled block copolymer material registered to the hydrophilic material; and
    selectively removing the domains of the one polymer block of the another self-assembled block copolymer material to form an etch mask for etching the receptor substrate.

12. A stamp, comprising:
    a trench in a material overlying a substrate and comprising:
        opposing preferential wetting ends; and
        opposing parallel preferential wetting sidewalls, a fixed width separating the opposing parallel preferential wetting sidewalls; and
    a self-assembled block copolymer material filling the trench and having an inherent pitch value ($L_o$) equal to a depth of the trench, the self-assembled block copolymer material comprising a chemically modified PS-b-PMMA copolymer comprising:
        a chemically modified first polymer block comprising a functional group selected from the group consisting of a thiol group and an amine group, the chemically modified first polymer block having an affinity for and swellable by absorption of an ink material; and
        a second polymer block having substantially no affinity for and not swellable by the ink material.

13. The stamp of claim 12, wherein the self-assembled block copolymer material comprises parallel-oriented half-cylindrical domains of the modified first polymer block in a matrix of the second polymer block.

14. The method of claim 1, wherein the modified PS-b-PMMA copolymer comprises alternating lamellar domains of the first polymer block and the second polymer block.

15. The method of claim 4, wherein the ink material is combined with an organic solvent, and wherein the ink material and the organic solvent are selectively absorbed into and swell the first polymer block.

16. The method of claim 6, wherein the ink chemical material is combined with an organic solvent, and wherein the ink chemical material and the organic solvent are selectively absorbed into and swell the domains of the first polymer block.

* * * * *

UNITED STATES PATENT AND TRADEMARK OFFICE
CERTIFICATE OF CORRECTION

PATENT NO.        : 8,999,492 B2                                            Page 1 of 1
APPLICATION NO.   : 12/026214
DATED             : April 7, 2015
INVENTOR(S)       : Millward et al.

It is certified that error appears in the above-identified patent and that said Letters Patent is hereby corrected as shown below:

On the title page
ITEM (56) References Cited – Other Publications:

| | |
|---|---|
| Page 5, Column 2, Line 40, | change "Eng., 2761277, 2000," to --Eng., 276/277, 2000,-- |
| Page 5, Column 2, Line 52, | change "Mar. 6 meeting" to --Mar. '06 meeting-- |
| Page 6, Column 1, Line 28, | change "Balsara et al," to --Balsara et al.,-- |
| Page 6, Column 1, Line 32, | change "Bulpitt, Paul et al," to --Bulpitt, Paul et al.,-- |

Signed and Sealed this
Twenty-second Day of September, 2015

Michelle K. Lee
*Director of the United States Patent and Trademark Office*